US008594957B2

(12) United States Patent
Gauthier et al.

(10) Patent No.: US 8,594,957 B2
(45) Date of Patent: Nov. 26, 2013

(54) SYSTEM, METHOD AND COMPUTER PROGRAM FOR DETECTING AN ELECTROSTATIC DISCHARGE EVENT

(75) Inventors: Pierre Gauthier, Cupertino, CA (US);
Maximilian Weinzierl, Stuttgart (DE);
David Spiteri, San Mateo, CA (US);
Bela Szendrenyi, Santa Rosa, CA (US)

(73) Assignee: Advantest (Singapore) Pte Ltd, Singapore (SG)

( * ) Notice: Subject to any disclaimer, the term of this patent is extended or adjusted under 35 U.S.C. 154(b) by 232 days.

(21) Appl. No.: 12/671,892

(22) PCT Filed: Feb. 20, 2008

(86) PCT No.: PCT/EP2008/001324
§ 371 (c)(1),
(2), (4) Date: Jul. 30, 2010

(87) PCT Pub. No.: WO2009/103315
PCT Pub. Date: Aug. 27, 2009

(65) Prior Publication Data
US 2011/0238345 A1 Sep. 29, 2011

(51) Int. Cl.
*G01R 19/00* (2006.01)
*G01R 29/12* (2006.01)
(52) U.S. Cl.
USPC .............................................. 702/64; 324/458
(58) Field of Classification Search
USPC ................................. 702/64, 57; 324/457, 458
See application file for complete search history.

(56) References Cited

U.S. PATENT DOCUMENTS

2003/0201778 A1* 10/2003 Kraz .............................. 324/458
2005/0218921 A1 10/2005 Sanda et al.

FOREIGN PATENT DOCUMENTS

WO    WO 2009/103315 A1    8/2009

OTHER PUBLICATIONS

Takai, T., et al., "One of the Methods of Observing ESD Around Electronic Equipment", J. Electronics 42 (1998), pp. 305-320.
Frei, S., "Elektrostatische Entladungen (ESD) Und Ihre Storwirkung Auf Elektronische Systeme" Dissertation, Technische Universitat Berlin, 1999, pp. Abstract, I, 28, 29, 44-47, 58, 59, 62 and 63, with English translation.
Model 93686 Series Current Probes Manuel, ETS-Lindgren-Feb. 2005 Rev C—PN 399267, pp. 4, 10.
Mueller, L., "Untersuchungen Und Modellierung Elektrostatischer Entladungen (ESD) Von Elektrisch Isolierenden Oberflachen", Dissertation, Universitat Stuttgart, 2004, pp. 25-26, with English translation.
Wu, Ch. Y., et al., "On the Frequency Domain Specification of ESD Waveforms", J. Electrostatics 24 (1990 pp. 197-206.
Bendjamin, J., "Characteristics of Electrostatis Discharges (ESD) Based on Current, Optical and Magnetic Radiation Fields", Dissertation, Uppsala University, 2000, Abstract only.
Rhoades, W.T., "Phenomenological Approach for ESD Immunity Design", IEEE EMC Symposium, pp. 209-214, Chicago, 1994.

* cited by examiner

*Primary Examiner* — Bryan Bui

(57) ABSTRACT

A system for detecting an electrostatic discharge event with respect to a device to be monitored includes a current measurement device configured to measure a current flowing via a power supply connection connecting the device to be monitored with the power supply to obtain a current measurement signal representing the current or a current component. Alternatively, a current flowing through a protective earth connection connecting the device to be monitored with the protective earth is measured to obtain the measurement signal. The system includes an electrostatic discharge event detector configured to detect an electrostatic discharge event in response to a pulse of the current measurement signal. The system may optionally include data processing of current measurement signals or values.

30 Claims, 31 Drawing Sheets

SYSTEM, METHOD AND COMPUTER PROGRAM FOR DETECTING AN ELECTROSTATIC DISCHARGE EVENT

BACKGROUND OF THE INVENTION

Embodiments according to the invention relate to a system, a method and a computer program for detecting an electrostatic discharge event with respect to a device to be monitored.

Some embodiments according to the invention relate to an electrostatic discharge (ESD) monitor solution.

Electrostatic discharge is a serious reason for defects of modern electronic components. For example, modern integrated circuits comprising field effect transistors are often very sensitive to electrostatic discharge events, as the gate oxide thereof can easily be destroyed by excessive electrical field strength. Thus, the production, testing and handling of modern electronic components for semiconductor devices is an example out of many technical fields in which it is desirable to detect electrostatic discharge events.

In the following, some conventional concepts for detecting an electrostatic discharge will be discussed. In the technical literature, the following physical phenomena are listed to capture an electrostatic discharge (ESD) event: light/spark from electric arc of discharge; sound/crackling of discharge; current fields and transient fields; discharge current; and static field.

In the following, some disadvantages of detecting an ESD event on a semiconductor test system (for example a Verigy V93000 semiconductor test system) on the basis of the above-mentioned physical phenomena will be discussed. For further details, reference should be taken to the publication "One of the methods of observing ESD around electronic equipment" of Toshimitsu Takai et al. (Journal of Electrostatics 42 (1998) page 305-320) and to the book "Elektrostatische Entladungen (ESD) and ihre Störwirkung auf elektronische Systeme" of Stephan Frei (Shaker Verlag, ISBN 3-8265-6196-1).

Regarding the light/spark from an electric arc of discharge, it should be noted that this physical phenomenon could be caused by other sources. In other words, said phenomenon is not unique to electrostatic discharge events.

Regarding the sound/crackling of discharge, it should be noted that said phenomenon could be caused by other sources. In other words, said phenomenon is not unique to electrostatic discharge events.

Regarding current fields and transient fields, it should be noted that according to the publication of Stephan Frei: "There are only a few other sources of transient currents and fields and of large static fields. If only currents and fields exceeding certain limits are considered, only electrostatic discharge comes into question as a source in most cases". However, exploiting the physical phenomenon of current fields and transient fields, there is no discrimination of ESD and non-ESD events. Also, antennas need to be installed to detect current field and/or transient field. With the complex geometry of a semiconductor device-under-test (DUT) interface, electromagnetic waves are reflected, absorbed and shielded. Also, antennas can interact with a semiconductor test system and cause undesired effects. Antennas and sensors installed into a system occupy space and cause "packaging" issues.

With respect to the physical phenomenon of discharge current, the above-mentioned publication of Stephan Frei indicates: "As the current is the most critical effect of an ESD, it is desirable to know the exact temporal devolution of the discharge current for each discharge for the considered environment".

However, possible conventional solutions for detecting an ESD event on the basis of a discharge current would necessitate a huge effort. For example, all potential discharge locations (i.e. discharge paths) would need to be equipped with current sensors with sufficient bandwidth to detect potential ESD events. Monitoring a large area would necessitate the installation of numerous "current sensors" and would bring along a huge effort. In some cases, monitoring a large area would be impossible due to the high effort. An installation of numerous "current sensors" would cause an intervention into an environment. In some cases, this would mean a significant intervention into an environment. In some cases, the measurement could no longer reflect the reality and would therefore not be meaningful.

However, monitoring a discharge current provides important information on the electrostatic discharge event.

Regarding a detection of ESD events on the basis of a static field, it should be noted that a measurement of a static field is technically easy to implement and provides information on a charge generation. A rapid reduction of the static field strength measured can be interpreted as a discharge. A measurement of a static field can provide information on a frequency of ESD event occurrence. However, it is important to know that large static fields do not necessarily have to lead to an ESD event. Thus, the phenomenon "static field" is not unique to ESD events. Also, a measurement of a static field does not provide information on an intensity of discharge (confer Stephan Frei: "Elektrostatische Entladungen (ESD) and ihre Störwirkung auf elektronische Systeme", Shaker Verlag, Aachen, 1999, Page 28).

In view of the above discussion, there is a need for a concept for detecting an electrostatic discharge event which can be implemented in an efficient way.

SUMMARY

According to an embodiment, a system for detecting an electrostatic discharge event with respect to a device to be monitored may have a device to be monitored, wherein the device to be monitored is connected to a power supply via a power supply connection; a current measurement device configured to measure a current flowing via the power supply connection or a current component thereof, to acquire a current measurement signal representing the current or the current component; and an electrostatic discharge event detector configured to detect an electrostatic discharge event in response to a pulse of the current measurement signal, wherein the power supply connection has at least two directional-current conductors configured to provide the device to be monitored with electrical energy in the form of a directional current; and wherein the measurement device is configured to measure a signed sum of currents in the at least two directional-current conductors to acquire the measurement signal.

According to another embodiment, a system for detecting an electrostatic discharge event with respect to a device to be monitored may have a device to be monitored, wherein the device to be monitored is connected to a power supply via a power supply connection; a current measurement device configured to measure a current flowing via the power supply connection or a current component thereof, to acquire a current measurement signal representing the current or the current component; and an electrostatic discharge event detector configured to detect an electrostatic discharge event in response to a pulse of the current measurement signal, wherein the power supply connection has a single-phase alternating-current mains connection having a phase conductor and a neutral conductor, wherein the single phase alternating-current mains connection is configured to provide the device to be monitored with electrical energy in the form of an alternating current; and wherein the current measurement device is configured to measure a signed sum of currents in the phase conductor and the neutral conductor to acquire the current measurement signal.

According to another embodiment, a system for detecting an electrostatic discharge event with respect to a device to be monitored may have a device to be monitored, wherein the device to be monitored is connected to a power supply via a power supply connection; a current measurement device configured to measure a current flowing via the power supply connection or a current component thereof, to acquire a current measurement signal representing the current or the current component; and an electrostatic discharge event detector configured to detect an electrostatic discharge event in response to a pulse of the current measurement signal, wherein the power supply connection has a multiphase alternating-current mains connection having a plurality of phase conductors and at least one neutral conductor, wherein the multi phase alternating-current mains connection is configured to provide the device to be monitored with electrical energy in the form of an alternating current; and wherein the current measurement device is configured to measure a signed sum of currents in the plurality of phase conductors and the neutral conductor to acquire the current measurement signal.

According to another embodiment, a system for detecting an electrostatic discharge event with respect to a device to be monitored may have a device to be monitored, wherein the device to be monitored is connected to a power supply via a power supply connection; a current measurement device configured to measure a current flowing via the power supply connection or a current component thereof, to acquire a current measurement signal representing the current or the current component; and an electrostatic discharge event detector configured to detect an electrostatic discharge event in response to a pulse of the current measurement signal, wherein the power supply connection has a plurality of power supply conductors configured to provide electrical energy to the device to be monitored, and at least one protective earth conductor configured to connect the device to be monitored to a protective earth, wherein the current measurement device is configured to measure a signed sum of currents in the plurality of power supply conductors and the protective earth conductor.

According to another embodiment, a method for detecting an electrostatic discharge event with respect to a device to be monitored, wherein the device to be monitored is connected to a power supply via a power supply connection having at least two directional-current conductors configured to provide the device to be monitored with electrical energy in the form of a directional current, may have the steps of measuring a signed sum of currents in the at least two directional-current conductors to acquire a current measurement signal; and detecting an electrostatic discharge event in response to a pulse of the current measurement signal.

According to another embodiment, a method for detecting an electrostatic discharge event with respect to a device to be monitored, wherein the device is connected to a power supply via a power supply connection having a single-phase alternating-current mains connection having a phase conductor and a neutral conductor, wherein the single phase alternating-current mains connection is configured to provide the device to be monitored with electrical energy in the form of an alternating current, may have the steps of measuring a signed sum of currents in the phase conductor and the neutral conductor to acquire a current measurement signal; and detecting an electrostatic discharge event in response to a pulse of the current measurement signal.

According to another embodiment, a method for detecting an electrostatic discharge event with respect to a device to be monitored, wherein the device to be monitored is connected to a power supply via a power supply connection having a multiphase alternating-current mains connection having a plurality of phase conductors and at least one neutral conductor, wherein the multi phase alternating-current mains connection is configured to provide the device to be monitored with electrical energy in the form of an alternating current, may have the steps of measuring a signed sum of currents in the plurality of phase conductors and the neutral conductor to acquire the current measurement signal; and detecting an electrostatic discharge event in response to a pulse of the current measurement signal.

According to another embodiment, a method for detecting an electrostatic discharge event with respect to a device to be monitored, wherein the device to be monitored is connected to a power supply via a power supply connection having a plurality of power supply conductors configured to provide electrical energy to the device to be monitored, and at least one protective earth conductor configured to connect the device to be monitored to a protective earth, may have the steps of measuring a signed sum of currents in the plurality of power supply conductors and the protective earth conductor; and detecting an electrostatic discharge event in response to a pulse of the current measurement signal.

Another embodiment may have a computer program for performing, when the computer program runs on a computer, a method for detecting an electrostatic discharge event with respect to a device to be monitored, wherein the device to be monitored is connected to a power supply via a power supply connection having at least two directional-current conductors configured to provide the device to be monitored with electrical energy in the form of a directional current, wherein the method may have the steps of measuring a signed sum of currents in the at least two directional-current conductors to acquire a current measurement signal; and detecting an electrostatic discharge event in response to a pulse of the current measurement signal.

Another embodiment may have a computer program for performing, when the computer program runs on a computer, a method for detecting an electrostatic discharge event with respect to a device to be monitored, wherein the device is connected to a power supply via a power supply connection having a single-phase alternating-current mains connection having a phase conductor and a neutral conductor, wherein the single phase alternating-current mains connection is configured to provide the device to be monitored with electrical energy in the form of an alternating current, wherein the method may have the steps of measuring a signed sum of currents in the phase conductor and the neutral conductor to acquire a current measurement signal; and detecting an electrostatic discharge event in response to a pulse of the current measurement signal.

Another embodiment may have a computer program for performing, when the computer program runs on a computer, a method for detecting an electrostatic discharge event with respect to a device to be monitored, wherein the device to be monitored is connected to a power supply via a power supply connection having a multiphase alternating-current mains connection having a plurality of phase conductors and at least one neutral conductor, wherein the multi phase alternating-current mains connection is configured to provide the device to be monitored with electrical energy in the form of an alternating current, wherein the method may have the steps of measuring a signed sum of currents in the plurality of phase conductors and the neutral conductor to acquire the current measurement signal; and detecting an electrostatic discharge event in response to a pulse of the current measurement signal.

Another embodiment may have a computer program for performing, when the computer program runs on a computer, a method for detecting an electrostatic discharge event with respect to a device to be monitored, wherein the device to be monitored is connected to a power supply via a power supply connection having a plurality of power supply conductors configured to provide electrical energy to the device to be monitored, and at least one protective earth conductor configured to connect the device to be monitored to a protective earth, wherein the method may have the steps of measuring a signed sum of currents in the plurality of power supply conductors and the protective earth conductor; and detecting an electrostatic discharge event in response to a pulse of the current measurement signal.

Some embodiments disclosed herein are based on the key idea that an efficient detection of an electrostatic discharge event with respect to a device to be monitored can be performed by measuring a current or current component flowing via a power supply connection via which the device to be monitored is connected to a power supply. By evaluating a current measurement signal representing said current or current component, an electrostatic discharge event affecting the device to be monitored can be efficiently detected, as most electrostatic discharge events couple to the power supply connection even if the electrostatic discharge event does not immediately (or directly) affect any power supply components of the device to be monitored. In other words, it has been found that the power supply connection is a path for an electrostatic discharge current. Thus, by evaluating a current measurement signal representing the current or current component flowing via the power supply connection, a large variety of different ESD events can be detected with a moderate hardware effort.

Some other embodiments according to the invention are based on the finding that a current flowing via a protective earth connection connecting the device to be monitored with a protective earth can be evaluated in order to efficiently detect electrostatic discharge events. It has been found that the device to be monitored can be affected by an electrostatic discharge event even if the discharge current caused by this electrostatic discharge event flows to the protective earth via the protective earth connection.

In other words, it has been found that measuring a current or current component flowing via the protective earth connection can be used as a reliable indication as to whether the device to be monitored has been affected by an electrostatic discharge event and may have been damaged.

Some embodiments according to the invention described herein are based on the finding that a reliable detection as to whether the device to be monitored was affected by an electrostatic discharge event can be based exclusively on the measurement of the current or current component flowing via the power supply connection. In other words, in some embodiments according to the invention the electrostatic discharge event detector is configured to evaluate only the current measurement signal representing the current or current component flowing via the power supply connection, but no other current measurement signals.

In some other embodiments according to the invention, the electrostatic discharge event detector is configured to evaluate only the current measurement signal representing the current flowing via the protective earth connection, but no other current measurement signals characterizing other currents.

In some other embodiments according to the invention, the electrostatic discharge event detector is configured to evaluate only a current measurement signal describing a current or current component flowing via the power supply connection and another current measurement signal representing a current flowing via the protective earth connection, but no additional current measurement signals.

In an embodiment according to the invention, the power supply connection comprises at least two power supply lines, and the current measurement device is configured to measure a common mode current component flowing via the at least two power supply lines. Some embodiments according to the invention are based on the finding that a measurement of a common mode current component of the current flowing via two or more power supply lines provides a particularly efficient concept for detecting electrostatic discharge events and for distinguishing between electrostatic discharge events and other pulsed signals. It has been found that in many situations interfering signals, for example current changes resulting from switching events, result in differential mode current pulses on the supply lines. However, electrostatic discharge events typically cause common mode current pulses on the supply lines. Consequently, by measuring a common mode current component, the influence of such differential mode current pulses can be minimized. As a consequence, a false detection of electrostatic discharge events, which could be caused by differential mode current pulses on the power supply lines, can be avoided. In addition, by measuring a common mode current component of at least two power supply lines, a measurement effort can be further reduced. This is due to the fact that a common mode current component of currents flowing through multiple power supply lines can be measured using a single current measurement device, for example using a single current clamp through which the multiple power supply lines are routed.

Some embodiments according to the present invention can be applied for a directional current (DC) power supply, while other embodiments according to the invention can be applied to alternating current (AC) power supplies.

In an embodiment according to the invention, the system is a test system. The system comprises a supply rack and a test head, wherein the test head is arranged external to the test rack. The test head is the device to be monitored, and the test head is connected to the supply rack via the power supply connection.

Said embodiment is based on the finding that a power supply connection between two separate components of a test system, namely between a supply rack and a test head, is a particularly good location for obtaining a current measurement signal, which is used to detect an electrostatic discharge event. It has been found that electrostatic discharge events affecting a device interface or device-under-test interface of the test head can be detected with sufficient precision and reliability by monitoring the current flowing via the power supply connection between the supply rack and the test head. Electrostatic discharge events affecting a device under test attached to the test head, or the device-under-test interface of the test head, will propagate through electronic circuits (for example comprising one or more channel modules and/or one or more power converters) to the power supply connection between the test head and the supply rack. It has been found that a monitoring of the current on one or more power supply lines connecting the test head with the supply rack allows for a reliable identification of such electrostatic discharge events in a very simple manner, without monitoring all the individual connections of the device-under-test interface.

Thus, some embodiments according to the invention disclosed herein allow for an extremely efficient detection of electrostatic discharge events in a test system. Instead of individually monitoring currents on each conductor of the DUT interface, a centralized detection of ESD events is introduced.

Further aspects of some embodiments according to the invention will be described in the following detailed description.

Some embodiments according to the present invention create methods for detecting an electrostatic discharge. Some further embodiments create a computer program for detecting an electrostatic discharge event.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
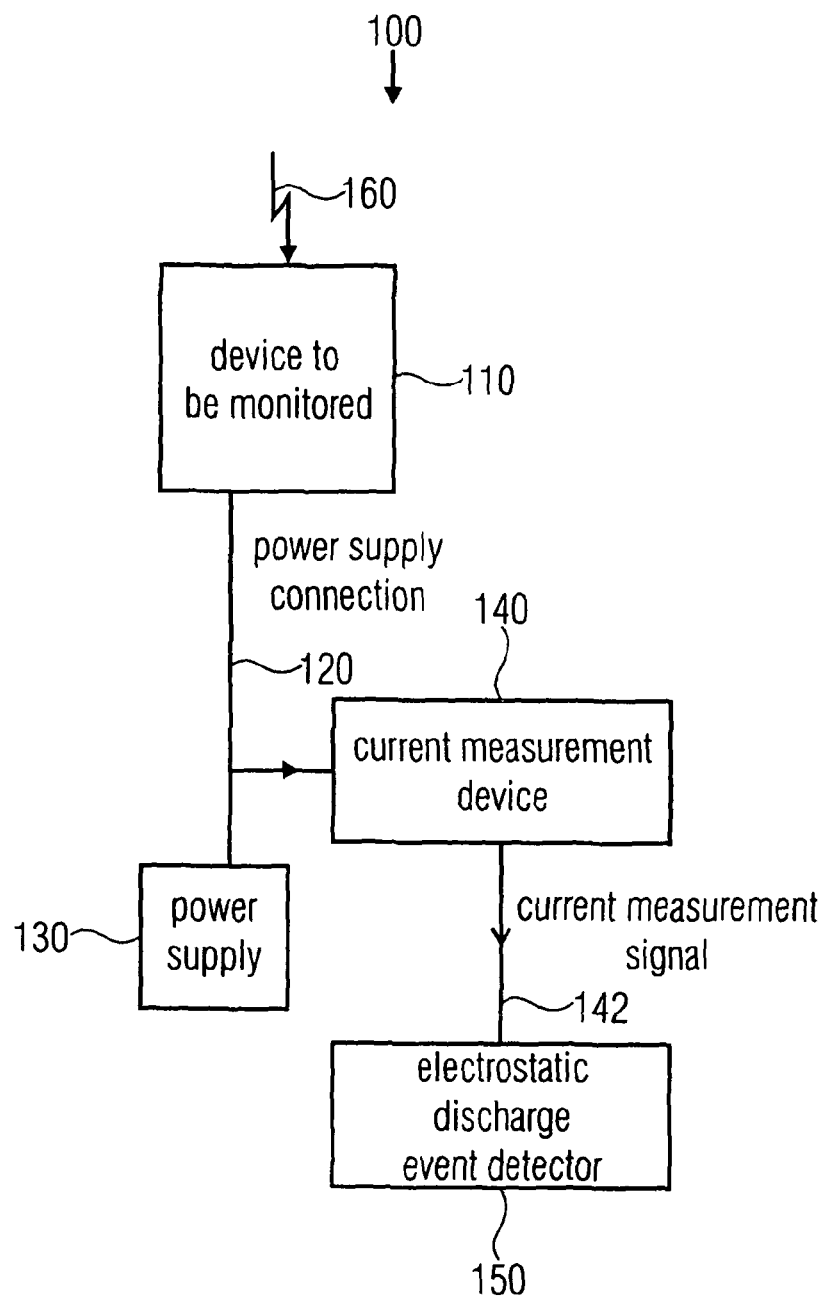
FIG. 1a shows a block schematic diagram of a system for detecting an electrostatic discharge event, according to an embodiment according to the invention.

FIG. 1a shows a block schematic diagram of a system (or device) for detecting an electrostatic discharge event with respect to a device to be monitored. The system shown in FIG. 1a is designated in its entirety with 100. The system 100 comprises a device 110 to be monitored. The system 100 further comprises a power supply connection 120, via which the device to be monitored is connected to a power supply 130. The power supply 130 may or may not be part of the system 100. The system 100 comprises a current measurement device 140, which is configured to measure a current flowing via the power supply connection 120 or a current component thereof, to obtain a current measurement signal 142 representing the current or current component. The system 100 further comprises an electrostatic discharge event detector 150. The electrostatic discharge event detector receives the current measurement signal 142 and is configured to detect an electrostatic discharge event in response to a pulse of the current measurement signal 142.

In the following, the functionality of the system 100 will be briefly described. It is assumed here that the device 110 to be monitored is affected by an electrostatic discharge event, which is represented here by an arrow 160. The ESD event 160 brings along a discharge current, which may for example be transferred to an electronic component of the device 110 to be monitored. For example, if the device 110 to be monitored is a test head of a device test system, a discharge current may flow through a conductor of a device-under-test (dut) port and through one or more components of a channel module of the test head. However, the discharge current will finally in many cases be routed to the power supply connection 120. Consequently, a current peak or current pulse on one or more lines of the power supply connection 120 will be caused by the electrostatic discharge event. Thus, the current measurement device 140, which is configured to provide the current measurement signal 142 representing the current flowing via the power supply connection (or a current component thereof), translates the current pulse or current peak caused by the electrostatic discharge event 160 into a pulse or peak of the current measurement signal 142. As a consequence, the electrostatic discharge event detector 150 detects the electrostatic discharge event, for example by analyzing the current measurement signal 142 and by identifying the pulse or peak in the current measurement signal 142 caused by the ESD event 160. Consequently, the electrostatic discharge event detector 150 may provide a signal or alarm indicating the occurrence of an ESD event.

To summarize the above, an ESD event affecting the device 110 to be monitored is translated into a current pulse on the power supply connection 120. The current measurement device 140 is configured to detect this current pulse or current peak on the power supply connection 120 and to provide the current measurement signal 142, such that the current measurement signal 142 describes the current pulse caused by the ESD event on the power supply connection 120. Consequently, the electrostatic discharge event detector 150 can remotely detect the ESD event 160.

As can be seen from FIG. 1a, the system topology of the system 100 is very simple. A conventional device 110 to be monitored may be left unchanged. For example, it can be avoided to insert any additional circuitry into a conventional device 110 to be monitored in order to detect ESD events affecting the device 110 to be monitored. Rather, it is sufficient to have access to the power supply connection 120 of the device 110 to be monitored in order to detect ESD events affecting said device 110 to be monitored.

Moreover, many different methods for measuring the current flowing via the power supply connection 120 can be used. Both galvanic and galvanically separated concepts can be used. For example, the current flowing via the power supply connection can be measured using one or more shunt resistors. The measurement of current via shunt resistors is well known to a man skilled in the art and will not be explained here in detail. Alternatively, a current flowing via one or more conductors of the power supply connection 120 can be measured via a current clamp. The use of a current clamp brings along some positive effects. On the one hand, losses, which would for example be generated in a shunt resistor, can be avoided. Also, a current clamp can be attached to the power supply connection 120 during the operation of the device 110 to be monitored, for example without interrupting the power supply connection 120. Also, a current clamp can be used to measure a common mode current in a plurality of conductors of the power supply connection. According to an embodiment according to the invention, a current clamp may even be used to measure a common mode current flowing through all of the power supply conductors connecting the device 110 to be monitored with the power supply 130. By obtaining the current measurement signal 142 on the basis of the common mode current flowing via two or more conductors of the power supply connection 120, current pulses on the conductors of the power supply connection 120, which are caused by the normal operation of the device 110 to be monitored, can be averaged out. Thus, by using a common mode current measurement for obtaining the current measurement signal 142 (for example making use of a current clamp), a sensitivity of the ESD event detection with respect to current pulses caused by the operation of the device 110 to be monitored can be substantially reduced. Consequently, a reliability of the detection of ESD events can be improved significantly.

However, in some simple embodiments according to the invention, it is sufficient to generate the current measurement signal 142 on the basis of a current in a single conductor of the power supply connection 120.

Figure 1B:
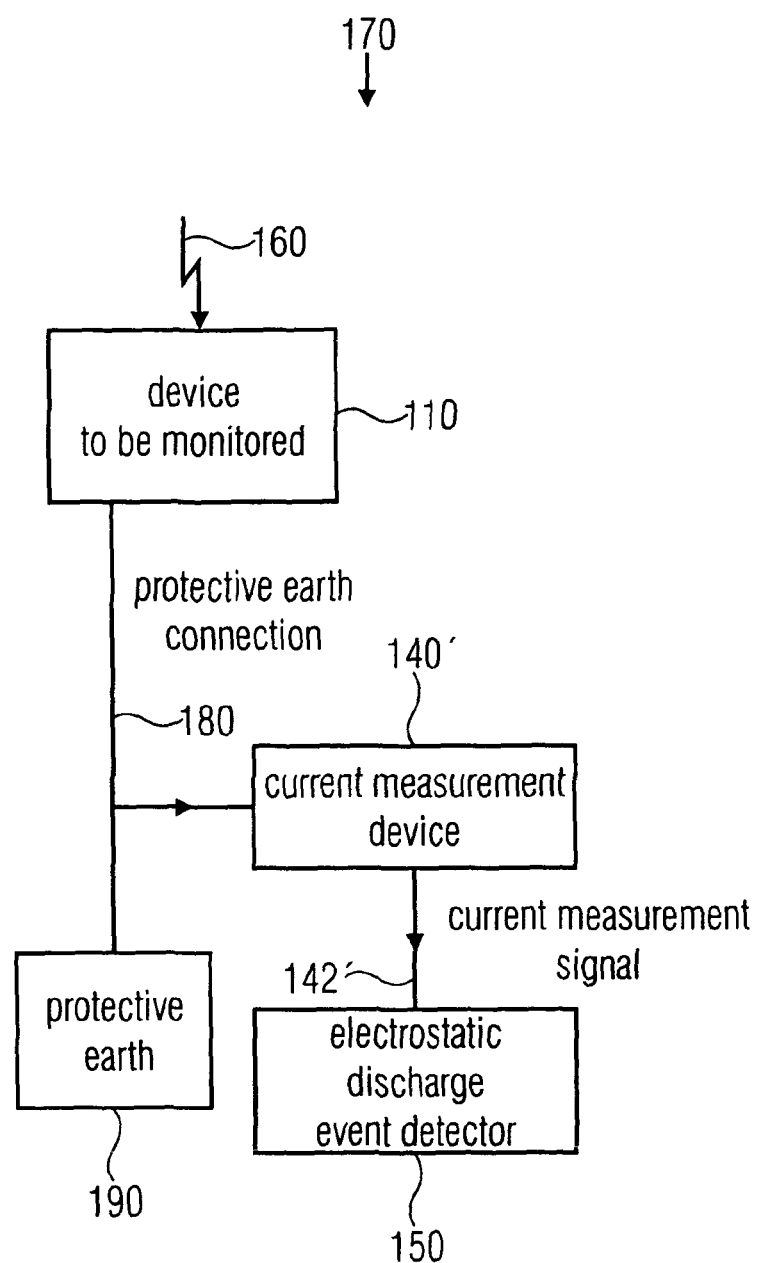
FIG. 1b shows a system for detecting an electrostatic discharge event, according to another embodiment according to the invention.

In the following, an alternative system configuration will be described taking reference to FIG. 1b. FIG. 1b shows a block schematic diagram of a system for detecting an electrostatic discharge event with respect to a device under test, according to another embodiment according to the invention. The system shown in FIG. 1b is designated in its entirety with 170. The system 170 is similar to the system 100 shown in FIG. 1a. Accordingly, identical means and signals will be designated with identical reference numerals herein.

The system 170 comprises a device 110 to be monitored. The device 110 to be monitored is connected via a protective earth connection 180 with a protective earth 190. The protective earth 190 may for example be represented by a grounding box, a grounding terminal, a ground plate, an earth clip, an earthing bar, a grounded bus, a grounding screw, an earthing screw, a grounding receptacle or an earth system. In some embodiments, the protective earth 190 may be formed by a conductive floor covering. In some embodiments, the protective earth is a potential connection to which conductive or metallic racks or housings are connected. Also, the term "protective earth" is well known in the technical field of electrical installation.

The system 170 comprises a current measurement device 140'. The current measurement device 140' of the system 170 is similar to the current measurement device 140 of the system 100. The current measurement device 140' is configured to measure a current flowing via the protective earth connection 180 and to obtain (or provide) a current measurement signal 142' representing the current.

Moreover, the system 170 comprises an electrostatic discharge event detector 150.

The system 170 differs from the system 100 in that the current flowing via the protective earth connection 180 is evaluated for the detection of an ESD event, rather than the current or current component flowing via the power supply connection 120. However, it has also been found that the current flowing via the protective earth connection 180 is a good indication of an electrostatic discharge event. It has been found that many ESD events couple to the protective earth connection 180. In other words, at least a part of the discharge current making up the ESD event 160 flows to the protective earth 190 via the protective earth connection 180. Accordingly, many ESD events can be detected by the system 170. Again, the measurement of the current flowing via the protective earth connection 180 can be implemented with very little effort, for example with minimum or even no modification of the device 110 to be monitored. Nevertheless, a high degree of reliability of the detection of ESD events can be obtained by the system 170 shown in FIG. 1b. The current flowing via the protective earth connection 180 can for example be measured using a current clamp without interrupting the operation of the device 110 to be monitored. Thus, costs for the installation of the ESD event detection can be minimized, and the uptime of the device 110 to be monitored can be optimized.

In some embodiments, the systems described herein may be configured to continuously monitor the current measurement signal in order to detect electrostatic discharge events. For example, in some embodiments the monitoring may be performed continuously as long as the device to be monitored is operative. In some embodiments, ESD events may be logged to obtain an ESD event history. The ESD event history may in some embodiments be without gaps over a given time interval, for example over a working shift, a day, a week or even a longer time interval. In this way, a high degree of reliability can be achieved in some embodiments.

A probability that an ESD event is missed can be reduced very strongly, for example down to 5% or even down to 1%. In some embodiments, it can even be avoided that ESD events occurring during the uptime of the device to be monitored are missed. In some environments, the current measurement signal may even be monitored for 24 hours, 7 days per week, in order to achieve a maximum level of certainty regarding the occurrence of ESD events.

Figure 2A:
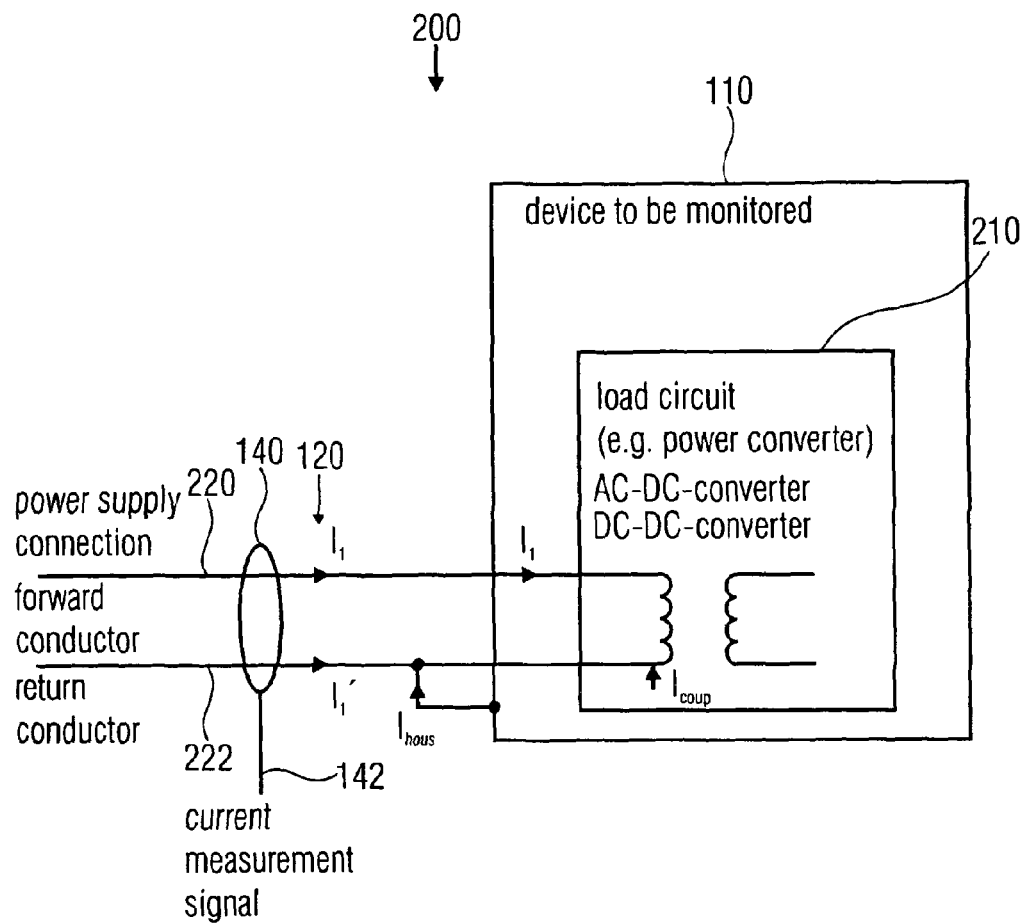
FIG. 2a shows a schematic representation of a first possibility for a power supply connection, according to an embodiment according to the invention.

In the following, some configurations will be shown for the measurement of the current flowing via the power supply connection. FIG. 2a shows a schematic representation of a first possibility for a power supply connection, according to an embodiment according to the invention. The schematic representation of FIG. 2a is designated in its entirety with 200. The schematic representation 200 represents an extract of one of the systems 100, 170 described with reference to FIGS. 1a and 1b. The schematic representation 200 shows a device 110 to be monitored and a power supply connection 120. The device 110 to be monitored comprises a load circuit 210, for example a power converter. For example, the load circuit 210 may comprise an alternating-current-to-directional-current converter (AC/DC converter) or a directional-current-to-directed-current converter (DC/DC converter). The AC/DC converter or the DC/DC converter (or generally the load circuit 210) may for example be coupled to the power supply connection 120. The power supply connection 120 comprises, for example, a first conductor or forward conductor 220 and a second conductor or return conductor 222. The first conductor 220 and the second conductor 222 of the power supply connection 120 may for example be coupled with an input of the load circuit 210. If the load circuit is an AC/DC converter, the first conductor 220 and the second conductor 222 (or, generally, the power supply connection 120) may be configured to supply the load circuit 210 with an alternating current signal. If, however, the load circuit 210 comprises a DC/DC converter, an input of which is coupled to the power supply connection 120, the first conductor 220 and the second conductor 222 may be configured to supply the load circuit 210 with a directional current signal. In the embodiment shown in FIG. 2a, the power supply connection 120 does not comprise a dedicated protective earth conductor. Rather, a housing or carrying structure of the device 110 to be monitored may be connected to one of the two conductors 220, 222, for example to the second conductor or return conductor 222, as shown in FIG. 2a.

In an embodiment according to the invention, the current measurement device 140 may be configured to measure a common mode current on the conductors 220, 222. For example, the current measurement device 140 may be configured to measure a current $I_{meas}=I_1+I_1'$. Taking into consideration the current directions, it can be stated that $$I_1'=-I_1-I_{coup}-I_{hous}.$$

Herein, $I_{coup}$ is a current coupled into the load circuit 210, for example via a parasitic (capacitive) coupling between an input of the load circuit 210 and an output of the load circuit 210. The current $I_{hous}$ is a current coupled from a conductive housing of the device 110 to be monitored or from a conductive carrying structure of the device 110 to be monitored towards the second conductor 220. Overall, the following relationship may hold:

$$I_{meas}=-I_{hous}-I_{coup}=-(I_{hous}+I_{coup}).$$

Moreover, in many cases, the following relationship holds at least approximately, $$I_{hous}+I_{coup}=I_{ESD}.$$

Thus, the measurement current $I_{meas}$ represents, at least approximately, a discharge current $I_{ESD}$.

In the embodiment shown in FIG. 2a, the current measurement device 140 is configured to measure a common mode component of the current flowing in the first conductor 220 and the second conductor 222. This common mode component can for example be measured with a current clamp arranged around the first conductor 220 and the second conductor 222. In other words, both the first conductor 220 and the second conductor 222 may be routed through the inside of the current clamp, as shown in FIG. 2a.

As can be seen from the above discussion, the differential mode current supply component $I_1$ is, at least approximately, eliminated and does not significantly contribute to the current measurement signal 142 provided by the current measurement device 140. Accordingly, the above measurement concept is not affected by any pulses or peaks of the differential mode current $I_1$. In other words, changes in the power supply current of the load circuit 210 (i.e. of the differential mode current $I_1$) do not affect the generation of the current measurement signal 142.

It should be noted here that using the arrangement 200 shown in FIG. 2a, several significant advantages can be obtained. On the one hand, a single current measurement device 140 is sufficient in order to monitor the currents on a plurality of conductors 220, 222. On the other hand, by measuring the common mode current on a plurality of conductors 220, 222, supply current fluctuations which are not caused by an ESD event do not (or at least not significantly) contribute to the current measurement signal 142. Thus, a double benefit can be obtained.

Figure 2B:
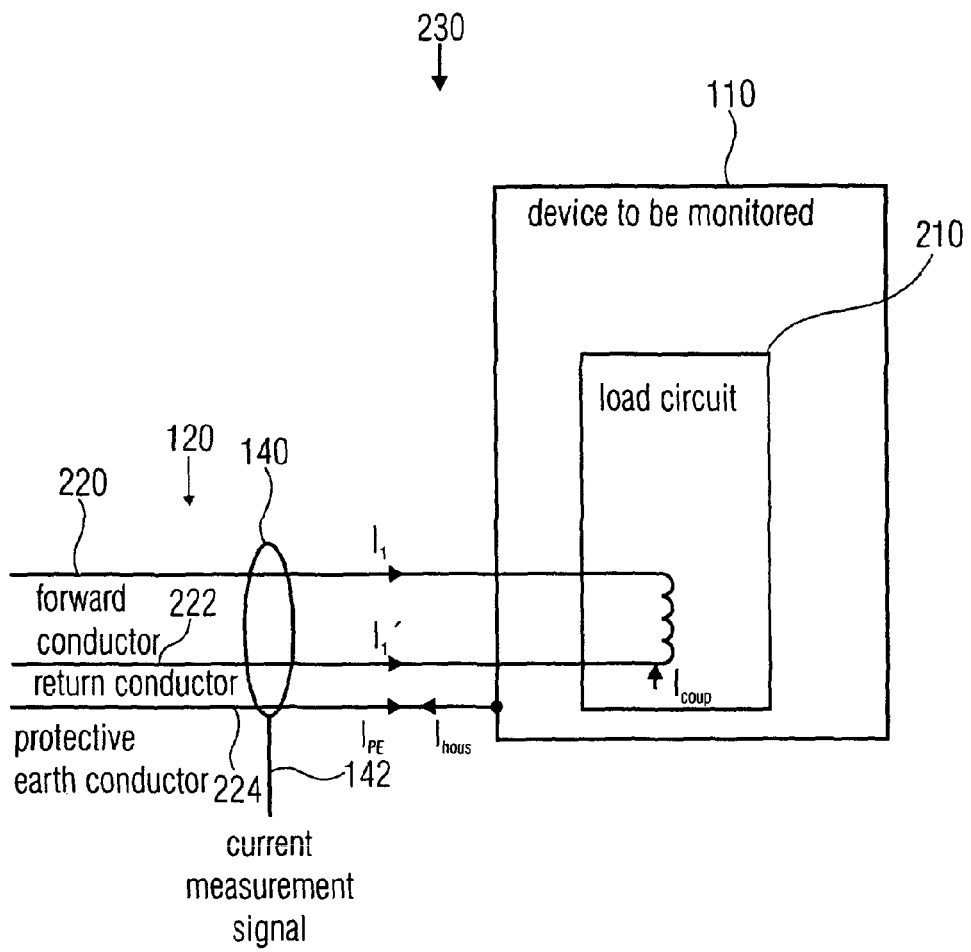
FIG. 2b shows a schematic representation of a second possibility for a power supply connection, according to an embodiment according to the invention.

In the following, another possible arrangement will be described taking reference to FIG. 2b. FIG. 2b shows a schematic representation of a second possibility for a power supply connection, according to an embodiment according to the invention.

FIG. 2b shows an extract of the system 100 shown in FIG. 1a or the system 170 shown in FIG. 1b. The components shown in FIG. 2b are designated in their entirety with 230. FIG. 2b shows a device 110 to be monitored comprising a load circuit 210. The load circuit 210 shown in FIG. 2b may be identical to the load circuit 210 shown in FIG. 2a. However, in the embodiment shown in FIG. 2b, the power supply connection 120 may comprise a first conductor 220, also designated as forward conductor, a second conductor 222, also designated as return conductor, and a protective earth conductor 224. As shown in FIG. 2b, the first conductor 220 and the second conductor 222 may be connected to a supply power input of the load circuit 210. The protective earth conductor 224 may for example be coupled, for example, in a different galvanic way to a conductive housing or conductive carrying structure of the device 110 to be monitored, as shown. The current measurement device 140 may for example be configured to measure a common mode current component flowing via the power supply connection 120 (comprising, at least, the first conductor 220, the second conductor 222, and the protective earth conductor 224). For example, the current measurement device 140 may be configured to generate the current measurement signal 142 such that the current measurement signal 142 represents the common mode component of the current. For example, the measurement signal 142 may represent the measurement current $I_{meas}$, wherein $$I_{meas}=I_1+I_1'+I_{PE}=-(I_{coup}+I_{hous}).$$

In other words, in the configuration shown in FIG. 2b, the current measurement signal 142 may for example represent, at least approximately, a discharge current.

It should be noted here that in the embodiment shown in FIG. 2b, both the forward conductor 220, the return conductor 222 and the protective earth conductor 224 may be routed through a single current clamp, which may form the current measurement device 140. In this case, the output signal of the current clamp may represent the current measurement signal 142.

It should be noted here that the first conductor 220 may for example be a phase conductor of a single-phase (or multiple-phase) alternating current mains supply and that the second conductor 222 may be a neutral conductor of the single-phase (or multiple-phase) mains supply. In another embodiment, the first conductor may be a positive conductor of a directional current supply, and the second conductor 222 may be a negative conductor of the directional current supply. Also, the second conductor 222 may for example be connected with the protective earth conductor 224, either within the device 110 to be monitored or outside of the device 110 to be monitored.

Figure 2C:
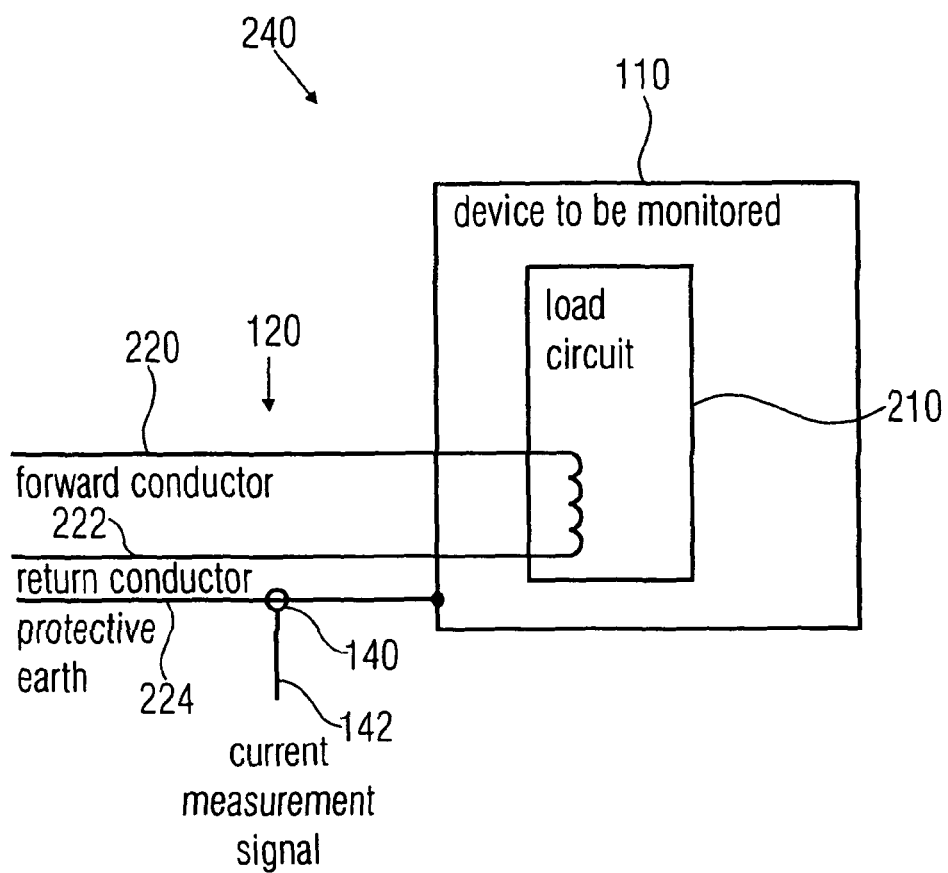
FIG. 2c shows a schematic representation of a third possibility for a power supply connection, according to an embodiment according to the invention.

In the following, other possible configurations will be described. For example, FIG. 2c shows a schematic representation of a third possibility for a power supply connection, according to an embodiment according to the invention. The arrangement shown in FIG. 2c is designated in its entirety with 240. The arrangement 240 comprises a device 110 to be monitored, a load circuit 210, for example as described above, and a power supply connection 120. The power supply connection 120 comprises, for example, at least a first conductor or forward conductor 220 and a second conductor or return conductor 222. Moreover, the power supply connection may comprise a protective earth conductor 224. For example, the first conductor 220 and the second conductor 222 may be configured to provide electrical energy to a load circuit 210, for example in the form of an alternating current or a directional current. The protective earth conductor 224 may for example be connected to a conductive or metallic housing of the device 110 to be monitored or to a carrying structure of the device 110. Alternatively or in addition, the protective earth conductor 224 may be connected to a shielding or housing of a circuitry of the device 110 to be monitored.

The arrangement 240 comprises a current measurement device 140, which may for example be configured to measure a current flowing via the protective earth conductor 224, to provide a current measurement signal 142 describing the current flowing through the protective earth conductor 224. As can be seen in FIG. 2c, the current measurement device 140 may for example be configured to generate the current measurement signal 142 on the basis of the current flowing via the protective earth conductor 224 only. In other words, the current measurement device 140 may be configured such that, at least under some circumstances, currents or current components flowing via the first and second conductors 220, 222 (or generally, via the conductors configured to provide electrical energy to the load circuit 210, or to the device 110 to be monitored) do not have a substantial effect on the current measurement signal 142. In other words, in some embodiments according to the invention, the current flowing via the protective earth conductor is taken as a phenomenon indicating the presence of an electrostatic discharge, for example without considering a current flowing via conductors providing electrical energy to the device 110 to be monitored, or independent from a current flowing through conductors providing electrical energy to the device 110 to be monitored.

It should be noted here that there are different configurations of the protective earth conductor 224, as will be discussed in detail herein. For example, the protective earth conductor 224 can be part of the power supply connection 120. For example, the power supply connection 120 may comprise a cable having multiple conductors, which are joined inseparably. For example, the first conductor 220, the second conductor 222 and the protective earth conductor 224 may be integrated inseparably in a single cable. Alternatively, the first conductor 220, the second conductor 222 and the protective earth conductor 224 may be arranged in a single cable conduit. Alternatively, the protective earth conductor 224 may be routed separately from the first conductor 220 and the second conductor 222, as will be discussed with reference to FIG. 3b.

In some embodiments according to the invention, the current measurement device 140 comprises a current clamp, which may be arranged around the protective earth conductor 224, while the first conductor 220 and the second conductor 222 are routed at a distance from the current clamp without extending through the current clamp.

Figure 2D:
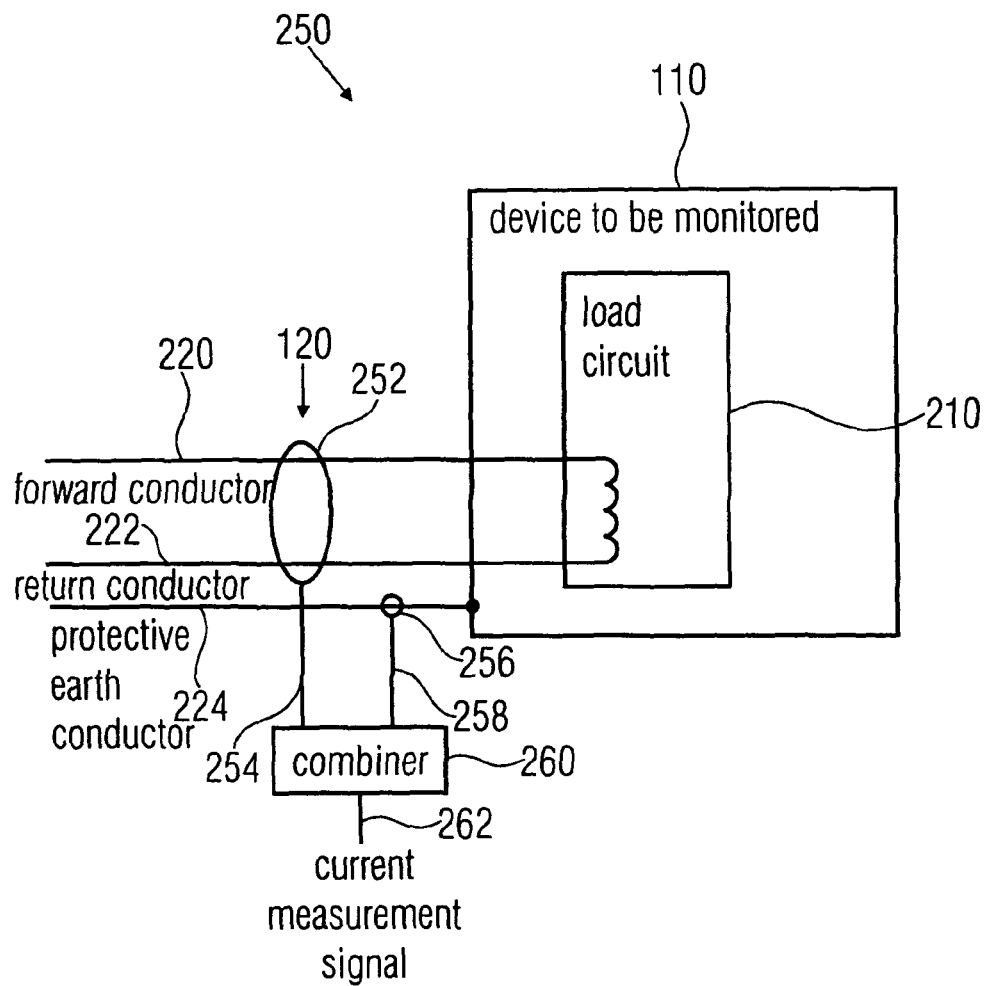
FIG. 2d shows a schematic representation of a fourth possibility for a power supply connection, according to an embodiment according to the invention.

FIG. 2d shows a schematic representation of a fourth possible configuration. The arrangement shown in FIG. 2b is designated in its entirety with 250. The arrangement 250 comprises a device 110 to be monitored, wherein the device 110 to be monitored comprises a load circuit 210. The arrangement 250 comprises a power supply connection 120. The power supply connection 120 comprises, for example, a first conductor 220, a second conductor 222 and a protective earth conductor 224. The first and second conductors 220, 222 may for example be routed together with the protective earth conductor 224 or separately from the protective earth conductor 224, depending on the circumstances. However, a first current measurement device 252 may be used to provide a first current measurement signal 254 representing a current flowing via one or more of the first conductor 220 and the second conductor 222. The arrangement 250 further comprises a second current measurement device 256 configured to provide a second current measurement signal 258 representing a current flowing via the protective earth conductor 224. The arrangement 250 may further comprise a combiner 260 configured to provide a joint current measurement signal 262 on the basis of the first current measurement signal 254 and the second current measurement signal 258, for example by combining said first and second current measurement signals 254, 258. The joint current measurement signal 262 may for example be used by an electrostatic discharge event detector 150 to detect an electrostatic discharge event.

In the arrangement shown in FIG. 2d, both currents flowing through the conductors supplying electrical energy to the load circuit 210 or to the device 110 to be monitored and current flowing via the protective earth conductor 224 can be considered for the detection of an ESD event, even if the conductors for supplying electrical energy are separated from the protective earth conductor.

Figure 2E:
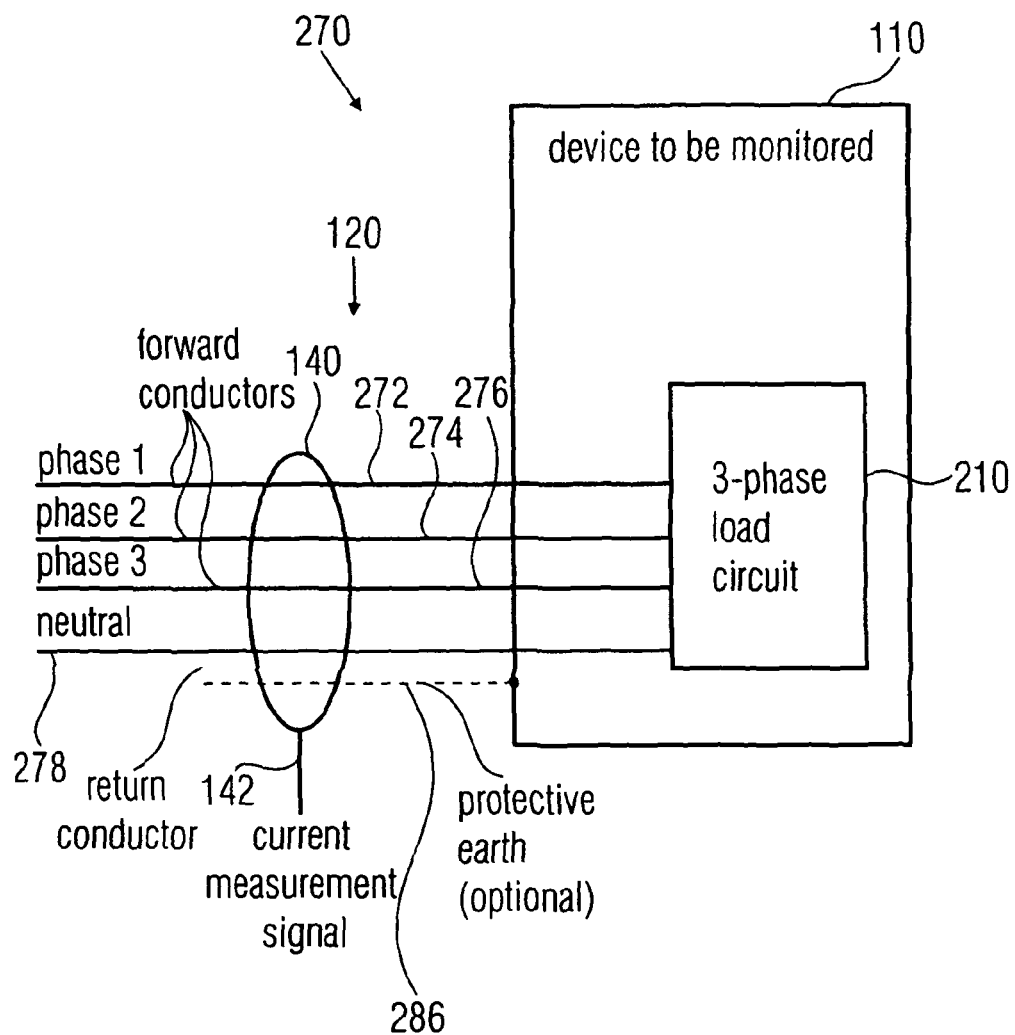
FIG. 2e shows a schematic representation of a fifth possibility for a power supply connection, according to an embodiment according to the invention.

FIG. 2e shows a schematic representation of a fifth possibility for a power supply connection. The arrangement shown in FIG. 2e is designated in its entirety with 270. The arrangement 270 comprises a device 110 to be monitored. The device 110 to be monitored comprises a load circuit 210, for example in the form of a multi-phase load circuit or a three-phase load circuit. The arrangement 270 comprises a power supply connection 120. The power supply connection 120 may for example comprise a plurality of phase conductors 272, 274, 276 and, optionally, one or more neutral conductors 278. The phase conductors 272, 274, 276 may for example be regarded as forward conductors, while the optional neutral conductor may be regarded as a return conductor. The phase conductors and the optional neutral conductor may for example be configured to provide electrical energy to the load circuit 210 and/or to the device 110 to be monitored.

The arrangement 270 may for example, optionally, comprise a protective earth conductor 280. Further, the arrangement 270 comprises at least one current measurement device 140, which may for example be configured to provide a current measurement signal 142 representing a common mode current component flowing via the two or more phase conductors 272, 274 and 276. Optionally, the current measurement device 140 may also be configured to take into account the current flowing via the optional neutral conductor 278 and/or the current flowing via the optional protective earth conductor 280.

For example, all the conductors, the currents of which are to be taken into account, may be routed through a single current clamp. In this case, the current clamp provides, as the current measurement signal 142, a signal representing a common mode current component of the conductors routed through the current clamp (i.e. a sign-correct) sum of the currents on the conductors routed through the current clamp.

To summarize the above, different configurations of the power supply connection may be used. For the generation of the current measurement signal, the currents or current components flowing via one or more of the conductors will be taken into account. In some embodiments, only currents or current components flowing via conductors for providing electrical energy to the device 110 to be monitored or to the load circuit 210 are considered. In some other embodiments, only currents flowing via one or more protective earth conductors are considered. In some embodiments, currents flowing both through conductors for providing electrical energy and through one or more protective earth conductors are considered for the generation of the current measurement signal. In some embodiments, a single current measurement device is used to measure currents flowing through a plurality of conductors, for example a current clamp arranged around the plurality of conductors. In other embodiments, two or more current measurement devices (e.g. current clamps) are used to measure different current components, and the current measurement signals generated by the two or more current measurement devices are combined.

Figure 3A:
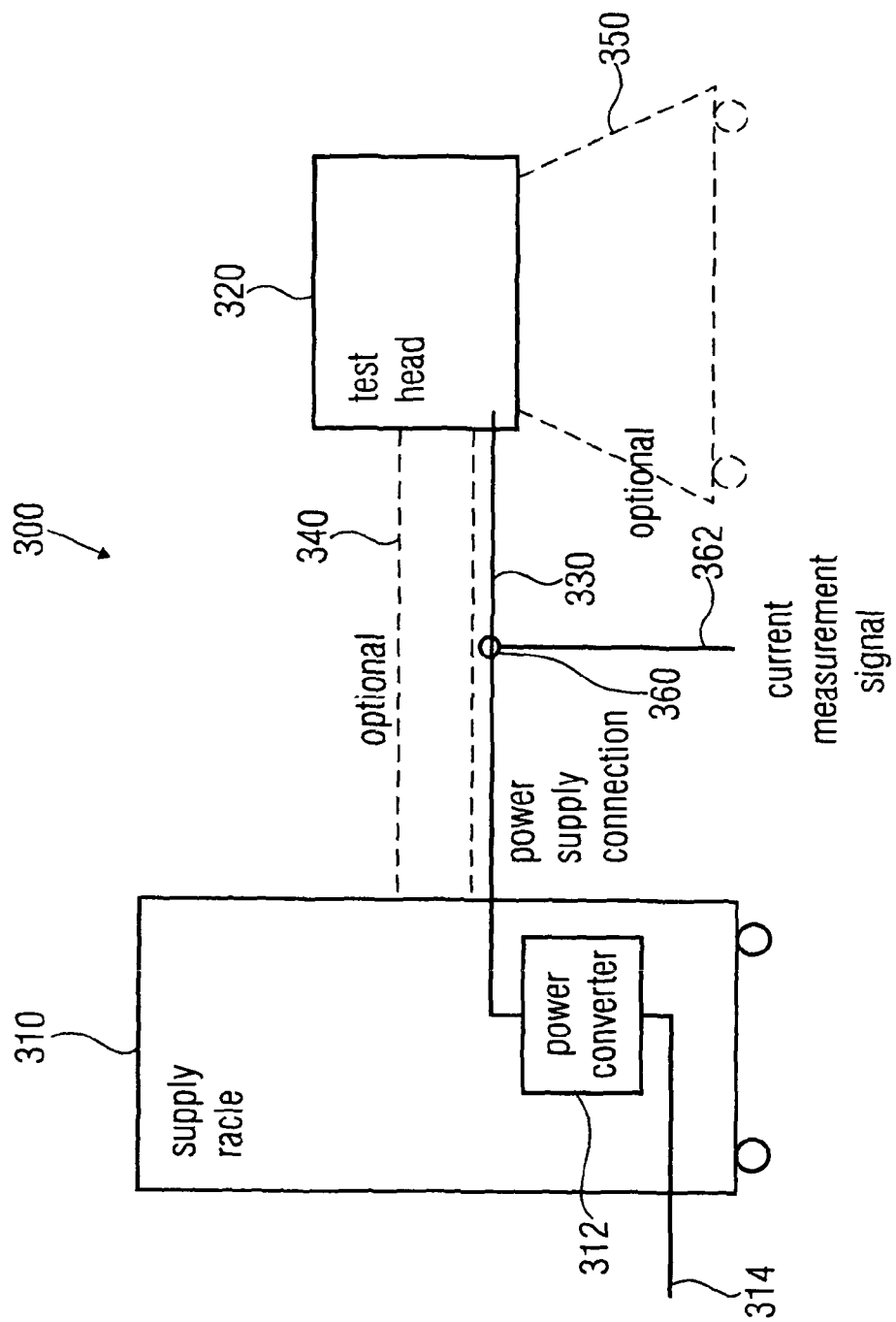
FIG. 3a shows a schematic diagram of a test system, according to an embodiment according to the invention.

FIG. 3a shows a schematic representation of a test system of device test system, according to an embodiment according to the invention. The device test system shown in FIG. 3a is designated in its entirety with 300. The device test system 300 comprises a supply rack 310 and a test head 320, which may for example be arranged external to the supply rack 310. The supply rack 310 is connected with the test head 320 via a power supply connection 330. The supply rack 310 may for example comprise a power converter 312, which may for example be connected to a mains network via a mains connection 314. The mains network may for example provide a single-phase supply voltage (for example with an effective value of about 110 V, 120 V, 220 V or 230 V) to the power converter 312. In other embodiments, the mains network may provide a three-phase mains supply voltage to the power converter 312. The power converter 312 may for example be configured to convert the mains supply voltage provided via the mains connection 314 to a different voltage level. In addition, the power converter 312 may for example convert the alternating current mains supply voltage to a directional current test head supply voltage. Thus, the power converter 312 may provide a test head supply voltage to a test head 320 via the power supply connection 330. The test head supply voltage may take different forms. For example, the test head supply voltage may be a single-phase alternating current supply voltage, a multi-phase alternating current supply voltage, a single directional current supply voltage or may comprise multiple directional current supply voltages.

The power supply connection 330 may be equivalent to the power supply connection 120 described with reference to FIGS. 1a and 2a to 2e.

To summarize, the supply rack 310 may be configured to provide one or more supply voltages to the test head 320 via the power supply connection 330.

Regarding the mechanical arrangement, the test head 320 may for example be attached to the supply rack 310 via an optional carrier arm 340. The optional carrier arm 340 may for example be configured to allow for a relative movement of the test head 320 with respect to the supply rack 310. Also, the optional arm 340 in some embodiments provides for an electrically conductive connection between a housing or carrier structure of the test head 320 and a housing or carrier structure of the supply rack 310.

However, in some other embodiments, the test head 320 may be mounted on a separate rack or cart 350.

The system 300 may comprises a current measurement device 360, which is configured to measure a current or current component flowing via the power supply connection 330 and to provide a current measurement signal 362 representing the current or current component flowing through the power supply connection 330.

In some embodiments, the current measurement device 360 comprises a current clamp arranged around a cable or cable tree or around a loom of wires comprising a plurality of conductors of the power supply connection 330. In some embodiments, the current clamp is arranged around a cable conduit, within which a plurality of conductors of the power supply connection 330 are routed.

The current measurement device or the current clamp 360 may for example be arranged within the supply rack 310 (not shown in FIG. 3a), within the test head 320 (not shown in FIG. 3a) or between a cable outlet of the supply rack 310 and a cable inlet of the test head 320. The arrangement of the current measurement device or current clamp 360 between the supply rack 310 and the test head 320 brings along the advantage that the current measurement device or current clamp may be installed in a particularly simple way. Also, the cable trees are typically well bundled between the supply rack 310 and the test head 320. Moreover, in some embodiments a sensitivity of the current measurement device with respect to electrostatic discharge is particularly good if the current measurement device or current clamp 360 is arranged between the supply rack 310 and the test head 320.

Figure 3B:
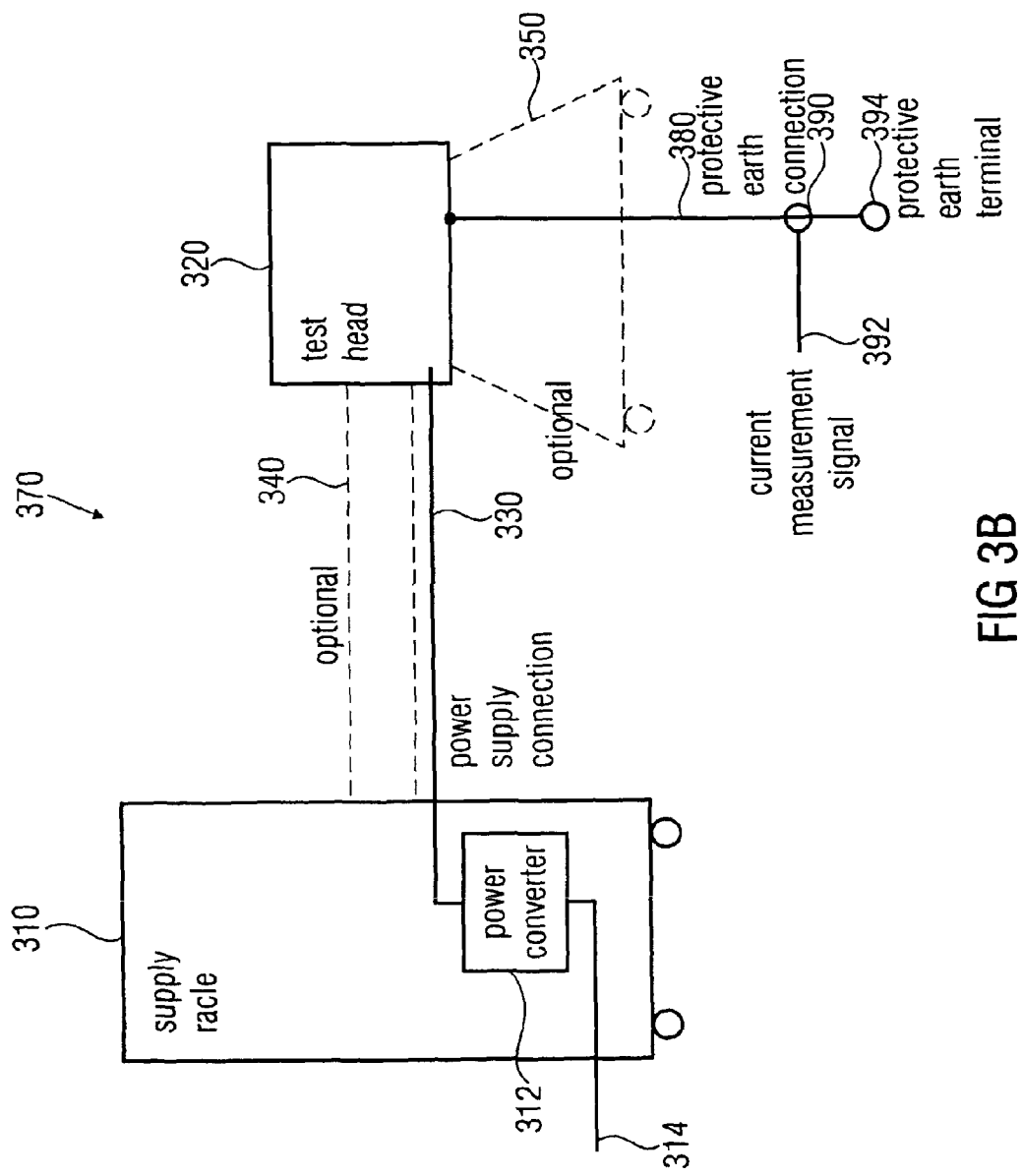
FIG. 3b shows a schematic diagram of another test system, according to an embodiment according to the invention.

In the following, a different configuration of a device test system will be described with reference to FIG. 3b. FIG. 3b shows a schematic representation of a device test system according to another embodiment according to the invention. The device test system shown in FIG. 3b is designated in its entirety with 370. However, as the device test system 370 is very similar to the device test system 300, identical means and signals will be designated with identical reference numerals in FIGS. 3a and 3b. However, in the device test system 370, the test head is connected to a protective earth or protective earth terminal via a protective earth connection 380 (which is also possible, but not necessary in the device test system 300). The protective earth connection 380 may for example comprise a protective earth (PE) cable routed from the test head, for example, to a protective earth terminal, protective earth bar, grounding part or grounding receptacle.

The device test system 370 comprises a current measurement device 390, which is configured to measure a current flowing via the protective earth connection 380, and to provide a current measurement signal 392 representing the measured current. The current measurement signal 392 may be used as an input for an electrostatic discharge event detector (for example for the electrostatic discharge event detector 150).

The current measurement device 390, which may for example comprise a current clamp arranged around the protective earth connection 380, may be arranged within the test head 320. In another embodiment, the current measurement device 390 may be arranged between the test head 320 and a protective earth terminal 394.

Figure 4A:
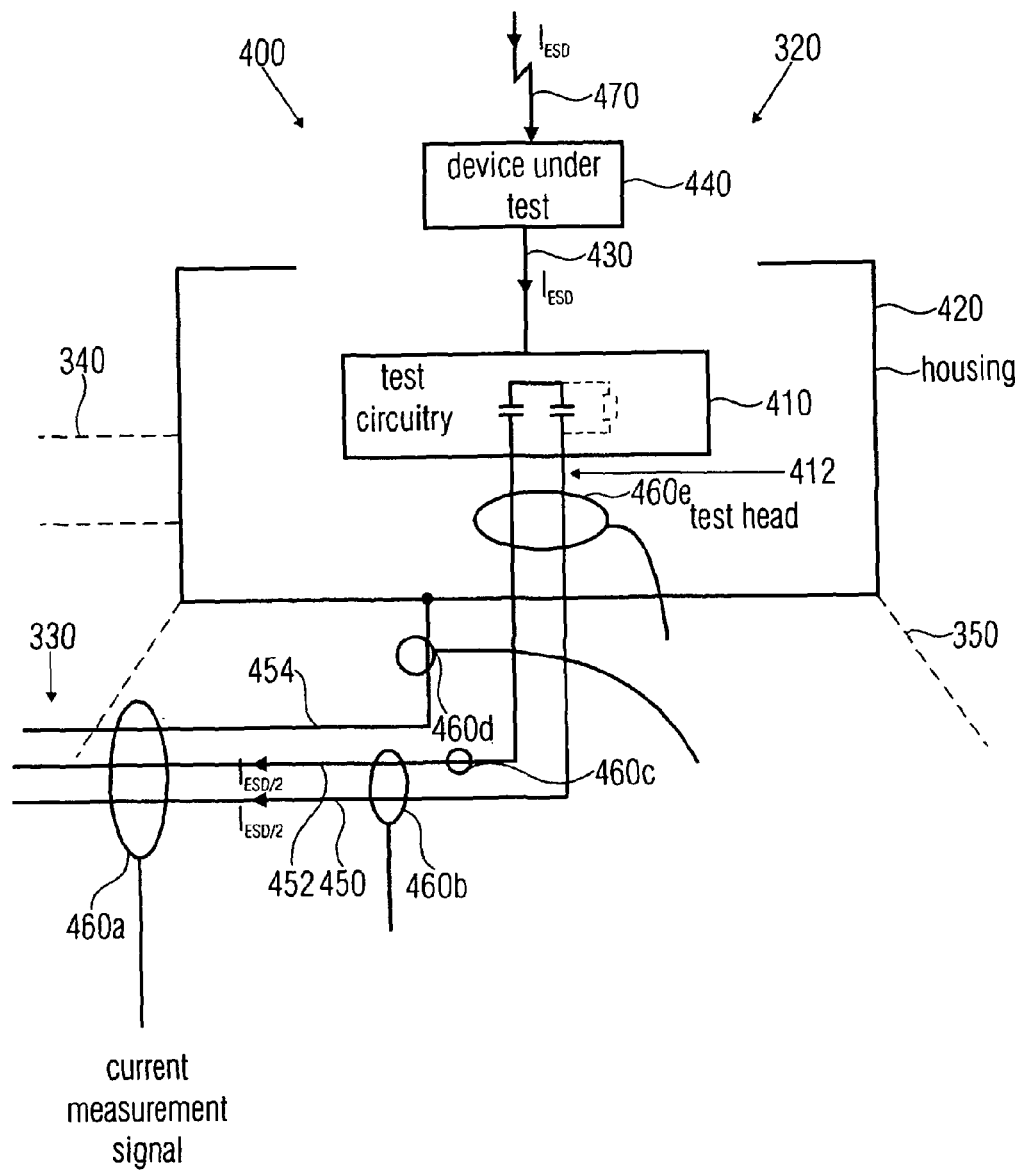
FIG. 4a shows a schematic representation of possible current paths of an electrostatic discharge current in a device test system.

In the following, details regarding the test head will be explained taking reference to FIGS. 4a and 4b. FIG. 4a shows a schematic representation of a test head of a device test system connected to a supply rack via a power supply connection. It should be noted here that similar signals already described before are designated with the same reference numerals here and will not be explained again.

The arrangement of FIG. 4a is designated in its entirety with 400. The arrangement 400 comprises a test head 320, for example as described above. The test head 320 comprises a test circuitry 410, which may be equivalent to the load circuit 210 described before. Also, the test head 320 may be regarded as a device to be monitored. The test circuitry 410 may for example comprise one or more channel modules configured to output test patterns to a device under test and/or to receive signals from a device under test and compare the received signals with expected reference signals. The test circuitry may for example further comprise one or more power converters, as explained above with respect to the load circuit 210. The power converters may for example be configured to receive electrical energy via the power supply connection 330 and to provide an electrical energy to one or more channel modules. It should be noted here that the configuration of the test circuitry in the form of channel modules is not required. Rather, other forms of pattern generators or pattern receivers can also be used.

It should be noted here that in some embodiments, the test circuitry 410 is housed within housing a 420, which may for example be electrically conductive to shield the test circuitry 410. Moreover, the test head 320 may comprise a device-under-test (dut) interface 430, which may be configured to establish a connection between the test circuitry 410 and a device under test 440. For example, the dut interface 430 may allow for establishing a detachable connection between the test circuitry 410 and the device under test 440, for example between a channel output port of a channel module and an input pin of the device under test, or between an output pin of the device under test 440 and an input port of a channel module.

Moreover, the test circuitry 410 may be connected with a power supply (for example a power supply arranged in the supply rack 310) via the power supply connection 330. The power supply connection 330 may comprise two or more power supply conductors and, optionally, one or more protective earth conductors. The power supply conductors (for supplying electrical energy to the test circuitry 410) are designated with 450 and 452, and the protective earth conductor is designated with 454. Moreover, one or more current measurement devices (for example current clamps) may be arranged to measure the current in the power supply conductors or in the protective earth conductor 454. Possible arrangements of the one or more current measurement devices are designated here with 460a to 460e. However, any the other configuration described herein could be used.

In the following, a response to an electrostatic discharge event will be described taking reference to FIG. 4a. It will be assumed that an electrostatic discharge indicated by an arrow 470 occurs, which directs a discharge current $I_{ESD}$ to the device under test 440. The discharge current $I_{ESD}$ (or at least a significant portion thereof) flows from the device under test 440 to the test circuitry 410 via the device-under-test interface 430. The discharge current $I_{ESD}$ is coupled, at least partially, to the power supply input 412 of the test circuitry 410. The coupling can for example be galvanical or via parasitic capacitances. For example, the coupling path may comprise one or more semiconductor elements (e.g. transistors) of the test circuitry 410 and further an inductive, resistive or capacitive path. In an embodiment, a significant portion of the discharge current $I_{ESD}$ couples from the device under test 440 to the power supply input 412 of the test circuitry 410. For the sake of simplicity, it is assumed here that the complete discharge current is coupled, but this is of course not necessary. As can be seen from FIG. 4a, it is assumed that the discharge current distributes to two or more power supply conductors. However, the discharge current can also be guided by only one of the power supply conductors. Also, it is not necessary that the discharge current distributes to a plurality of power supply conductors in a balanced way. Rather, a larger portion of the discharge current can be coupled to one of the power supply conductors when compared to the other power supply conductors.

However, it can be seen from FIG. 4a that the discharge current (or a portion thereof) may couple from the device under test 440 to the power supply connection 330. The portion of the discharge current coupling to the power supply connection 330 may be guided by the power supply connection 330 to the power supply (for example to a power supply arranged in the supply rack 310) as a common mode current.

It should be noted here that under some circumstances, a dominant portion of the electrostatic discharge event is routed by the power supply conductors, while only a small portion of the discharge current (or even a negligible portion thereof) flows via the protective earth conductor. Thus, some electrostatic discharge events can be detected even without monitoring the current flowing via the protective earth conductor. However, monitoring the protective earth conductor 454 and the power supply conductors 450, 452 does not have a detrimental effect in many embodiments.

In the following, an electrostatic discharge event directing a discharge current to the housing will be described with reference to FIG. 4b. The arrangement shown in FIG. 4b is designated in its entirety with 480 and is very similar to the arrangement shown in FIG. 4a. Consequently, identical reference numerals designate identical signals or means.

Figure 4B:
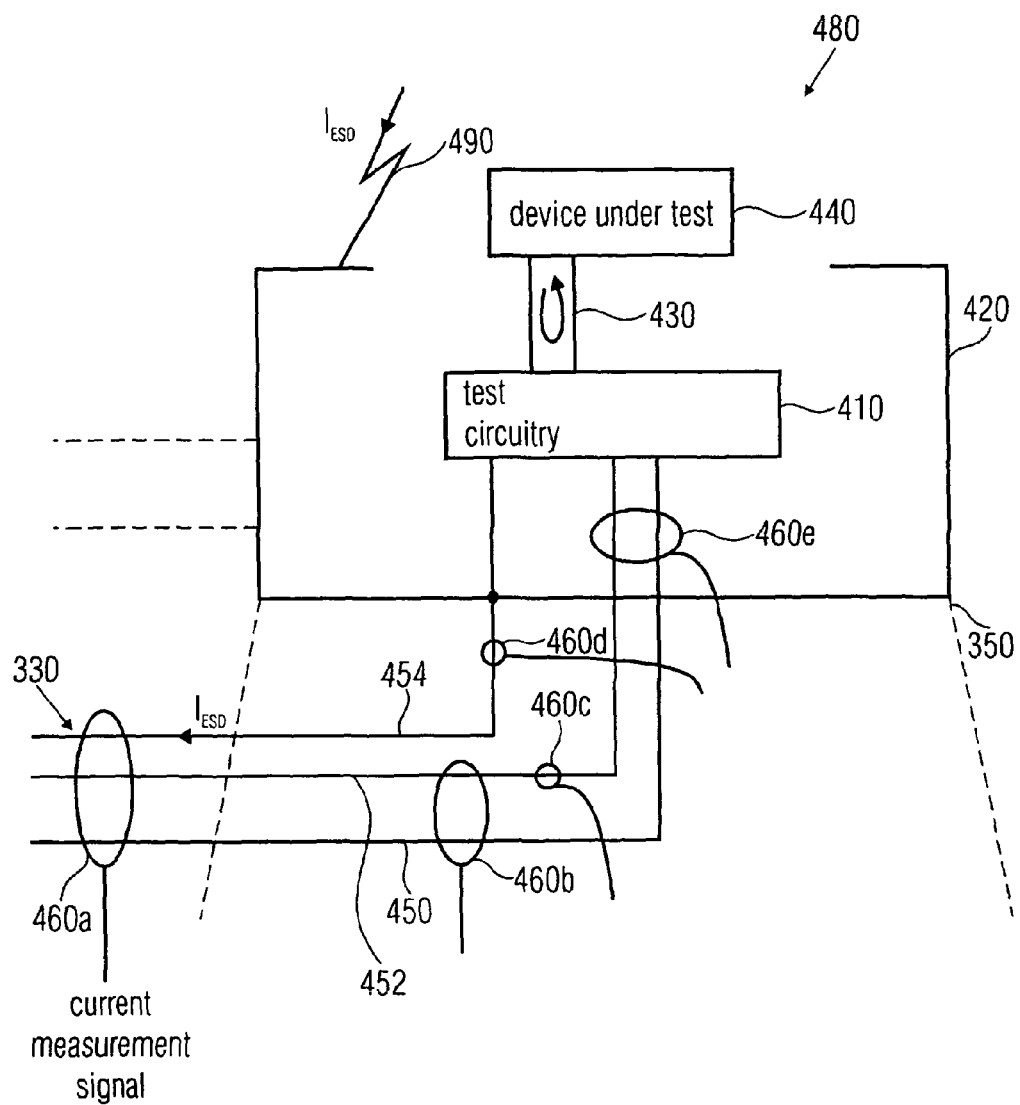
FIG. 4b shows a schematic representation of another possible current path of a discharge current in a device test system.

FIG. 4b shows an electrostatic discharge event indicated by an arrow 490. An electrostatic discharge event 490 may induce a current to the housing 420. However, a magnetic field caused by the discharge current $I_{ESD}$ may induce a voltage in any possible closed loop. Such an induced voltage, caused by a rapid change of a magnetic field generated by the discharge current, may damage the device under test 440, or even the test circuitry 410. Thus, even though the discharge does not directly affect the test circuitry 410, the electrostatic discharge event may be very detrimental. However, as can be seen from FIG. 4b, the discharge current (or at least a portion thereof) may be routed to a protective earth via a protective earth conductor 454. Thus, detecting a current flowing via the protective earth conductor 454 allows for a detection of the electrostatic discharge event, even though the electrostatic discharge event does not directly affect the test circuitry 410.

Naturally, the protective earth conductor 454 may be routed together with the power supply conductors 450, 452, or may be routed to the protective earth conductor separately, as shown in FIG. 3b.

Figure 5:
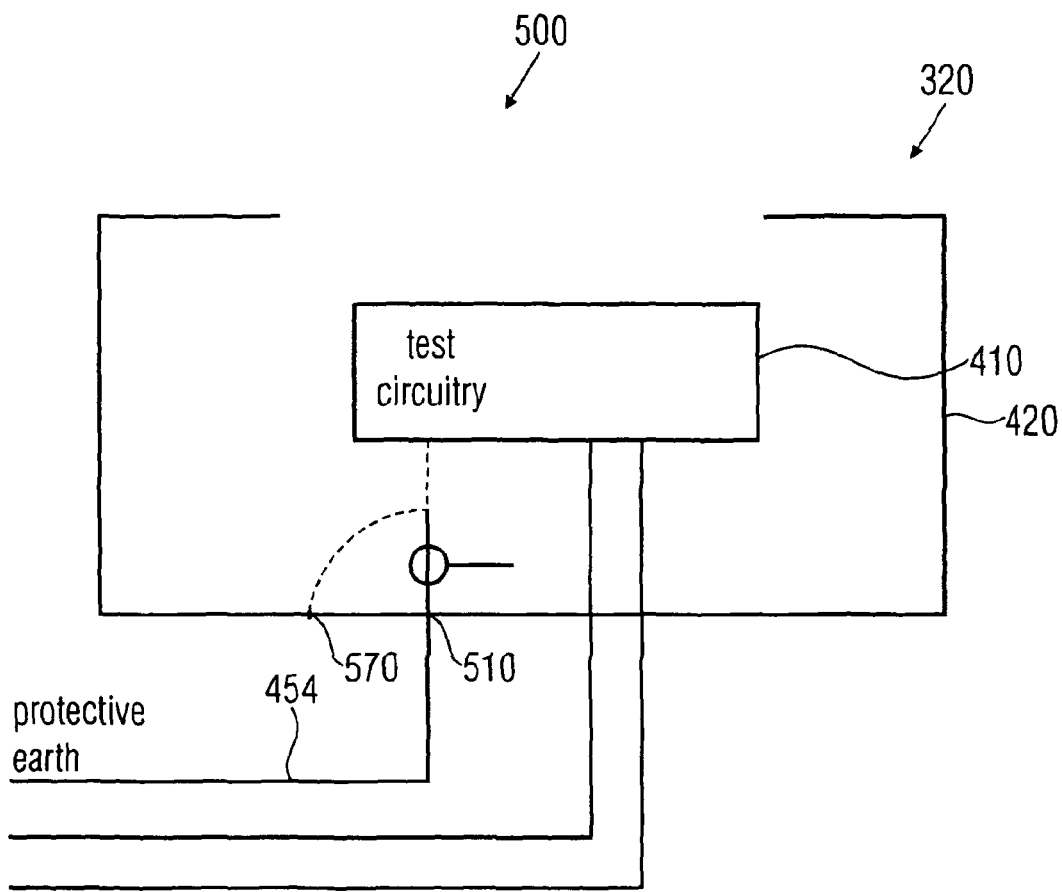
FIG. 5 shows a schematic representation of an arrangement of a current measurement device in a test head of a device test system.

Taking reference to FIG. 5, a possible arrangement of the current measurement device will be described. FIG. 5 shows a graphical representation of a test head of a device test system. The graphical representation of FIG. 5 is designated in its entirety with 500. The graphical representation 500 shows a test head 320, wherein a test circuitry 410 is arranged within a housing 420. A protective earth conductor 454 is connected to the test head 320. The protective earth conductor 454 may for example enter the inside of the housing 420 via an opening 510 of the housing 420. The protective earth conductor 454 may for example be attached to a protective earth connection of the test circuitry 410 within the housing 420. Alternatively or in addition, the protective earth conductor 454 may be attached to a shielding of the test circuitry 410, or to a ground conductor of the test circuitry 410. In this case, the current measurement device, for example a current clamp, may be arranged to measure a current flowing via the protective earth conductor 454 between the opening 510 and the test circuitry 410. In other words, the current measurement device or current clamp may be arranged within the housing 420 of the test head 320.

In another embodiment, the protective earth conductor 454 may be routed from the outside of the housing 420 to the inside of the housing 420 through the opening 510. The protective earth conductor 454 may then be connected to the housing 420 from the inside of the housing 420. The current measurement device or current clamp may then be arranged to measure a current flowing via the protective earth conductor 454 between the opening 510 and a location 520, at which the protective earth conductor 454 is attached to the inside of the housing 420. Thus, the current measurement device or current clamp can be arranged in a shielded place, for example within the housing 420 of the test head 320.

Figure 8:
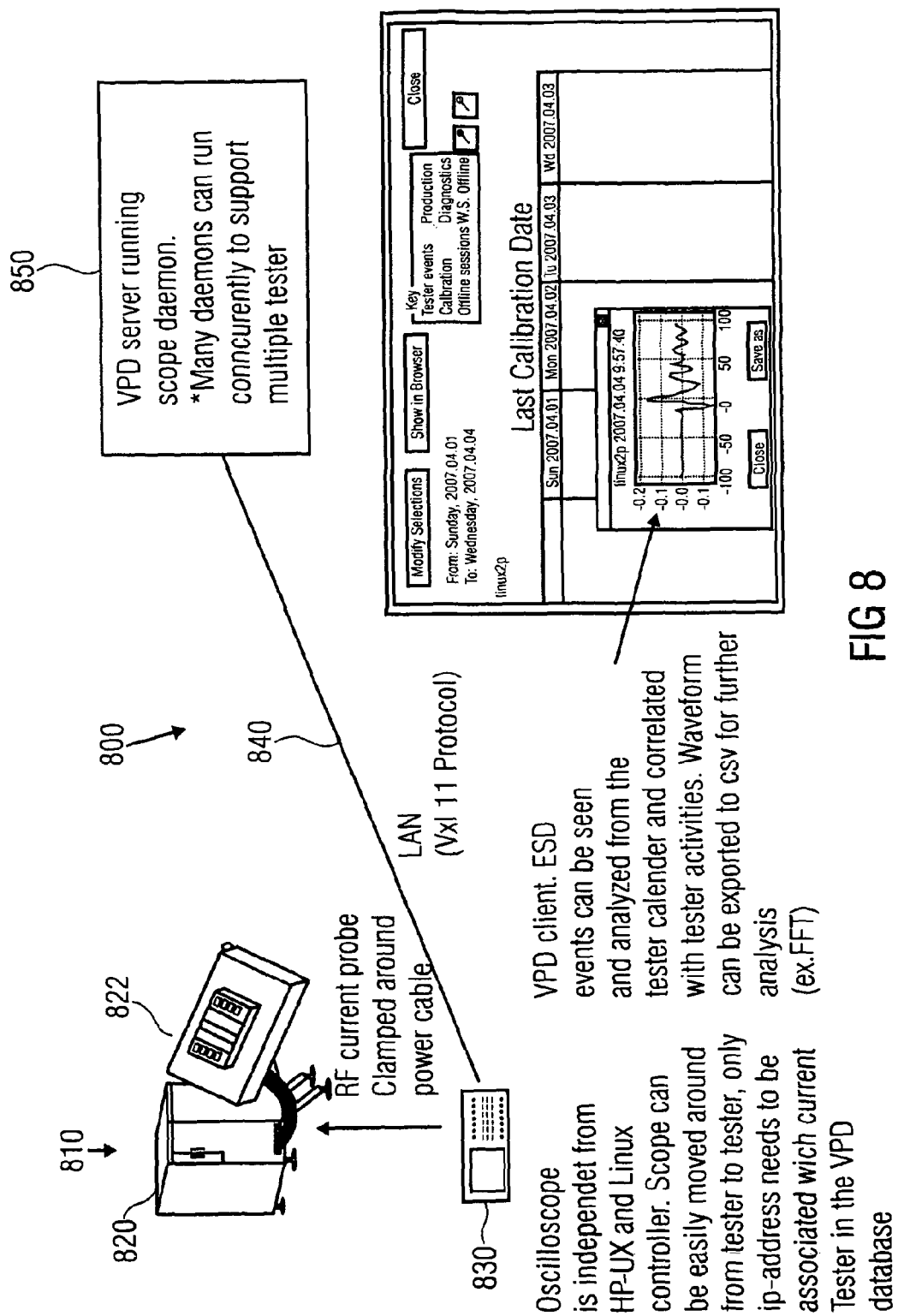
FIG. 8 shows a graphical representation of an architecture of an electrostatic discharge monitor, according to an embodiment according to the invention.

In the following, some further aspects of some embodiments according to the invention will be described. Taking reference to FIG. 8, an architecture of a current ESD monitor prototype will be described. In other words, FIG. 8 shows a schematic representation of an ESD monitor system, according to an embodiment according to the invention. The system shown in FIG. 8 is designated in its entirety with 800. The system 800 comprises a device test system 810 (for example a dut tester or device tester or chip tester). The device test system (dut tester or chip tester) 810 comprises a supply rack 820 (for example as described above) in a test head 822 (for example as described above). A power supply connection, for example a power cable, connects the test head 822 with the supply rack 820, as described above. Moreover, a high frequency (HF) current probe is clamped around the power cable. The ESD monitor system 800 comprises an oscilloscope 830, which is configured to receive at one of its inputs a current measurement signal from the HF current probe.

It should be noted that different alternative devices can be used instead of the oscilloscope 830. For example, a transient recorder can be used instead of the oscilloscope 830. In another embodiment, a data acquisition unit (also briefly designated as "DAQ") can be used instead of an oscilloscope. A data acquisition unit (DAQ) may for example comprise an analogue/digital converter (ADC). The oscilloscope or the alternatives may be used to record, store and digitize the discharge current wave form.

In some embodiments, data acquisition units which are connectable to a personal computer, for example via the USB interface, can be used instead of an oscilloscope 830. In some embodiments, a data acquisition card can be installed within a personal computer, and may be used to replace the oscilloscope.

To summarize the above, different types of data acquisition solutions can be used in order to acquire, for example to record, store and digitize, the discharge current wave form. In an embodiment, the oscilloscope is independent from a system controller or a system computer. For example, the oscilloscope may be independent from a HP-UX and Linux controller. In some embodiments, the oscilloscope (also designated as "scope") 830 may be portable. Accordingly, the oscilloscope can be easily moved around from tester to tester in some embodiments. In some embodiments, an internet protocol address ("ip_address") is associated with a current tester (i.e. with a tester to which the oscilloscope is coupled, for example via the HF current probe) in a control software database (for example a so-called "Verigy Production Dashboard" database or "VPD" database). The oscilloscope 830 may for example be connected with a system controller or system computer (for example a HP-UX system controller or Linux system controller) via a local area network (LAN) 840. The local area network 840 (or at least a connection between the oscilloscope 830 and the system controller) may for example be operated using a so-called "VXI 11 protocol", which is known to a man skilled in the art.

In the following, details regarding a software which may be running on the system controller, to which the oscilloscope 830 is connected, will be described.

In some embodiments, a software may run on the system controller, which is configured to retrieve data from the oscilloscope 830 if the oscilloscope detects an actual or potential ESD event. For example, the oscilloscope 830 may have a trigger means, which is set to a predetermined (or adjustable) trigger level. If the current measurement signal obtained from the current measurement device (for example from the current clamp) exceeds the trigger level, the oscilloscope may be triggered and may capture the waveform of the current measurement signal. The oscilloscope may for example be a digital storage oscilloscope such that the oscilloscope 830 can acquire a digital representation of the waveform of the current measurement signal in response to a trigger event. In some embodiments, the oscilloscope 830 may be configured to capture a portion of the waveform of the current measurement signal which lies before the trigger event (i.e. the reaching of the trigger threshold level). This functionality, which is sometimes also designated as "pretrigger", is implemented in some state-of-the-art sampling oscilloscopes and is well known to the man skilled in the art. The oscilloscope 830 may inform or notify a software running on the system controller of the occurrence of a trigger event. For example, the system controller may query the oscilloscope regularly (for example via the local area network) whether a trigger event has occurred. However, the oscilloscope may alternatively in some embodiments notify the software running on the system server that a trigger event has occurred without being queried. For example, the oscilloscope may send a service request message to the software running on the system server, for example in response to a trigger event. The software running on the system server may comprise a subroutine, a thread, a daemon or any other software unit capable of communicating with the oscilloscope 830. In some embodiments, the software running on the system controller may comprise a so-called "scope daemon", for example a utility function acting in the background (for example in a multi-tasking operation system). In some embodiments, the system controller may comprise a so-called "Verigy Production Dashboard server" (also designated as "VPD server") running a scope daemon. The so-called "VPD server" is designated with 850 in FIG. 8. It should be noted that in some embodiments, many daemons can run concurrently (or at least approximately concurrently) to support multiple testers or device test systems (or multiple oscilloscopes connected with multiple testers or device test systems). Details regarding the functionality of the VPD server and the scope daemon will be discussed in the following. However, it should already be noted here that the VPD server may be configured to collect and store information regarding the activity and status of the device test system 810. In some embodiments, the VPD server may also be configured to control some or all of the activities of the device test system 810. In some embodiments, a client software (for example designated as "Verigy Production Dashboard client" or "VPD client" may be configured to communicate with the VPD server. The VPD server may for example provide timing information regarding the activity and status of the device test system 810. For example, the VPD server may provide information indicating when (or at which time) ESD events have occurred. On the basis of this information, the VPD server or the VPD client may provide a tester calendar, for example in the form of a chronologically ordered or chronologically formatted list or table of events. For example, the tester calendar may be displayed or otherwise presented to a user (or another software component) by the VPD client.

According to some embodiments, electrostatic discharge events can be seen and analyzed from the tester calendar. According to some embodiments, the ESD events can be correlated with tester activities or test system activities. For example, a correlation can be computed between the occurrence of ESD events and a tester failure or test system failure.

For example, the VPD server, the VPD client or an auxiliary program (which may for example be in communication with the VPD server and/or the VPD client) may be configured to obtain information about failure events of the device test system 810 and about ESD events. If this information indicates that a failure event of the device test system 810 has occurred in temporal proximity (e.g. within a predetermined time interval) to an ESD event, the VPD client, the VPD server or the auxiliary program can indicate or provide a warning that the failure event of the device test system 810 might probably be caused by the ESD event.

Furthermore, the VPD server, the VPD client or the auxiliary program may additionally or alternatively obtain information about the test results. For example, the responsible program (VPD server, VPD client and/or auxiliary program) may obtain information describing a test yield or a failure rate. Moreover, the responsible program may determine whether a significant deterioration of the test yield or of the failure rate occurs in temporal proximity to an ESD event (e.g. within a predetermined time interval). If this is the case, a warning may be generated by the responsible program indicating that either the tester or test system or a lot of the devices under test are likely to be damaged by the ESD event.

However, the responsible program may also, alternatively or additionally, correlate other information with respect to the status of the device test system 810 or with respect to the test results with the information about the ESD events and provide a respective warning if there is strong correlation (e.g. a correlation exceeding a predetermined threshold level) for certain events or status changes with respect to the EDS events.

To summarize, in some embodiments ESD events can be seen and analyzed from the tester calendar (for example displayed by the VPD client) and correlated with tester activities. Waveforms (for example waveforms of the current measurement signal captured by the oscilloscope 830) can be exported, for example in a CSV file format, for further analysis. A further analysis may for example be performed using a Fast Fourier transform (FFT) (confer Chang-Yu Wu et al.: "On the frequency domain specification of ESD waveforms", Journal of Electrostatics, 24 (1990), pages 197-206) or a Discrete Fourier Transform (DFT). It should be noted here that the term "CSV" designates a file format comprising "character separated values", "comma separated values" or "colon separated values", wherein the individual values are separated by a dedicated separation sign.

In the following, some further details of an embodiment according to the invention will be described. In particular, the principle of the solution will be explained.

Figure 9:
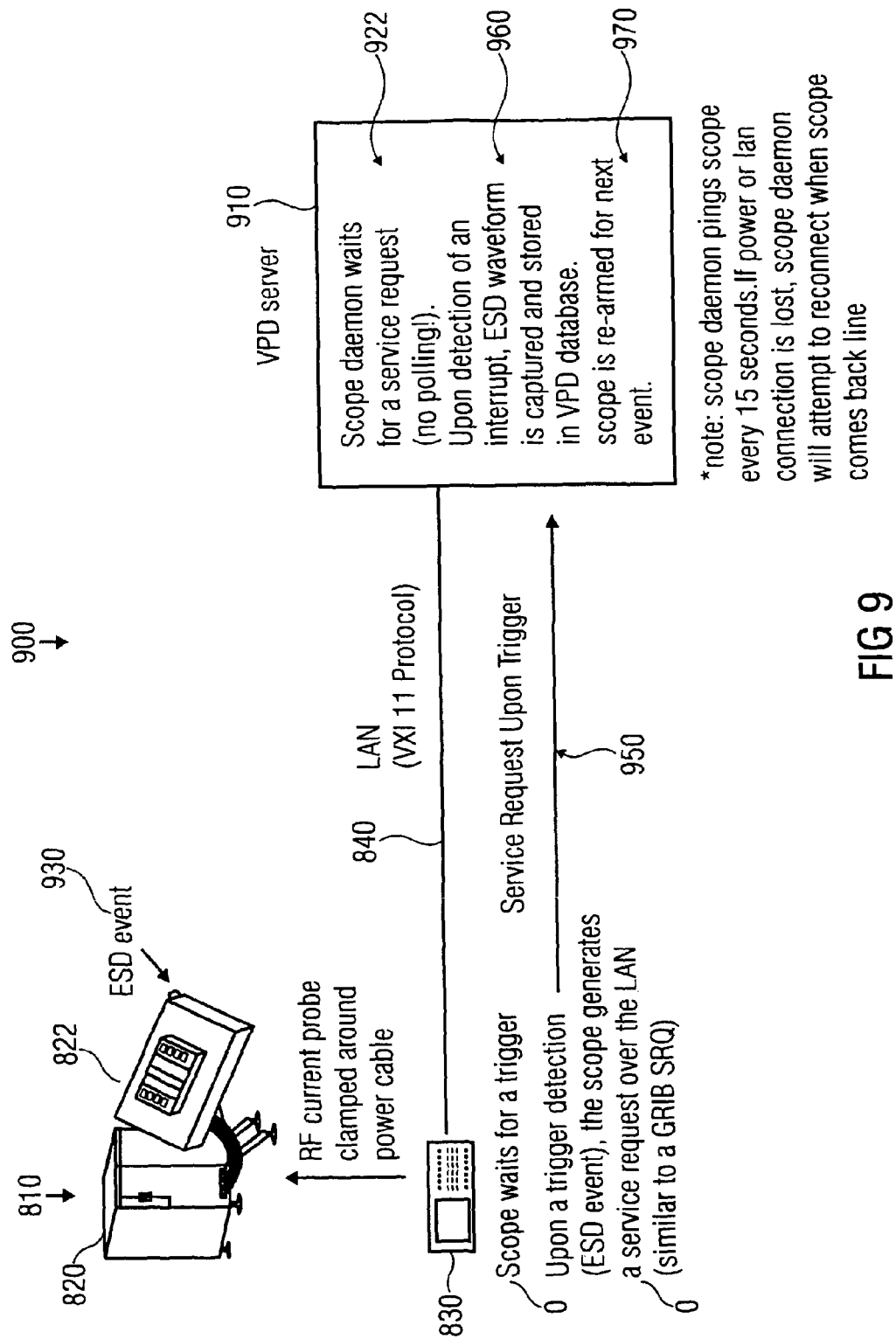
FIG. 9 shows a graphical representation of a device test system, according to an embodiment according to the invention.

FIG. 9 shows a schematic representation of an ESD monitor system, according to an embodiment according to the invention. FIG. 9 illustrates the principle of a solution according to an embodiment according to the invention. The ESD monitor system (which may be part of the device test system) shown in FIG. 9 is designated in its entirety with 900. As the ESD monitor system 900 shown in FIG. 9 is similar to the ESD monitor system 800 shown in FIG. 8, identical reference numerals designate identical means and signals. Similar to the system shown in FIG. 8, the ESD monitor system 900 comprises a VPD server 910, which may be implemented by a software running on a system controller. In an embodiment according to the invention, there is an initial state in which the oscilloscope 830 waits for a trigger (reference numeral 920). In the initial state, a scope daemon (for example running on the VPD server or coupled to the VPD server) waits for a service request (reference numeral 922). In other words, in an embodiment, the scope daemon does not poll the oscilloscope 830, which can avoid unnecessary network traffic on the local area network. As described above, the oscilloscope 830 receives a current measurement signal from a HF current probe clamped around a power cable connecting the supply rack 820 with the test head 822. However, the probe could in some embodiments be connected to the power line as well. At a certain time, an ESD event shown at reference numeral 930 will affect the test head 822 such that, for example, a discharge current is fed to the test head 822. The discharge current applied to the test head 822 by the ESD event 930 results in a current pulse on the power cable, which is translated by the current probe clamped around the power cable into a pulse of the current measurement signal. Accordingly, the current measurement signal received by the oscilloscope 830 comprises a pulse. If this pulse exceeds a trigger level, the oscilloscope 830 generates a trigger event. Upon a trigger detection (which may indicate an actual or potential ESD event) the oscilloscope 830 generates a service request over the local area network (LAN), as shown at reference numeral 940. The service request generated by the oscilloscope 830 may for example be similar to a service request SRQ known from the general purpose interface bus (GPIB) system. Thus, a service request is transmitted from the oscilloscope 830 to the VPD server 910 upon a trigger, as indicated at reference numerals 950. The VPD server, or the associated scope daemon, receives the service request transmitted at reference numeral 950, and may create a so-called "interrupt" indicating the reception of the service request. Upon detection of an interrupt, the VPD server or the associated scope daemon may capture the ESD waveform. For example, the scope daemon or the VPD server may effect a download of the waveform captured by the oscilloscope (for example in response to the detection of a trigger) to the system server (or to the VPD server or to the scope daemon). Optionally, the scope daemon or the VPD server may store the captured waveform (e.g. the waveform captured by the oscilloscope 830 and downloaded to the VPD server or to the scope daemon) in a database, for example in a VPD database. The capturing and storing of the waveform is shown at reference numeral 960. Moreover, in a step 970, the oscilloscope 830 is re-armed for a next event. For example, the VPD server or the scope daemon sends signals to the oscilloscope 830 indicating that the oscilloscope should capture a waveform in response to the next trigger event. The re-arming of the oscilloscope may be performed at an appropriate instance in time, depending on the capabilities of the oscilloscope. Moreover, the re-arming of the oscilloscope shown at reference numeral 970 may naturally be considered to be optional, for example if the oscilloscope is configured to capture a waveform in response to every trigger event.

It should be noted here that the VPD server, the scope daemon or an auxiliary program may for example analyze the captured ESD waveform to decide whether the captured ESD waveform represents an actual ESD event or a "false alert" (e.g. a trigger not caused by an ESD event). However, in another embodiment, the VPD server or the scope daemon may regard every occurrence of a trigger event as an indication of an ESD event. In other words, the VPD server or the scope daemon may interpret every captured waveform, captured by the oscilloscope in response to a trigger event as a waveform representing an ESD event. Alternatively, the VPD server or the scope daemon may only consider waveforms fulfilling some criteria (which will be described below) as representing an ESD event.

Accordingly, the shape of the waveform can for example be taken into consideration when determining the presence of ESD events. The shape of the discharge current waveform in time-domain may be used to identify (or distinguish) the source of an ESD event as a "discharge by humans" (HBM), as a "discharge by machines" (MM), as a "discharge by devices" (CDM) or any other known discharge models.

In an embodiment, the scope daemon may be configured to "ping" the oscilloscope 830 in regular or irregular time intervals, for example every 15 seconds. In this case, if the oscilloscope 830 receives a "ping", the oscilloscope provides an answer to the scope daemon indicating that the oscilloscope is powered and that the local area network connection between the oscilloscope and the scope daemon is operational. If the scope daemon detects that the oscilloscope does not reply to a "ping" as expected (or within a predetermined time interval), the scope daemon may recognize that there is a problem with the oscilloscope or the connection between the oscilloscope and the scope daemon. For example, if the power (or power supply) or the local area network connection is lost (or deactivated, or defective), the scope daemon may for example attempt to reconnect (for example with the oscilloscope 830) when the oscilloscope 830 comes back on line.

It should be noted here that the functionality described above, or at least a part thereof, can for example be implemented in a so-called "production dashboard" or "production dashboard" software.

Also, the functionality described with reference to FIG. 8 may for example be implemented, at least in part, in a so-called "production dashboard".

Figure 10:
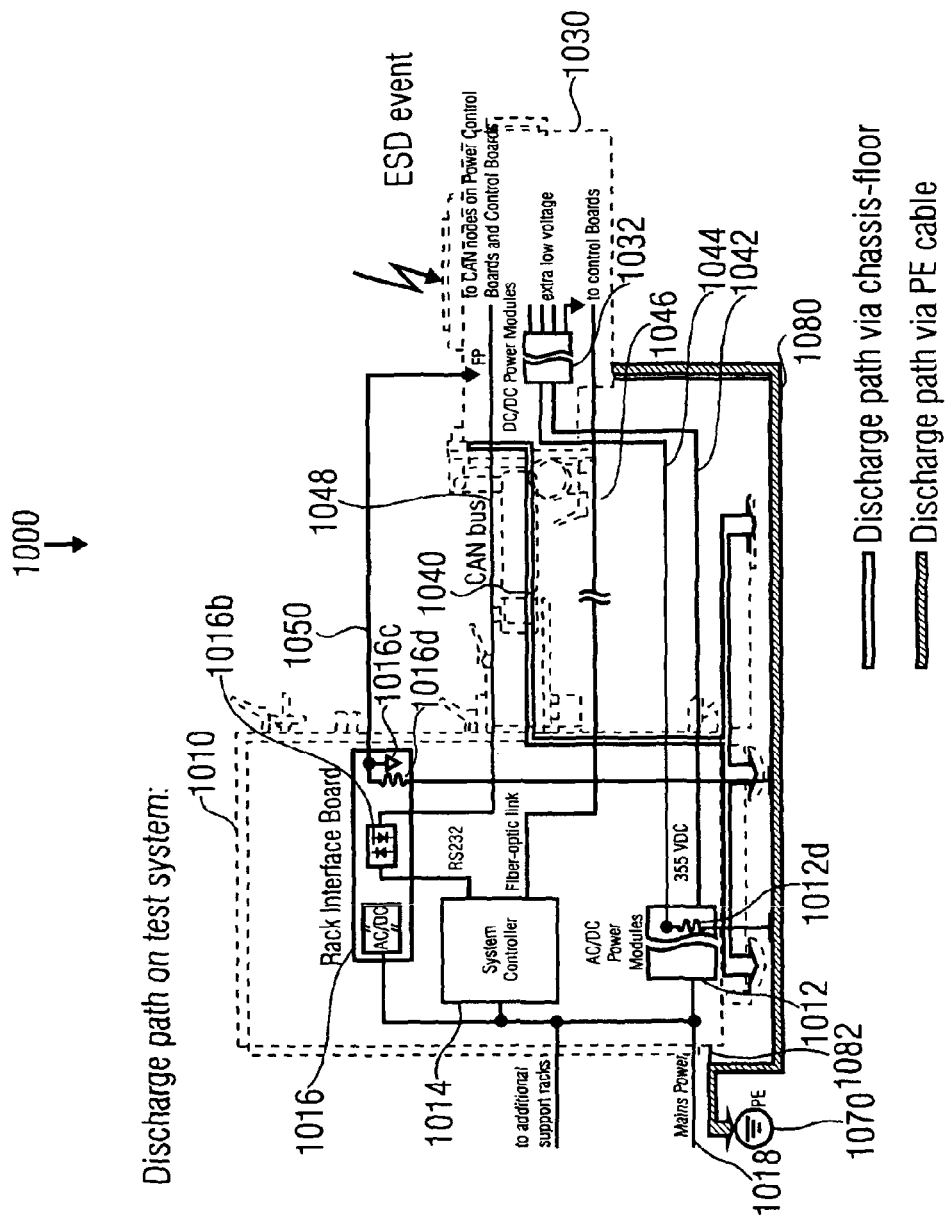
FIG. 10 shows a schematic representation of discharge currents in a device tester or device test system, according to an embodiment according to the invention.

In the following, details regarding a solution taking into consideration a "discharge current" will be described taking reference to FIG. 10. FIG. 10 shows a schematic diagram of an ESD monitor solution.

FIG. 10 shows a schematic representation of a device tester or device test system, according to an embodiment according to the invention. The device test system shown in FIG. 10 is designated in its entirety with 1000. The device test system 1000 comprises, for example, a supply rack 1010 and a test head 1030. The test head is, for example, arranged externally to the supply rack 1010. Moreover, the test head 1030 may for example be connected mechanically with the supply rack via an arm 1040. The supply rack 1010 comprises, for example, one or more alternating current-directional current (AC/DC) power modules 1012, a system controller 1014 and a rack interface board 1016. The supply rack 1010 may for example comprise a mains power cable 1018. In an embodiment, the AC/DC power modules 1012, the system controller 1014 and the rack interface board 1016 may for example all be coupled to the mains power cable 1018. The one or more AC/DC power modules may for example be configured to provide a DC voltage between 24 V and 1000 V as a supply voltage for the test head. In the embodiment shown in FIG. 10, the AC/DC power modules may for example be configured to provide a DC voltage of about 355 V. The DC supply voltage of about 355 V provided by the AC/DC power modules is provided to the test head 1030 via two or more DC supply conductors 1042, 1044. The DC supply voltage conductors 1042, 1044 may for example be part of a so-called power supply connection, as described above.

The system controller 1014 may for example be coupled with one or more control boards in the test head via a fiber optic link 1046. The system controller 1014 may further be coupled with CAN nodes on one or more power control boards and/or one or more control boards in the test head 1030 via a CAN bus 1048. For this purpose, an optical isolator (for example comprising an optocoupler) may be present, for example on the rack interface board 1016. The optical isolator 1016b may for example provide an isolation between a RS232 serial interface provided by the system controller 1014 and the CAN bus 1048 extending between the supply rack 1010 and the test head 1030.

The test head 1030 may for example comprise one or more directional current-directional current power modules (DC/DC power modules). The one or more DC/DC power modules may for example be configured to convert the relatively high voltage provided by the AC/DC power modules 1012 to one or more lower voltages, for example DC voltages. In one embodiment, so-called "extra low voltages" are generated by the DC/DC power modules 1032. In some embodiments, the DC/DC power modules may also provide for a galvanic separation between the voltage provided by the AC/DC power modules 1012 and the output voltages of the DC/DC power modules. The test head also comprises, for example, one or more power control boards, which may for example be configured to adjust a power supply provided to a device-under-test interface of the test head 1030 (for the purpose of powering a device under test). Moreover, the test head 1030 may comprise one or more control boards for interfacing the fiber optic link 1046 with one or more channel modules. The channel modules may be provided to generate test signals to excite the device under test and/or to receive and evaluate signals or response signals from the device under test. Consequently, the channel modules are typically connected to the dut interface of the test head 1030.

In the following, connections between the test head and the protective earth will be described.

A reference potential designated with "FP" is connected with a reference potential 1016c of the rack interface board 1016 via a reference potential connection 1050. Furthermore, the reference potential 1016c of the rack interface board 1016 may for example be connected to a protective earth 1070 via a resistance 1016d of approximately 5 kΩ. Moreover, one of the DC outputs of the one or more AC/DC power modules 1012 connected to one of the DC power supply conductors 1042, 1044 may for example be connected to the protective earth. In an embodiment, a negative output of the AC/DC power modules (for example an output carrying a more negative "−" potential) may be connected to the protective earth 1070 via a resistance. A value of the resistance 1012d may for example be in a range of 100 kΩ/n, wherein n may be a number of AC/DC power modules 1012 circuited in parallel. For example, n may be an integer in a range between 1 and 12.

Moreover, the test head 1030 (for example the housing thereof, or a carrying structure thereof) may be connected with the protective earth 1070 via a low-resistance protective earth connection 1080. The low-resistance protective earth connection 1080 may for example comprise a low-resistance cable, for example a copper cable. A cross-section of said cable forming the low-resistance protective earth connection between the test head 1030 and the protective earth 1070 may for example be larger than or equal to 1.5 mm². However, the cross-sectional area may even be larger. A length of said cable might in some embodiments be smaller than 20 m. In other embodiments, a length of said protective earth cable 1080 may be shorter than 10 m, or even shorter than 5 m.

Moreover, in some embodiments, the supply rack 1010 (or a metallic part thereof) is also connected to the protective earth 1070 via a low-resistance connection or cable 1082.

It should be noted here that a first discharge path extends from the test head 1030 via the protective earth connection or protective earth cable 1080 to the protective earth 1070.

Moreover, it is assumed that the device test system 1000 is arranged on an electrically conductive floor. For example, the supply rack 1010 may stand on test or rollers on the conductive floor.

Accordingly, there may be a second discharge path from the test head 1030 to the protective earth (or at least to a environment potential). The second discharge path may for example extend from the test head 1030 to the supply rack 1010 via the arm 1040. Moreover, the second discharge path may extend via the supply rack 1010 (or electrically conductive structures thereof) and feet or rollers, on which the supply rack 1010 is standing, towards the floor. In other words, the second discharge path is a discharge path via chassis-floor.

For example, the protective earth cable can be used to detect an ESD discharge current. In addition to the protective earth (PE) cable, the entire power cable (for example phases, neutral and PE line) or only phase cables can be used to detect an ESD discharge current.

Figure 11:
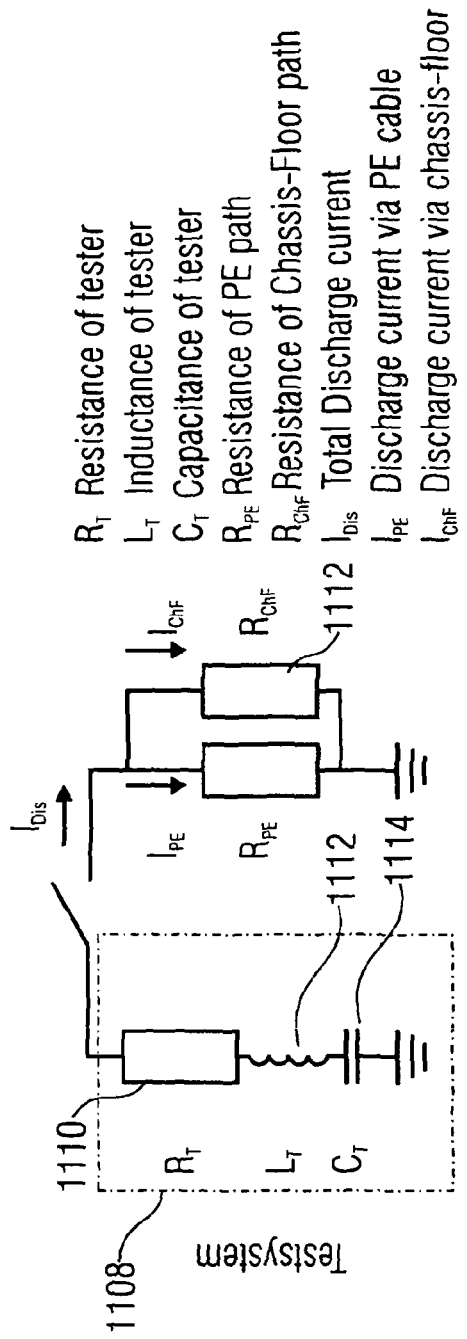
FIG. 11 shows an equivalent circuit diagram of the device test system shown in FIG. 10.

In the following, an equivalent circuit diagram will be described representing the configuration shown in FIG. 10. FIG. 11 shows an equivalent circuit diagram of the arrangement of FIG. 10. In other words, FIG. 11 shows details on a solution using a "discharge current".

In other words, FIG. 11 shows details on an ESD monitor solution. An equivalent circuit of the arrangement shown in FIG. 10 may for example model the test system (or a device tester) and a discharge path. The test system or the device tester (for example comprising the supply rack 1010, the arm 1040 and the test head 1030), or a portion thereof, may for example be modeled by a series resonant circuit comprising a resistor $R_t$ 1110, an inductance $L_t$ 1112 and a capacitance $C_t$ 1114. Moreover, it may be assumed that the series resonant circuit 1108 has been excited by the discharge current. The first discharge path via the protective earth cable can be modeled by a resistance $R_{PE}$ 1120. A second discharge path via chassis-floor can be modeled by a resistance $R_{ChF}$ 1122. The resistance 1120 of the protective earth path and the resistance 1122 of the chassis-floor can be considered to be circuited in parallel. Accordingly, the total discharge current $I_{Dis}$ is split up in two current components, namely a discharge current $I_{PE}$ flowing via the protective earth cable and a discharge current $I_{ChF}$ flowing via chassis-floor. The distribution of the currents can be computed using the Kirchhoff-law and the Ohm-law 1132. Under the assumption that the resistance 1120 of the protective earth path is significantly smaller than the resistance 1122 of the chassis-floor path, it can be concluded, using Ohm-law, that the discharge current via the protective earth cable is significantly larger than the discharge current via chassis-floor. Thus, it can be assumed that the discharge current via the protective earth cable is approximately identical to the total discharge current $I_{Dis}$.

Accordingly, in some embodiments, a good estimation of the total discharge current can be obtained by monitoring a current flowing via the protective earth connection or protective earth cable.

Figure 12:
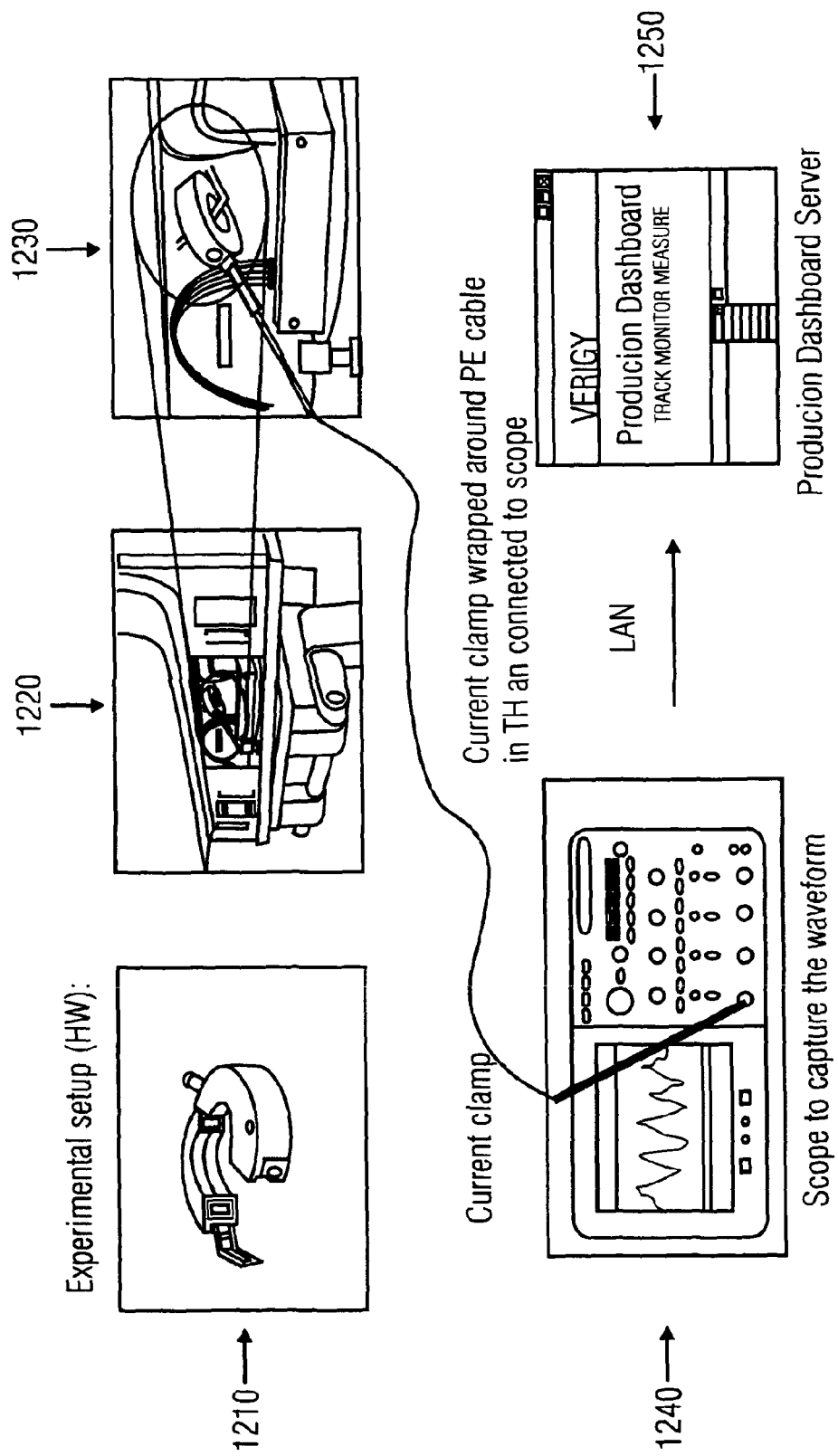
FIG. 12 shows a graphical representation of an experimental hardware setup for a detection of an electrostatic discharge event.

In the following, some further detail on the solution using the "discharge current" will be described. FIG. 12 shows aspects of an experimental hardware setup of an ESD monitor solution. The first graphical representation 1210 shows an exemplary current clamp, which can be mounted around a power supply connection or power supply cable or around a protective earth connection or protective earth cable. The current clamp shown in the graphical representation 1210 can for example be snapped over a cable without interrupting the cable. The current clamp 1220 may for example be configured to be operable in the high-frequency or radio-frequency range. For example, in some embodiment, the current clamp may be configured to detect currents with a frequency of up to 1 MHz, up to 3 MHz, up to 10 MHz or even up to 1000 MHz. In some embodiments, other current clamps may be used.

In an embodiment, the current clamp may have a band width from 10 kHz to 1000 MHz. A relationship between a probe band width (BW) and a minimal rise time ($t_{Rise}$) of an electrostatic discharge event may be given by the following equation:

$$t_{Rise} = 0.3/BW.$$

(confer "Model 93686 Series Current Probes MANUAL", ETS-Lindgren—February 2005 Rev C—PN 399267, page 10)

For example, for a rise time $t_{Rise}=1$ ns, the band width is BW=300 MHz

Thus, it can be concluded that in order to detect electrostatic discharge events with a minimal rise time of approximately 300 ps, a current probe should be used having a band width up to 1000 MHz.

A current probe fulfilling this condition, may for example be designated as a "HF current probe". However, it should be noted that current probes with other band width can also be used, depending on the actual requirements.

Regarding the band width of the current probe (or current measurement device), it should be noted that in an embodiment the probe might have a minimum cut off frequency of at least 10 kHz. Consequently, noise from power line noise can be filtered out.

In some embodiments, the probe may have a maximum cut off frequency of up to 1000 MHz to be able to detect pulses with a rise time of less than 0.3 nanoseconds Accordingly, in some embodiments a so called "high frequency" (HF) current probe may be used.

A second graphical representation 1220 shows the current clamp depicted in the first graphical representation 1210 mounted in a test head of a device test system (e.g. a device tester or chip tester). A third graphical representation 1230 shows a magnified representation of the current clamp mounted in the test head. As can be seen from the third graphical representation, the current clamp depicted in the first graphical representation 1210 is wrapped around a protective earth cable in a test head. Moreover, a measurement signal output of the current clamp is connected to an oscilloscope, which is depicted in a fourth graphical representation 1240. To be more specific, the output of the current clamp is connected to an input channel of the oscilloscope.

The oscilloscope shown in the fourth graphical representation is connected, for example via a local area network (or via a general purpose interface bus, or via any other instrumentation bus or interface) with a software. As an example, a so-called "Verigy Production Dashboard" software is shown in a fifth graphical representation 1250. The Verigy Production Dashboard may for example comprise a production dashboard server, as described above.

Regarding the setup shown in FIG. 12, it should be noted that the current clamp can also (alternatively or in addition) be wrapped around an entire main power cable (made up of phase wires, neutral wire and PA wire) or parts of the main power cable, such as phase wires only.

It should also be noted here that instead of a scope or oscilloscope, other means to capture the discharge current over time can be used (alternatively or in addition).

Figure 13:
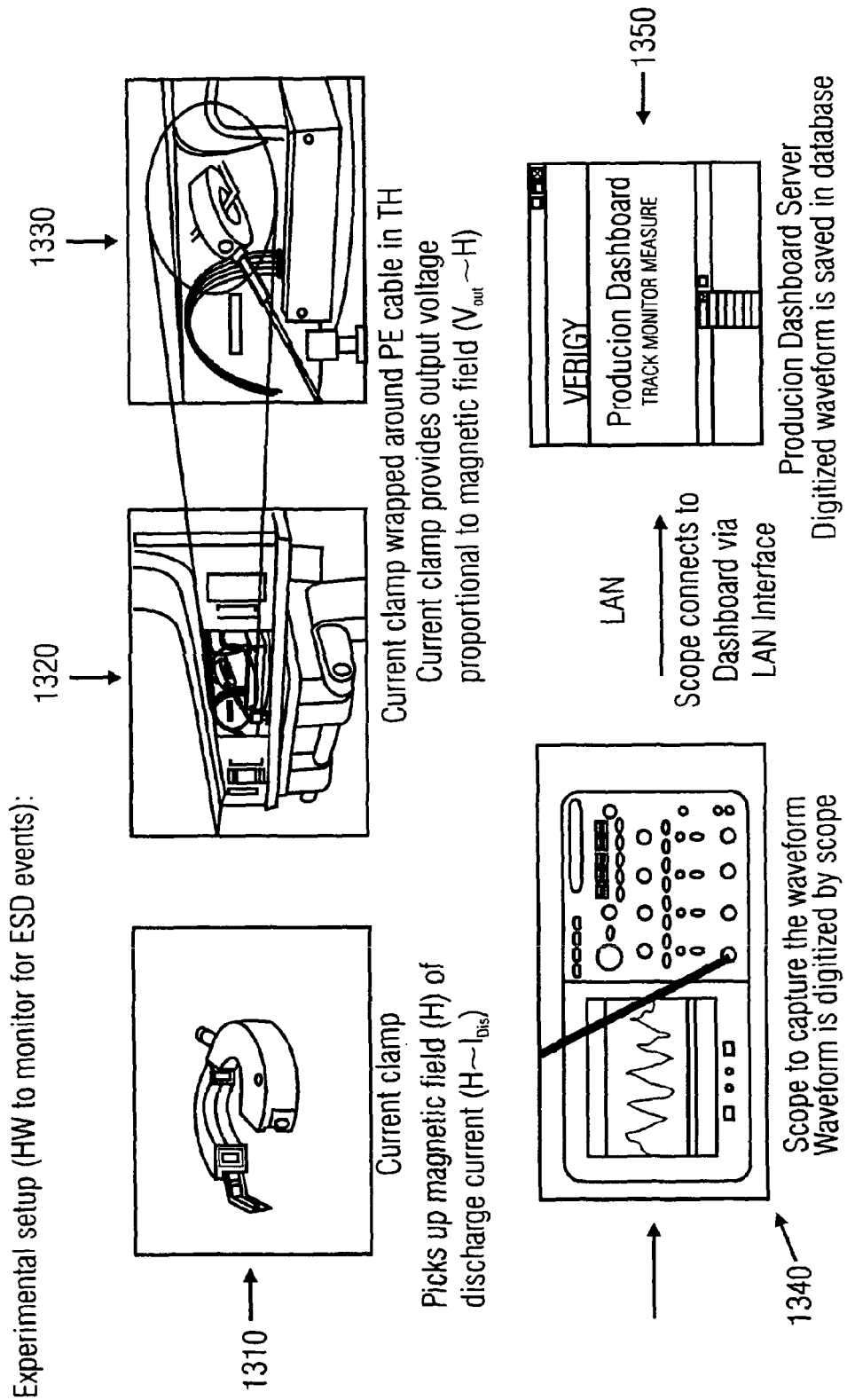
FIG. 13 shows a graphical representation of an experimental hardware setup for a detection of electrostatic discharge events.

In the following, further details of the solution using the "discharge current" will be described. FIG. 13 shows a graphical representation of an experimental setup, for example of a hardware monitor for electrostatic discharge events.

It should be noted here that the graphical representation shown in FIG. 13 is very similar to the graphical representation shown in FIG. 12. Thus, reference is also made to the description of FIG. 12.

A first graphical representation 1310 shows a current clamp.

In an embodiment, the current probe may act as a HF current transformer. When the probe is clamped over the conductor or cable guiding the discharge current, the conductor or cable forms a primary winding of the current transformer. The primary winding of this current transformer may for example have one turn.

The discharge current ($I_{Dis}$) causes a change of the magnetic flux $\phi$ in the primary winding which induces a voltage ($V_{OUT}$) into the secondary winding of the current transformer (Faraday's Law of Electromagnetic Induction).

In some embodiments, the following relationships may hold:

$$I_{Dis} \sim \dot{\phi} \tag{1}$$

$$V_{OUT} \sim \dot{\phi} \tag{2}$$

Herein, $V_{OUT}$ may designate the output voltage of current probe, $I_{Dis}$ may designate the discharge current, and $\dot{\phi}$ may designate a change of the magnetic flux or a temporal derivative of the magnetic flux $\phi$.

A second and a third graphical representation 1320, 1330 show a current clamp wrapped around a protective earth cable in a test head (for example of a device tester or chip tester).

If the output of the current clamp (which may for example be wrapped around the protective earth cable) is connected to a channel input of an oscilloscope, a waveform of the output voltage provided by the current clamp may be digitized by the scope or oscilloscope, as shown in a fourth graphical representation 1340.

In an embodiment, the scope or oscilloscope connects to a so-called "dashboard" or to a "dashboard software" by a local area network (LAN) interface. A screenshot of a dashboard software titled "Verigy Production Dashboard" is shown in a fifth graphical representation 1350. The dashboard or dashboard software may for example comprise a so-called "production dashboard server", as described above. The digitized waveform (which is for example digitized by the scope or oscilloscope) may for example be received by the production dashboard server or production dashboard server software. The digitized waveform may in some embodiments be saved in a database. In other embodiments, the digitized waveform may be further analyzed to decide whether the digitized waveform represents an ESD event or not. Depending on the result of the analysis, a further processing of the digitized waveform may be controlled in some embodiments. In some embodiments, the digitized waveform may only be saved in a database if an analysis of the digitized waveform indicates that the digitized waveform actually represents an ESD event. In other embodiments, the digitized waveform may be saved in a database.

To summarize the above, some details of an experimental setup of an ESD monitor solution have been described with reference to FIG. 13.

Figure 14:
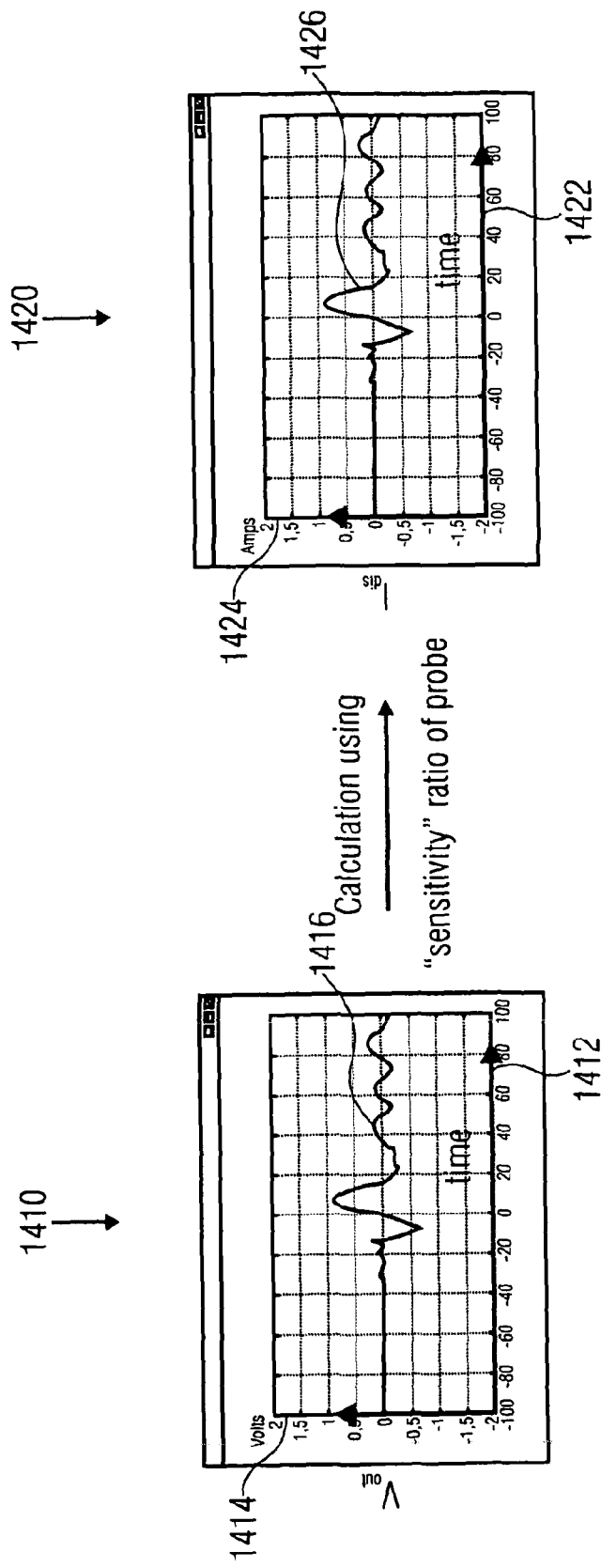
FIG. 14 shows a graphical representation of a concept for deriving a discharge current using a current clamp.

In the following, further details regarding a solution using the "discharge current" will be described. In other words, a possible ESD monitor solution will be described. For this purpose, FIG. 14 shows a graphical representation illustrating a calculation of the discharge current $I_{Dis}$. In particular, it will be described, which information can be captured with some embodiments of the solution described herein. According to a principle implemented in some of the embodiments disclosed herein, a current probe may act as a HF current transformer. The discharge current ($I_{Dis}$) causes a change of the magnetic flux $\dot{\phi}$ in a primary winding which induces a voltage ($V_{OUT}$) into a secondary winding of the current transformer (induction law).

In some embodiments, the following relationships may hold:

Faraday's Law of Electromagnetic Induction:

$$I_{Dis} \sim \dot{\phi} \tag{1}$$

$$V_{OUT} \sim \dot{\phi} \tag{2}$$

Consequently, the following relationship may hold (at least approximately, for example at least for the magnitudes of $V_{out}$ and $I_{Dis}$, and/or at least for a predetermined frequency range):

$$V_{OUT} \sim I_{Dis}$$

The transfer impedance $Z_T$ of the current probe may be defined as follows:

$$\frac{V_{out}}{I_{Dis}} = Z_T \quad (3)$$

(confer "Model 93686 Series Current Probes MANUAL", ETS-Lindgren—February 2005 Rev C—PN 399267, page 4)

In a logarithmic form, or in dB, the following relationship may hold:

$$I_{Dis}(dB\mu A) = V_{OUT}(dB\mu V) - Z_T(dB)$$

(confer "Model 93686 Series Current Probes MANUAL", ETS-Lindgren—February 2005 Rev C—PN 399267, page 4)

Herein, $V_{OUT}$ may represent the output voltage of current probe, $I_{Dis}$ may represent the discharge current, and $Z_T$ may represent the transfer impedance of the current probe. The transfer impedance $Z_T$ of the probe across the probe bandwidth is shown in the particular probe datasheet.

The scope or oscilloscope in some embodiments captures and digitizes the current clamp output voltage over time. In other words, in some embodiments, the oscilloscope captures the current clamp output voltage $V_{out}$ in the time-domain.

By using a "sensitivity" ratio of the probe=$Z_T$ (or of the current clamp), the discharge current can be calculated. For example, the so-called "sensitivity of probe"=$Z_T$ defined in the above equation (3) can be used to calculate the discharge current $I_{Dis}$ on the basis of the output voltage $V_{out}$ of the current clamp (or another current probe).

For example, a graphical representation 1410 shows a temporal evolution of the output voltage of the current clamp. An abscissa 1412 describes the time, and an ordinate 1414 describes the output voltage $V_{Out}$ in volts. A curve 1416 defines the temporal evolution of the output voltage. A graphical representation 1420 describes the discharge current $I_{Dis}$. An abscissa 1422 describes the time, and an ordinate 1424 describes the discharge current. A curve 1426 describes a temporal evolution of the discharge current. It should be noted that the representation of the discharge current shown in the graphical representation 1420 can be obtained from the representation of the output voltage shown in the graphical representation 1410 by a calculation using the "sensitivity" ratio of the probe. In other words, the representation of the discharge current over time is obtained from the representation of the output voltage over time by rescaling the ordinate making use of the sensitivity ratio of the probe or current clamp.

In the following, further details of the electrostatic discharge (ESD) monitor solution making use of the "discharge current" will be described.

In some embodiments according to the invention, one or more pieces of information can be derived from the measurement of the discharge current (or the captured waveform thereof). Regarding the information captured with the solution according to an embodiment, it should be noted that once the discharge current over time is known some very important information on the ESD event can be extracted:
1. Discrimination between ESD and non-ESD event; and/or
2. Amount of charge released by ESD event; and/or
3. Amount of power as well as energy released by ESD event.

In the following, details on the information extracted from the discharge current over time will be described.

Regarding a discrimination between ESD and non-ESD events, the effect of such a discrimination is that the solution can focus on ESD events only and may ignore non-ESD events. In some embodiments, an analysis of the waveform (for example of the captured waveform of the discharge current) can be used for a discrimination between ESD and non-ESD events. For example, an analysis using a fast Fourier transform (FFT) or a Discrete Fourier Transform (DFT) may be used for this purpose.

In the following, further details will be described how an electrostatic discharge event can be discriminated from a non-electrostatic discharge event. Also, it will be discussed how the source of the electrostatic discharge can be identified. In an embodiment according to the invention, an optical surveillance of a test cell (e.g. using a camera) may allow to identify the source of an electrostatic discharge event (confer Stephan Frei: "Elektrostatische Entladungen (ESD) and ihre Störwirkung auf elektronische Systeme", Shaker-Verlag, Aachen, 1999, Page 44). A test cell may for example comprise a region where the test system is located. In dependence on the actual environment, a test cell may be defined as a certain area surrounding the test system or the test head.

In order to identify the source of an electrostatic discharge, the following setup may be used:

The camera may be placed in a position (for example on the "supply rack") to overlook the entire test cell.

Once a discharge current wave form is captured, the camera may be triggered (for example by a service request) to take a picture of the test cell. In another embodiment, the camera may provide a continuous stream of pictures, which may be discarded unless a discharge wave form is captured. Thus, an image representing the test cell at the time of the electrostatic discharge event (or at least in temporal proximity to the discharge event) may be obtained.

Data analysis of the discharge current wave form

Case 1: Discharge is classified as an electrostatic discharge event: The picture taken of the test cell during the discharge (or, for example, shortly before or after the discharge) will help to identify the source of electrostatic discharge with high certainty. For example, the picture taken of the test cell may help to determine whether the discharge event was caused (with a high probability) by an operator, a handler, a prober, a the DUT board or some other impact.

Case 2: Discharge is classified as non-ESD event. The picture is deleted or discarded.

To summarize the above, in response to a detection of an actual or potential electrostatic discharge event using the current measurement signal, a picture of the test cell (or a picture of a means of the test system which is most endangered by the electrostatic discharge) may be captured. The captured image may be captured in such a way that the captured image shows the test cell (or the most endangered component of the test system) in temporal proximity with the electrostatic discharge event, for example shortly before the electrostatic discharge event, during the electrostatic discharge event or shortly after the electrostatic discharge event. The captured image (captured in response to the detection of an electrostatic discharge event) may be put into a data base for a subsequent analysis, for example by an operator of the test system.

Regarding the charge released by the ESD event, it should be noted that information about the charge released by the ESD event may be used to identify a source of an ESD event. In some embodiments, an integration of discharge current over time is used as a method to obtain the information about the charge released by the ESD event.

Regarding the power as well as the energy released by the ESD event, it should be noted that energy is the ultimate information to characterize a damage potential of an ESD event. In some embodiments, an integration of power transferred over time may be used as a method to obtain information about the energy released by an ESD event.

In the following, it will be described how a discrimination between ESD and non-ESD events can be performed on the basis of the information captured with the ESD monitor solution using the discharge current.

Figure 15:
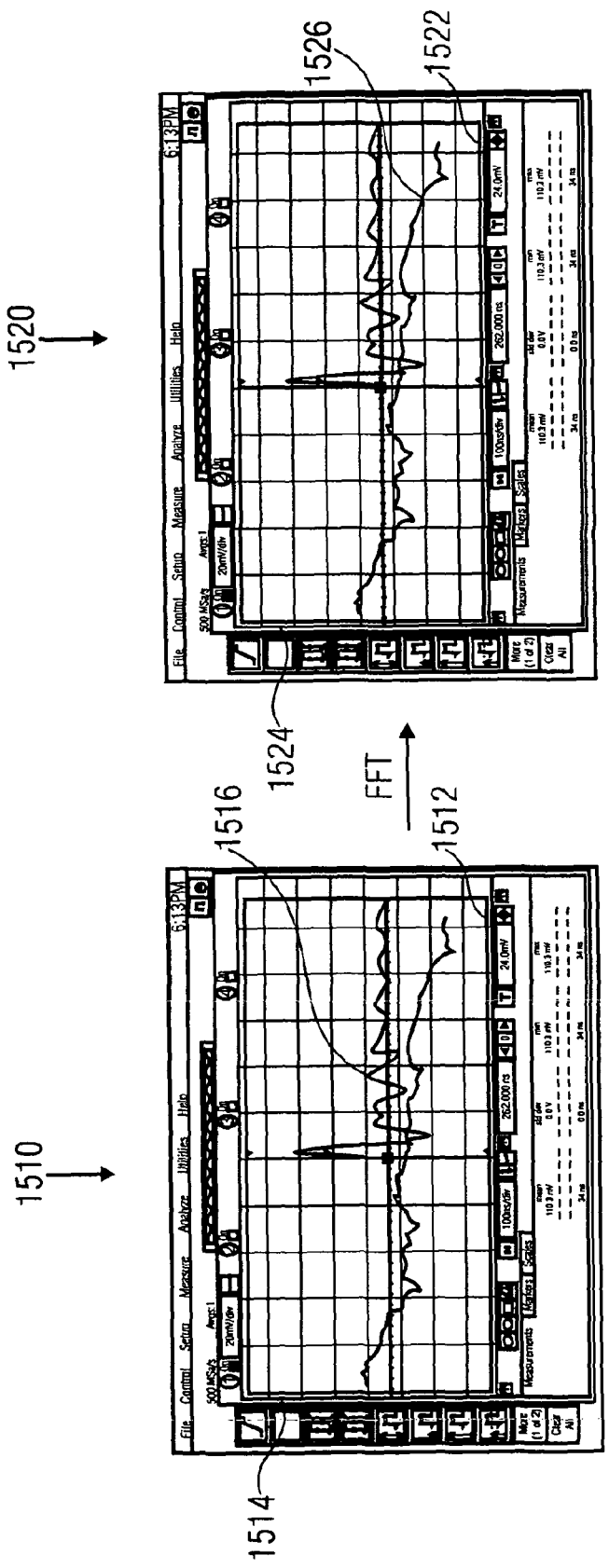
FIG. 15 shows a graphical representation of a concept for discriminating between electrostatic discharge events and non-electrostatic discharge events, according to an embodiment according to the invention.

In some embodiments according to the invention, a fast Fourier transform of a waveform (for example a time-domain waveform of the discharge current captured by the oscilloscope) or a Discrete Fourier Transform (or any other appropriate transform) can be run to transfer from time domain into frequency domain. For example, FIG. 15 shows a graphical representation of a waveform in a time domain and a frequency domain. A first graphical representation 1510 describes a discharge current captured by an oscilloscope in a time domain. An abscissa 1512 describes the time, and an ordinate 1514 describes, for example, a voltage level of the time measurement signal, which may for example be proportional to the current or current component to be measured, and which may for example reflect the ESD discharge current. A curve 1516 describes the current measurement signal (or, at least approximately, the ESD current) in the time domain.

A graphical representation 1520 describes the current measurement signal in the frequency domain. An abscissa 1522 describes a frequency, and an ordinate 1524 describes, for example, a power spectral density. A curve 1526 describes, for example, the power spectral density of the current measurement signal (or, at least approximately, of the ESD discharge current). The frequency-dependent power spectral density of the ESD discharge current can for example be obtained by applying a time domain-frequency domain transformation, like a fast Fourier transform or a Discrete Fourier Transform, to the time domain representation of the current measurement signal (or the ESD current). On the basis of the frequency domain representation of the current measurement signal (or the ESD current), it can be decided of whether a part of the current measurement signal represents an ESD event or not. For example, a template can be applied to the frequency domain representation of the current measurement signal, and it can be checked whether the frequency domain representation of the current measurement signal lies within limits (for example within frequency-dependent limits) defined by the template. If the frequency domain representation of the current measurement signal lies within the limits defined in the template, it can be decided that the current measurement signal represents an ESD event. Otherwise, it can be decided that the current measurement signal represents a non-ESD event. Alternatively or in addition, it can be checked whether a ratio between power spectral densities at a plurality of predefined frequencies lies within a predetermined range. If the ratio between two power spectral densities (or similar quantities characterizing the frequency spectrum) lies within the predetermined range, it can be concluded that the current measurement signal represents an ESD event. Otherwise, it can be concluded that the current measurement signal represents a non-ESD event.

In some embodiments, the frequency domain analysis of the captured current measurement signal can be performed in the oscilloscope. In other embodiments, the analysis can be performed in the system controller, for example by the production dashboard software or by the oscilloscope daemon.

Also, a further processing of the captured waveform can be controlled in dependence on said analysis of the captured current measurement waveform. For example, the captured current measurement waveform may be discarded in some embodiments if it is found that the captured current measurement signal represents a non-ESD event.

To summarize the above, the curve 1516 describes the waveform of the current measurement signal (or, at least approximately, of the discharge current) in the time domain. The curve 1526 describes the waveform of the current measurement signal (or, at least approximately, of the discharge current) in the frequency domain. Some embodiments are based on the idea that in the frequency domain, a waveform from an ESD event looks different than a waveform from a non-ESD event. Thus, a waveform in the frequency domain may in some embodiments be useful for differentiation between ESD and non-ESD events.

In the following, it will be described how a charge released by an ESD event can be determined as an information captured with the ESD monitor solution using the discharge current.

In some embodiments, a charge ($Q_{Dis}$) released by an ESD event can be calculated, for example using an integration of a discharge current ($I_{Dis}$) over time. In some embodiments, the following equation my be evaluated:

$$Q_{Dis} = \int_0^\tau I_{Dis}(t)\,dt$$

(confer Lutz Mueller, "Untersuchungen and Modellierung elektrostatischer Entladungen (ESD) von elektrisch isolierenden Oberflächen", Stuttgart, Universität, Dissertation, 2004, Page 25)

In some embodiments, the discharge current may be integrated over time between a beginning of an ESD event and an end of an ESD event. The beginning of the ESD event may for example be defined on the basis of a time at which the current measurement signal reaches a trigger threshold. However, in some embodiments, the beginning of the ESD event may be defined prior to the trigger event. The end of the ESD event may be defined in very different ways. For example, it may be defined that the ESD event has a certain maximum duration, for example computed from the trigger event or from the beginning of the ESD event. In some other embodiments, it may be assumed that the ESD event is finished when the current measurement signal falls below a certain threshold value for at least a predetermined period of time.

Figure 16:
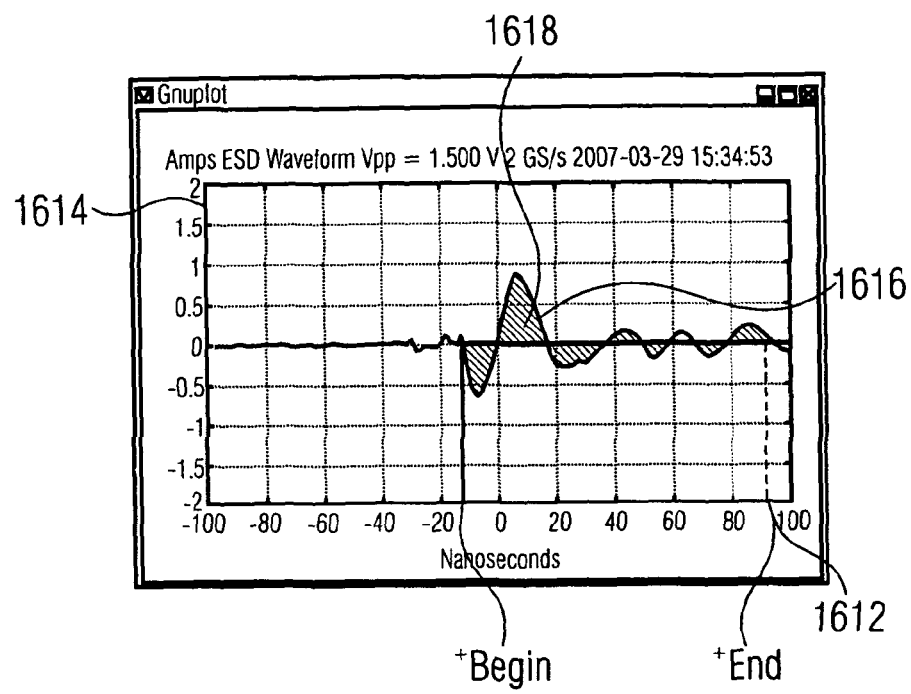
FIG. 16 shows a schematic representation of a concept for determining a charge released by an electrostatic discharge event, according to an embodiment according to the invention.

In the following, reference will be taken to FIG. 16, which shows a graphical representation of a current measurement signal (or a current or current component flowing via a power supply connection or via a protective earth connection) as a function of time. An abscissa 1612 describes the time (for example within a range between −100 nanoseconds and 100 nanoseconds, relative to a trigger event). An ordinate 1614 describes the current or current component measured by the current measurement device (which may for example approximate an ESD discharge current). The discharge current as a function of time is shown by a curve 1616. An area underneath the curve 1616 (for example between the curve 1616 and a steady-state current value (for example a value of $I_{Dis}=0$) is marked by a hatching 1618. It should be noted here that a beginning of the ESD event may be identified at a time before the trigger event, for example at a time $t_{begin}$. An end of the ESD event may be identified at an end time $t_{end}$. In other words, the hatching indicates the amount of charge released by the electrostatic discharge. In other words, the integrated discharge current $I_{Dis}$ over time (for example between the beginning time $t_{begin}$ and the end time $t_{end}$) equals an area underneath the graph. Said integrated discharge current may in some cases be identical to a charge or a discharge charge.

In the following, it will be described how a power as well as an energy released by an ESD event can be determined as an information captured with the ESD monitor solution using the discharge current.

As a first step, a power $P_{Dis}$ transferred by an ESD event can be calculated. For example, the equation $$P_{Dis}(t) = R_{Dis}(t) * I_{Dis}(t)^2$$

(confer Lutz Mueller, "Untersuchungen und Modellierung elektrostatischer Entladungen (ESD) von elektrisch isolierenden Oberflächen", Stuttgart, Universität, Dissertation, 2004, Page 25) can be applied in order to calculate the power. In the above equation, $R_{Dis}$ designates an impedance (or a resistance) of a discharge path. $I_{Dis}$ designates the discharge current (for example as a function of time).

It should be noted here that the impedance or resistance of the discharge path may for example be measured, calculated or estimated on the basis of experience values. Depending on the circumstances, it may be sufficient to consider a part of the impedance of the discharge path, for example a portion which is particularly sensitive to a discharge.

In a second step, an energy $W_{Dis}$ transferred by an ESD event can be determined. In some embodiments, an integration of power (for example of the power $P_{Dis}$) over time can be applied. In some embodiments, the following equation can be evaluated:

$$W_{Dis} = \int_0^\tau P_{Dis}(t)\,dt = \int_0^\tau R_{Dis}(t) * I_{Dis}(t)^2$$

(confer Lutz Mueller, "Untersuchungen und Modellierung elektrostatischer Entladungen (ESD) von elektrisch isolierenden Oberflächen", Stuttgart, Universität, Dissertation, 2004, Page 26)

The time over which the integration is evaluated can for example be determined as described above with respect to the calculation of the total charge. In other words, a beginning and an end of the ESD event can be obtained, calculated or estimated.

In some embodiments, energy may be the ultimate information to characterize a damage potential of an ESD event.

It should be noted that in some embodiments, the impedance $R_{Dis}$ of the discharge path is specific to a system hardware.

In other words, the impedance $R_{Dis}$ might be system specific, configuration specific and/or frequency dependent.

In the following, some further aspects of some embodiments according to the invention will be disclosed. In some embodiments according to the invention, the following problems are solved by using a current clamp to capture a discharge current of an ESD event on a semiconductor test system (for example on a Verigy V93000 test system):

Scalability of Solution:
According to an aspect, some embodiments of the solution described herein work on many or even on all test systems (for example V93000 test systems), independent from the individual test setup. The reason for this finding is that a current clamp, which is used in some embodiments according to the invention to measure the discharge current, is clamped on a protective earth or power cable (=protective earth cable or power line which exists for every system).

In contrast, it has been learned from some experiments using a so-called "transient method" that an ESD detection method using transient fields is very sensitive to the geometry of the setup (e.g. V93000 test system). When applying the "transient method", electromagnetic waves are reflected, absorbed, shielded, etc. on the DUT IF of the V93000 test system. These effects have negative impacts on the detection and quantification capability of the solution.

Also, it has been found from the experiments using the "transient method" that an adaptation of the solution using transient fields to individual systems might be difficult. In other words, the solution using transient fields might work on one system but not on another system (for example because the geometry of the setup may be different).

Installation of Solution:
In some embodiments, the installation of the solution described herein does not cause any interference (or only a negligible interference) with the test system operation. In other words, in some embodiments, a test system operation does not have to be stopped for an installation of the solution. In some embodiments, the reason for this effect lies in the fact that a current clamp is clamped around a protective earth cable, a data acquisition device (DAQ) and/or a scope or oscilloscope is connected to a power outlet and a local area network (LAN) connection and a "Verigy Production Dashboard" software package (or a comparable software package as described above) is installed on a server.

Naturally, an installation of a current probe around a cable without opening the cable connection only works with "clamp on" current probes. With "closed current probes", the cable may need to be interrupted (e.g. cut) to move the cable through the probe opening.

In contrast, it has been learned from experiments using the "transient method" that an integration of a solution using transient fields into a test system (for example a V93000 test system) may necessitate a large intervention into the system hardware. In some arrangements using the "transient method", for example antennas and sensors need to be installed, and antenna cables need to be routed into the test head, etc.

Operation of Solution:
In some embodiments, the operation of the solution described herein does not cause any interference (or only a negligible interference) with the system operation. The reason for this is the fact that a current clamp used in some embodiments is a "passive" component.

Analysis of ESD Events:
By analyzing ESD events with the "Verigy Production Dashboard" (VPD), or with any other comparable software or hardware fulfilling the above-described functionality, the following information can be derived for one ESD event (or even for each ESD event):

General Information
   Date when ESD event occurred
   Time when ESD event occurred
Tester Specific Information
   Test system where ESD event occurred
   Status of test system when ESD event occurred
Operation Specific Information
   Information on operator using the system
   Information on device under test
   Information on test program
   Information on lots and wafers
   Information on yield and binning ESD Event Specific Information
   Detection of ESD event
   Quantification of ESD event magnitude
   Duration of ESD event It should be noted here that it is not necessary to derive all of the information described above. Rather, in some embodiments, it is sufficient to derive one out of the information items described above. In other embodiments, none of the information items described above are obtained. It should also be noted that the information items mentioned above can be associated with an ESD event or with each other, so that there is an associated set of information, which allows for a detailed analysis in some embodiments.

By combining the ESD event detection and quantification capability of the "ESD monitor solution" with the data collected by a test data collection software, for example, by the "Verigy production dashboard", some or all of the following effects can be obtained:
   ESD events can be detected in real time.
   ESD events can be correlated to manufacturing process data (for example, to a potential drop in production yield after an ESD event).
   The ESD event can be correlated to the system status (for example, potential system failures, for example, diagnostic/calibration failures after an ESD event).

In the following, some advantage effects, which can be achieved by some embodiments according to the invention will be described. In addition to some of the advantageous effects already mentioned above, in some embodiments according to the invention, some very important information on the ESD event can be extracted from the data captured.

According to some embodiments, the information captured by the solution is the discharge current of an ESD event in time domain. For example, a waveform (for example, a waveform of the discharge current) is captured with an oscilloscope (or any other waveform-capturing device).

Figure 6A:
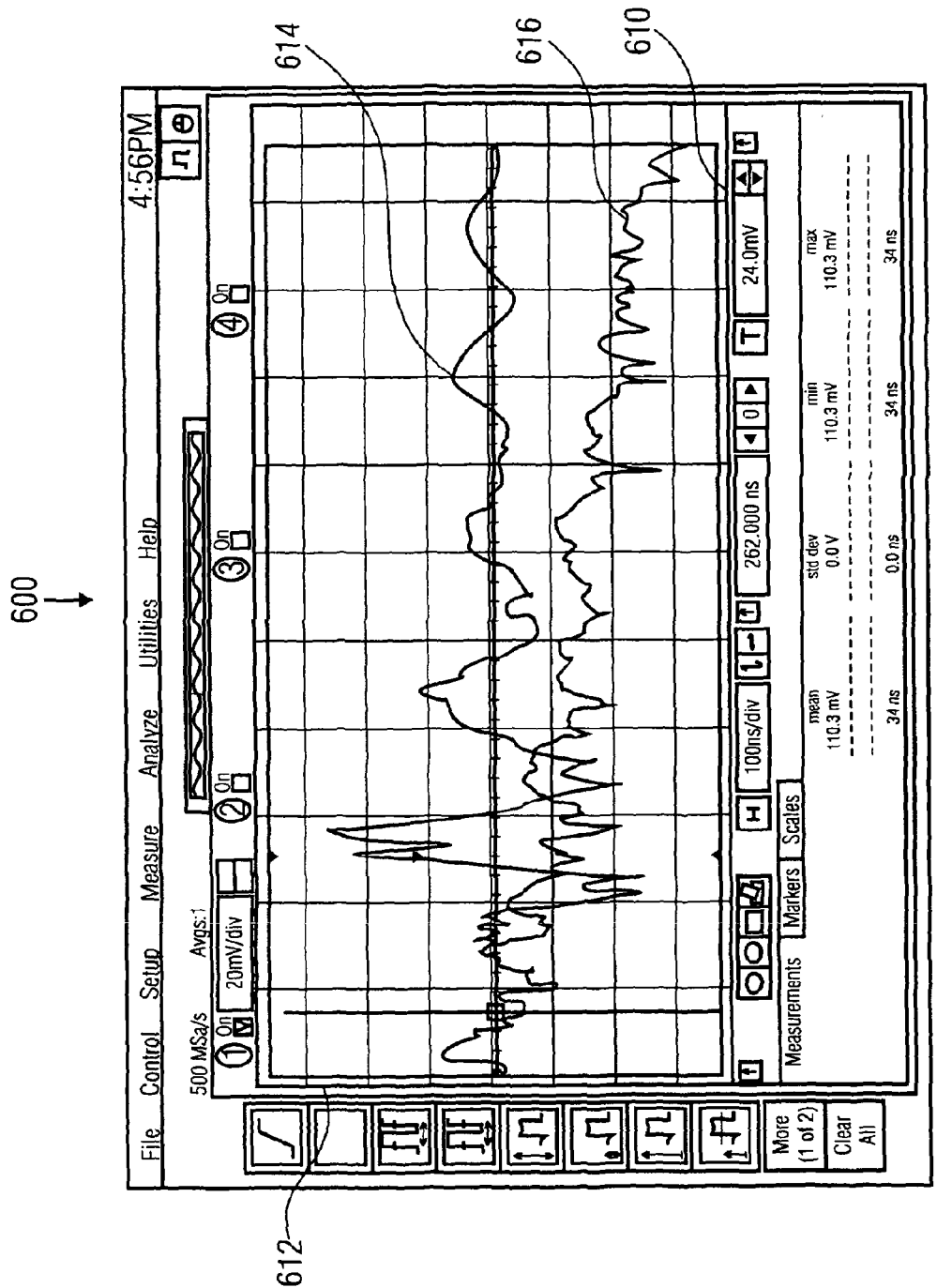
FIG. 6a shows a graphical representation of a waveform of a discharge current captured with an oscilloscope.

Making reference to FIG. 6a, an exemplary waveform is shown. The graphical representation of FIG. 6a is designated in its entirety with 600. An abscissa 610 describes the time and an ordinate 612 describes a signal level of the captured waveform. A curve 614 describes a discharge current in a time domain and a curve 616 describes the discharge current in a frequency domain.

Figure 6B:
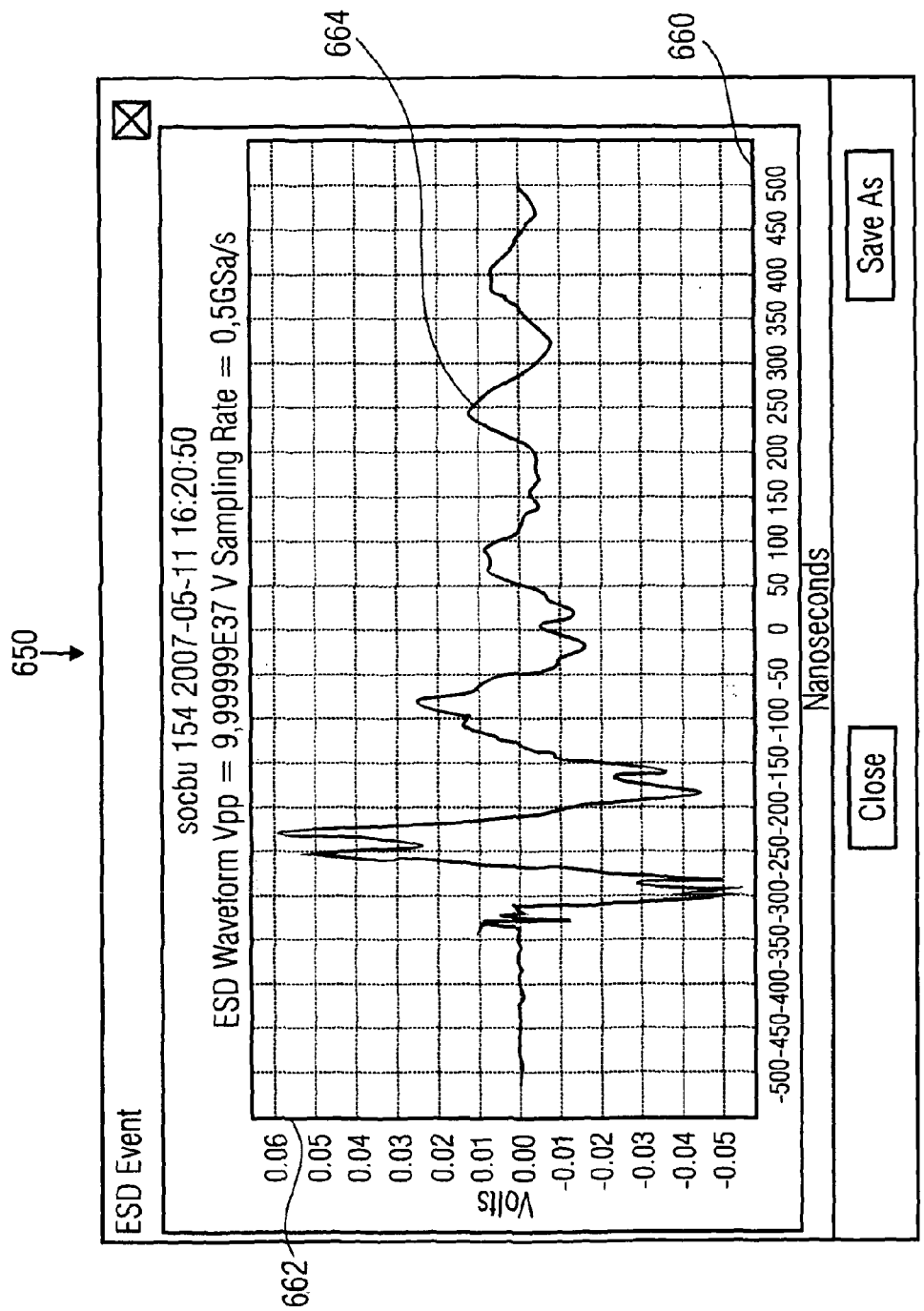
FIG. 6b shows a graphical representation of a reconstructed waveform of a discharge current.

FIG. 6b shows a graphical representation of a reconstructed waveform. The graphical representation of FIG. 6b is designated in its entirety with 650. In other words, FIG. 6b shows (at least approximately) the same waveform as FIG. 6a. The waveform (for example, the waveform in the time domain) is digitized by an oscilloscope and is stored in a database. An abscissa 660 describes the time (for example, in a range between −550 nanoseconds and 550 nanoseconds) and an ordinate 662 describes a level of the reconstructed waveform, which may represent the ESD discharge current or which may, for example, be at least approximately proportional to the ESD discharge current. A curve 664 describes the reconstructed waveform.

Figure 7:
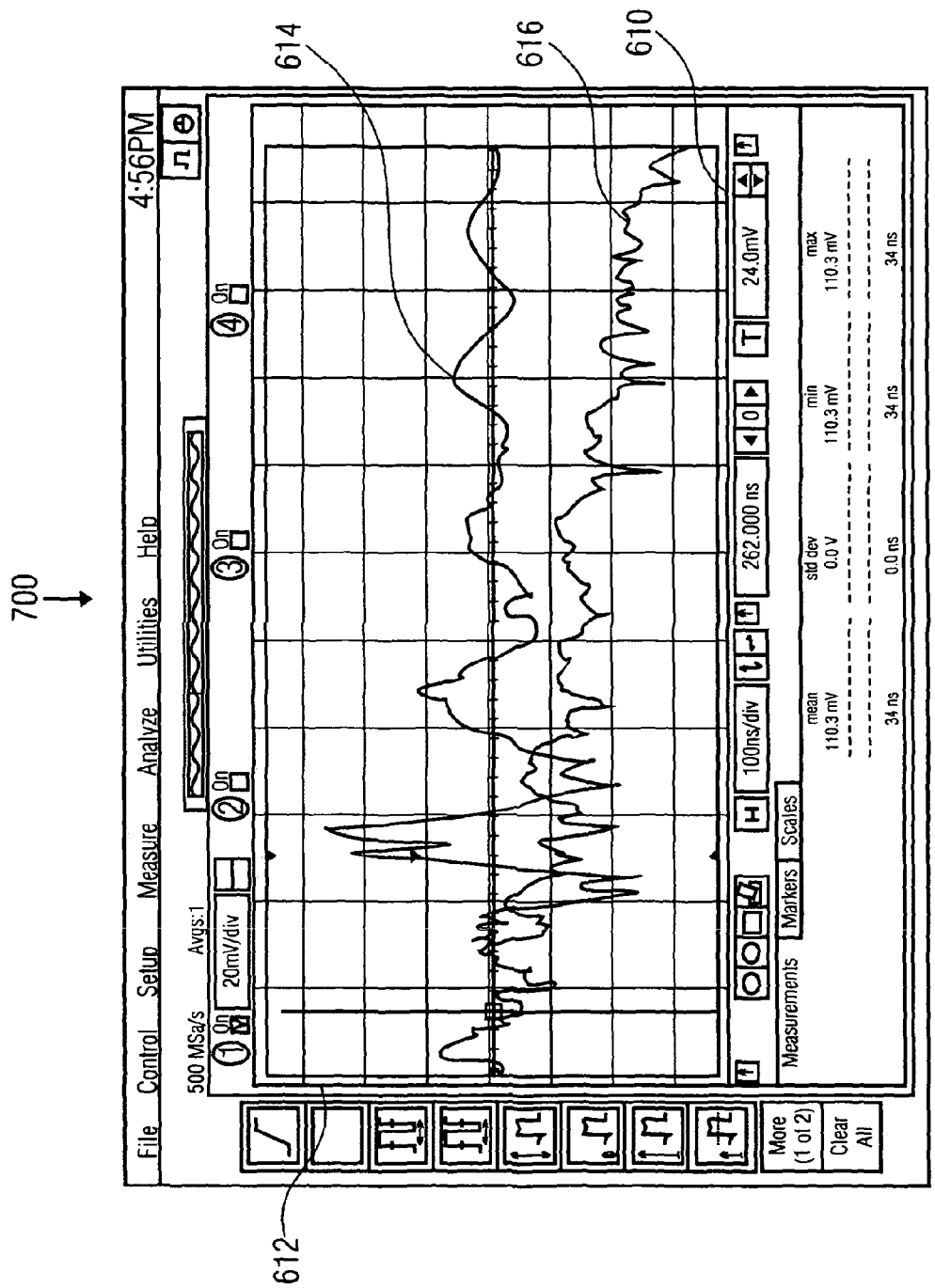
FIG. 7 shows a graphical representation of a frequency spectrum of a captured discharge current.

The captured information (for example, the information describing the discharge current of an ESD event in time domain) can be used to analyze the ESD event in some detail or even in great detail. In some embodiments according to the invention, one or more of the following effects can be obtained:
   Detection of ESD events: All ESD events are captured, no events are missed (or only a negligible number of events is missed).
   Quantification of ESD events: Quantification of a magnitude of ESD event is possible as discharge current is captured in time domain. The following data can be obtained from the ESD event:
      Peak-to-peak value of discharge current.
      Calculation of charge released during ESD event (useful to identify source of ESD event).
      Calculation of power as well as energy transferred during the ESD event (useful to characterize damage potential of ESD event).
   Analysis of frequency spectra of ESD events:
   Taking reference to FIG. 7, a graphical representation of a frequency spectrum will be described. The graphical representation of FIG. 7 is designated in its entirety with 700. An abscissa 710 describes the time and an ordinate 712 describes the level of an output signal provided by a current clamp. A first curve 614 describes an output of the current clamp (=discharge current) in time domain. A curve 616 describes an output of the current clamp in frequency domain (=time domain data processed with Fast Fourier transform (FFT) or Discrete Fourier Transform (DFT)).

One method to obtain the frequency domain information or frequency domain representation would be to run a Fast Fourier transform (FFT) or Discrete Fourier Transform (DFT) to transfer discharge current from time domain into frequency domain.

In some embodiments, the frequency domain information can be used to capture "signal shape" (confer Chang-Yu Wu et al.: "On the frequency domain specification of ESD Waveforms", Journal of Electrostatics, 24 (1990), pages 197-206) as well as "fingerprints" of ESD events, which could help to identify the source of the ESD event. In other words, different fingerprints (for example, in the frequency domain) can be saved as reference fingerprints for different sources of ESD events. A fingerprint of an actual captured ESD event can then be compared with one or more of the referenced fingerprints. If an agreement between the fingerprint of the captured ESD event and the referenced fingerprint is sufficiently large or if the difference between the fingerprint of the captured ESD event and the referenced fingerprint is smaller than a predetermined difference threshold, it can be indicated that the source of the ESD event is a source associated with the referenced fingerprint.

In some embodiments, the "shape" of the discharge current wave form in the frequency domain may be used in order to characterise the source of the ESD event. For example, the shape of the discharge current in the frequency domain may be used to identify (or distinguish) the source of an ESD event as a "discharge by humans" (HBM), as a "discharge by machines" (MM), as a "discharge by devices" (CDM) or any other known discharge models.

In the following, some aspects of the "ESD monitor solution" will be summarized.

According to some embodiments, the following applications can be implemented:
      Continuous and real time ESD event detection on semiconductor test systems; and/or
      Continuous and real time ESD event detection on all (or at least on some) instruments/systems sensitive to ESD using a central power line.

Regarding the installation, some embodiments according to the invention bring along one or more of the following effects or advantages:
      No interruption of system operation;
      No additional hardware installed into a test head (for example, the test head of a V93000 tester).

Regarding the detection of ESD events, some embodiments according to the invention may bring along one or more of the following effects or advantages:

Cost-effective and reliable detection of ESD events, because of the measurement technique;

No ESD events missed (or only a negligible number of ESD events missed;

Quantification of magnitude of ESD events;

Threshold level for ESD events is programmable.

Regarding the analysis of ESD events, one or more of the following characteristics can be determined in some embodiments according to the invention:

Rise time ($t_{10}/t_{90}$), for example of a first pulse (or of a subsequent pulse) of the electrostatic discharge event; Information on the rise time may be used to identify (or distinguish) the source of an ESD event as a "discharge by humans" (HBM), as a "discharge by machines" (MM), as a "discharge by devices" (CDM) or any other known discharge models.

Amplitude (for example peak current $I_{max}$) of the ESD discharge current;

Polarity of ESD discharge current; the polarity of the electrostatic discharge current may for example be used to determine the type or source of the electrostatic discharge event;

Duration of ESD event; Information on the duration may be used to identify (or distinguish) the source of an ESD event as a "discharge by humans" (HBM), as a "discharge by machines" (MM), as a "discharge by devices" (CDM) or any other known discharge models;

Charge of ESD event;

Power of ESD event;

Energy of ESD event;

ESD discharge current in time domain; and/or

ESD discharge current in frequency domain.

In some embodiments according to the invention, an information regarding the ESD event may be correlated with an information describing the system operation (for example, the system operation of a device tester) in order to obtain a warning if the correlation exceeds a certain predetermined threshold.

In some embodiments, a correlation to the system operation can be obtained or computed by using the "Verigy production dashboard" (or any other comparable software).

For obtaining the correlation, one or more of the following types of information can be considered:

General Information;
  Date when ESD event occurred; and/or
  Time when ESD event occurred.
Tester Specific Information:
  Test system where ESD event occurred; and/or
  Status of tester when ESD event occurred; and/or
  configuration of test system when electrostatic discharge event occurred. For example, an identification of each hardware in the system during the electrostatic discharge event can be determined. The identification of the hardware can for example be based on a hardware serial number.
Operation Specific Information:
  Information on operator using the system;
  information on device under test;
  information on test program;
  information on lots and/or wafers; and/or
  information on yield and binning Correlation to Tester and Manufacturing Process Status:
  Correlation of ESD event to manufacturing process data (for example, potential drop in production yield after an ESD event); and/or
  Correlation of ESD events to system status (for example, potential system failure after an ESD event).

Some embodiments according to the invention may bring along one or more of the following benefits, for example, for the automated test equipment (ATE) industry:

Cost-effective solution to detect/prevent ESD events;

cost savings (for customer and/or automated test equipment vendor);

prevention of loss (regarding automated test equipment system and/or devices);

high up-time of automated test equipment system;

quality assurance—correlation between ESD events and lots of devices tested;

prevention to ship bad products;

scalable to different test systems; and/or no interference with system operation ("passive" components).

In the following, an approach for distinguishing a ESD event from a non-ESD event will be described. As discussed above, in some embodiments in accordance with the invention, the current measurement signal is used to detect an electrostatic discharge event. In some embodiments, an analysis of the current measurement signal, for example in the time domain or in the frequency domain, is used in order to distinguish an electrostatic discharge event from non-electrostatic-discharge event However, in some embodiments a static field (electrostatic field) or static voltage (electrostatic voltage) can additionally be evaluated to distinguish an electrostatic discharge event from an non-electrostatic-discharge event. In other words, a static field or a static voltage can be monitored as an additional parameter. The evaluation of the static field or static voltage based on the background that prior to an electrostatic discharge event, the static field or static voltage increases. If the (static) voltage meets with a "breakdown voltage", an ESD event takes place.

Thus, a monitoring of the static field or static voltage within test cell of a semiconductor test system may help to predict "an upcoming ESD event" and "warn" a user from an upcoming ESD event. For example, if the static field or static voltage increases and reaches or exceeds a predetermined threshold, a warning can be issued.

Detect the presence of static generators within a test cell. A static generator could be the source of an ESD event or even of multiple ESD events. Moreover industrial standards define a maximum allowed static potential as well as static field strength within an electrostatic protected area (EPA). Also, in many embodiments one or more test systems are installed in an EPA.

Map (Rapid) changes in static field or static voltage to ESD events if in parallel a discharge wave form is captured.

Different types of instruments can be used to monitor a static field, static voltage or static potential within a test cell. For example, an electrostatic volt meter, a static volt meter, an electro field meter or an E-field probe can be used. Naturally, several of said instruments can be used in combination, if desired.

To summarize the above, in some embodiments a device to monitor the static potential may be part of the architecture of the ESD monitor.

In some embodiments, further parameters can be used to detect and/or characterise an electrostatic discharge.
Optical radiation field.
Magnetic radiation field
For details, reference is made to the dissertation "Characteristics of electrostatic discharges (ESD) based on current, optical and magnetic radiation fields" of JOHN BENDJAMIN (UPPSALA dissertations from the faculty of science and technology 23. ISBN: 91-554-4657-4).
In said dissertation, parameters characterising electrostatic discharges such as current, the magnetic field and the optical radiation are investigated. Optical radiation and magnetic fields generated by ESD are measured together with their current signatures in the time domain. Observations show that during the initial growth, the temporal variation of the optical pulse is similar to that of the current. The peak current is nearly correlated to the peak optical radiation, with a correlation coefficient of about 0.9. The results show that both the optical radiation and the magnetic fields can be used to remote sense the current in electrostatic discharges, which is difficult to measure directly.

To summarise the above, in addition to the discharge current, the static potential, the optical radiation field and the magnetic radiation field can be measured. The recognition and/or characterisation and/or classification of an electrostatic discharge event can be performed using one or more of said characteristic (wave form of the ESD current and/or magnitude or temporal evolution of the electrostatic field and/or optical radiation field and/or magnetic radiation field).

It should be noted here that in the present description, the concept of the solution, is described. However, the solution can naturally be modified and improved in many different ways, as it is known from the man skilled in the art.

Figure 17:
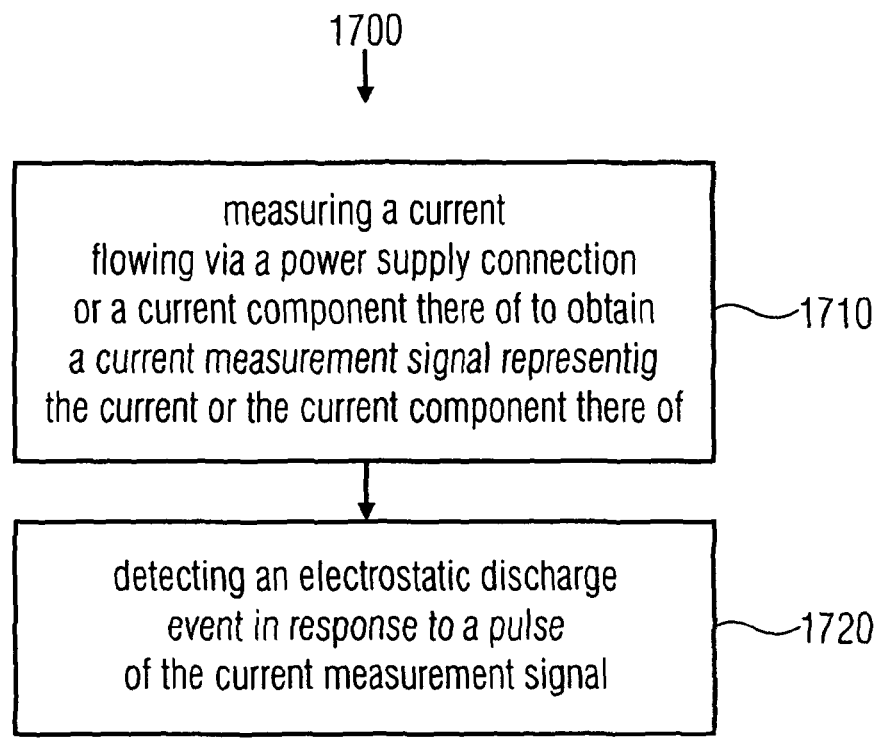
FIG. 17 shows a flowchart of a first method for detecting an electrostatic discharge event, according to an embodiment according to the invention.

In the following, embodiments of the methods in accordance with the invention will be described, taking reference to FIGS. 17 and 18. FIG. 17 shows a flow chart of a method for detecting an electrostatic discharge event with respect to the device to be monitored. The method shown in FIG. 17 is designated in its entirety with 1700. The method 1700 comprises measuring 1710 a current flowing via a power supply connection or a current component thereof to obtain a current measurement signal representing the current or the current component thereof. The method 1700 further comprises detecting 1720 the electrostatic discharge event in response to a pulse of the current measurement signal.

Figure 18:
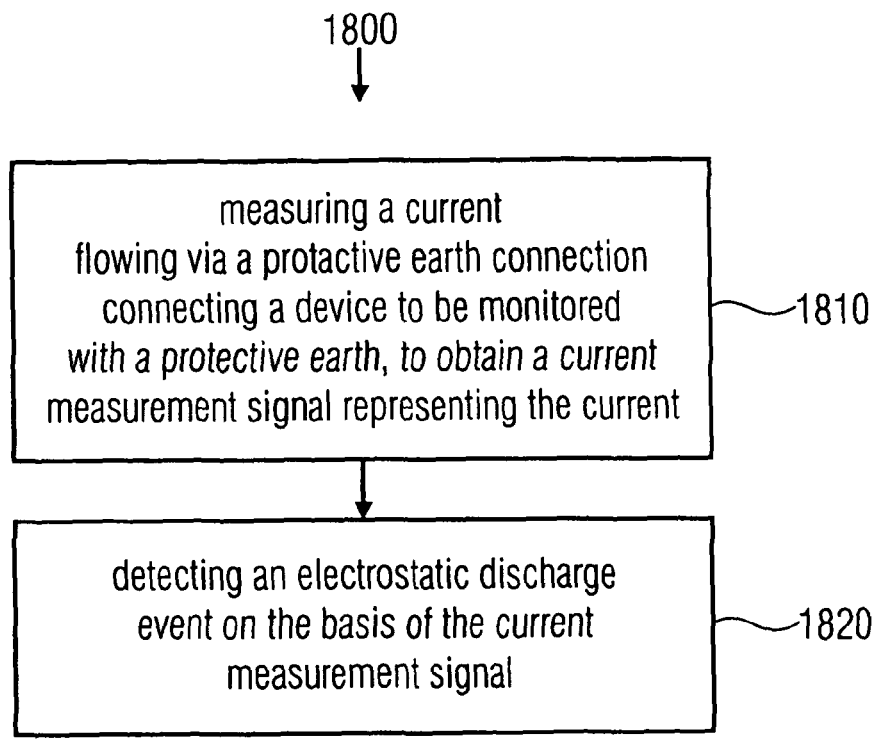
FIG. 18 shows a flowchart of a second method for detecting an electrostatic discharge event, according to an embodiment according to the invention.

FIG. 18 shows a flow chart of another method for detecting an electrostatic discharge event according to an embodiment according to the invention. The method shown in FIG. 18 is designated in its entirety with 1800. The method 1800 comprises measuring 1810 a current flowing via a protective earth connection connecting a device to be monitored with a protective earth to obtain a current measurement signal representing a current. The method 1800 further comprises detecting 1820 an electrostatic discharge event on the basis of the current measurement signal.

It should be noted that the methods 1700, 1800 describe with reference to FIGS. 17 and 18 can be supplemented by any of the steps or features disclosed herein, also with respect to the other embodiments according to the invention.

In addition, some embodiments according to the invention can be implemented using a computer program.

Figure 19:
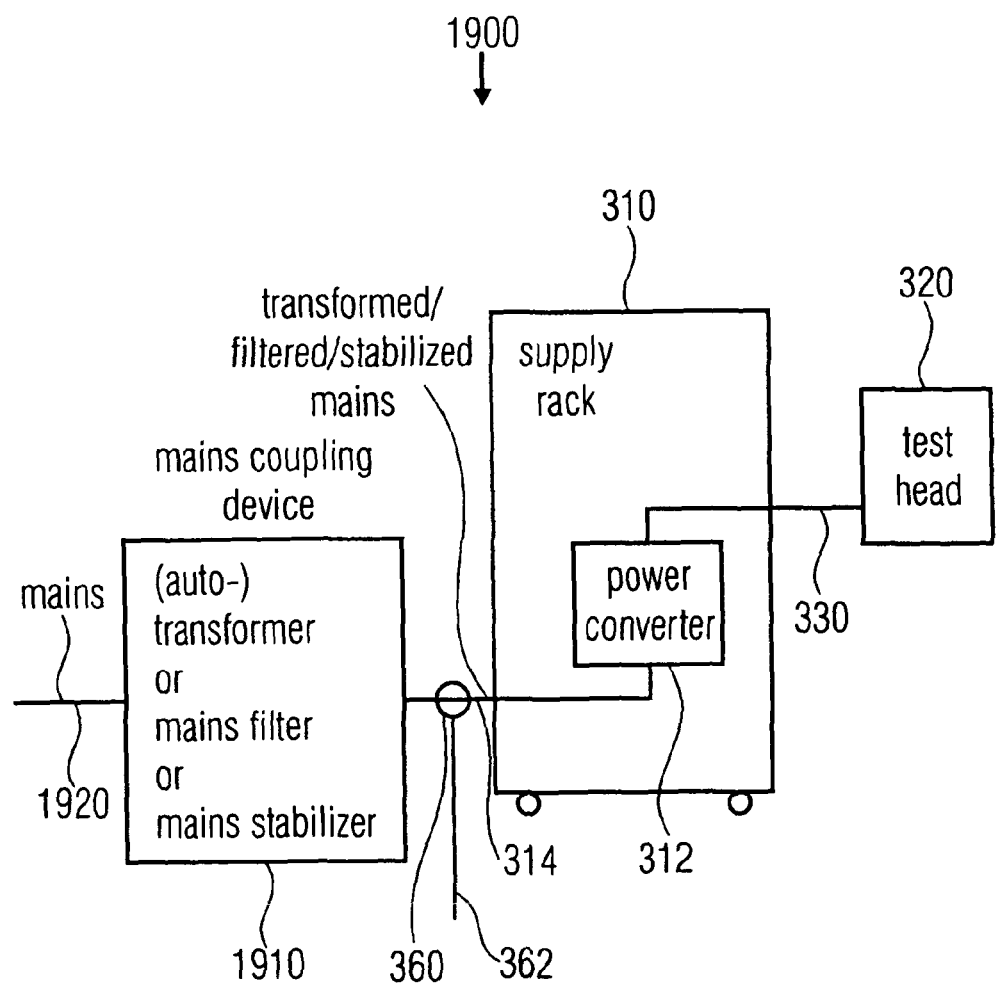
FIG. 19 shows a schematic diagram of a test system, according to an embodiment according to the invention.

Depending on certain implementation requirements of the inventive methods, the inventive methods can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate with a programmable computer system such that the inventive method is performed. Generally, the present invention is, therefore, a computer program product with a program code stored on a machine readable carrier, the program code being operative for performing the inventive method when the computer program product runs on a computer. In other words, the inventive method is, therefore, a computer program having a program code for performing the inventive method when the computer program runs on a computer.
Autotransformer In the following, another embodiment according to the invention will be described taking a reference to FIG. 19. FIG. 19 shows a schematic diagram of a test system, according to an embodiment according to the invention. The test system shown in FIG. 19 is designated in its entirety with 1900. The test system 1900 is similar to the test system (300) shown in FIG. 3a. Therefore, identical means and signals are designated with identical reference numbers.

However, in the test system 1900, the mains connection 314, via which the power converter 312 is supplied with electrical energy, is not directly coupled to a mains network. Rather, a mains coupling device 1910 is circuited between the mains network 1920 and the mains connection 314 of the power converters 312.

The mains coupling device 1910 may for example be adapted to convert a voltage level provided by the mains network 1920 to a voltage level useable for operating the power converter 312. Alternatively, or in addition, the mains coupling device 1910 may be adapted to filter and/or to stabilize the voltage or current provided by the mains network 1920 to the power converter 312. For example, the mains coupling device may be configured such that the mains coupling device comprises a low pass filter characteristic, such that high frequency distortions, which are present in the mains network 1920, are reduced or eliminated at the mains connection 314. In an embodiment, the mains coupling device 1910 may be configured such that impulsive distortions present in the mains network 1920 are reduced or even suppressed on the mains connection 314.

In an embodiment, the mains coupling device may for example comprise a transformer or an autotransformer configured to transform a single phase or multiple phase (for example 3-phase) mains supply voltage to a different voltage level. Details regarding an exemplary autotransformer will be discussed in the following.

In another embodiment, the mains coupling device may comprise a mains filter. The mains filter may for example comprise a low pass filter circuited between a phase of the mains network 1920 and a phase of the mains connection 314. Naturally, in some embodiments filters may exist for all the phases of the mains network 1920 or of the mains connection 314.

In another embodiment, the mains coupling device 1910 may comprise an active or passive mains stabilizer. Many different types of mains stabilizers are known in the art, ranging from electro mechanical mains stabilizers (comprising a motor and a generator) to electronic mains stabilizers (comprising, among others, an active electronic circuitry).

In some embodiments, the system 1900 comprises a current measurement device which is configured to measure a current or current component flowing via the mains connection 314 and to provide a current measurement signal 362 representing the current or current component flowing through the mains connection 314.

In some embodiments, the current measurement device 360 comprises a current clamp arranged around a cable or cable tree or around a loom of wires comprising a plurality of conductors of the mains connection 314.

As discussed above, the current measurement signal 362 may be evaluated in order to detect an electrostatic discharge event.

It should be noted here that the current measurement device 360 may be used in different configurations. For example, the current measurement device 360 may be configured to measure a current flowing via the whole mains connection 314, including one or more phase conductors, one or more neutral conductors and one or more protective earth conductors.

In some other embodiments, the current measurement device 360 may be configured to measure only the current flowing through a subset of the conductors of the mains connection 314. All the possible configurations are shown in FIGS. 2a to 2e.

It should be noted here that the presence of the mains coupling device 1910 may reduce distortions on the mains connection 314 originating from other devices connected to the mains network 1920. For example, distortions on the mains network 1920 may be caused by conductive or capacitive loads connected to the mains network 1920. In particular, distortion on the mains network may also be caused by switching events of other devices connected to the mains network 1920. Without the presence of the mains coupling device 1910, such distortion of the mains network might for example have a very strong impact on the current measurement signal 362 provided by the current measurement device 360. In the presence of the mains coupling device 1910, such distortions originating from the mains network 1920 are reduced. In some embodiments, the mains coupling device 1910 comprises a low pass filter characteristic, such that impulsive distortions are reduced or suppressed. In other embodiments, the mains coupling device 1910 even provides for a galvanic separation between the mains network 1920 and the mains connection 314, such that voltage peaks on the mains network 1920 are decoupled (at least to some degree) from the mains connection 314. Again, a reduction of the distortions of the current measurement signal 362 is detected.

Consequently, the current measurement signal 362 can be used for very reliable detection of electrostatic discharge events.

Figure 20:
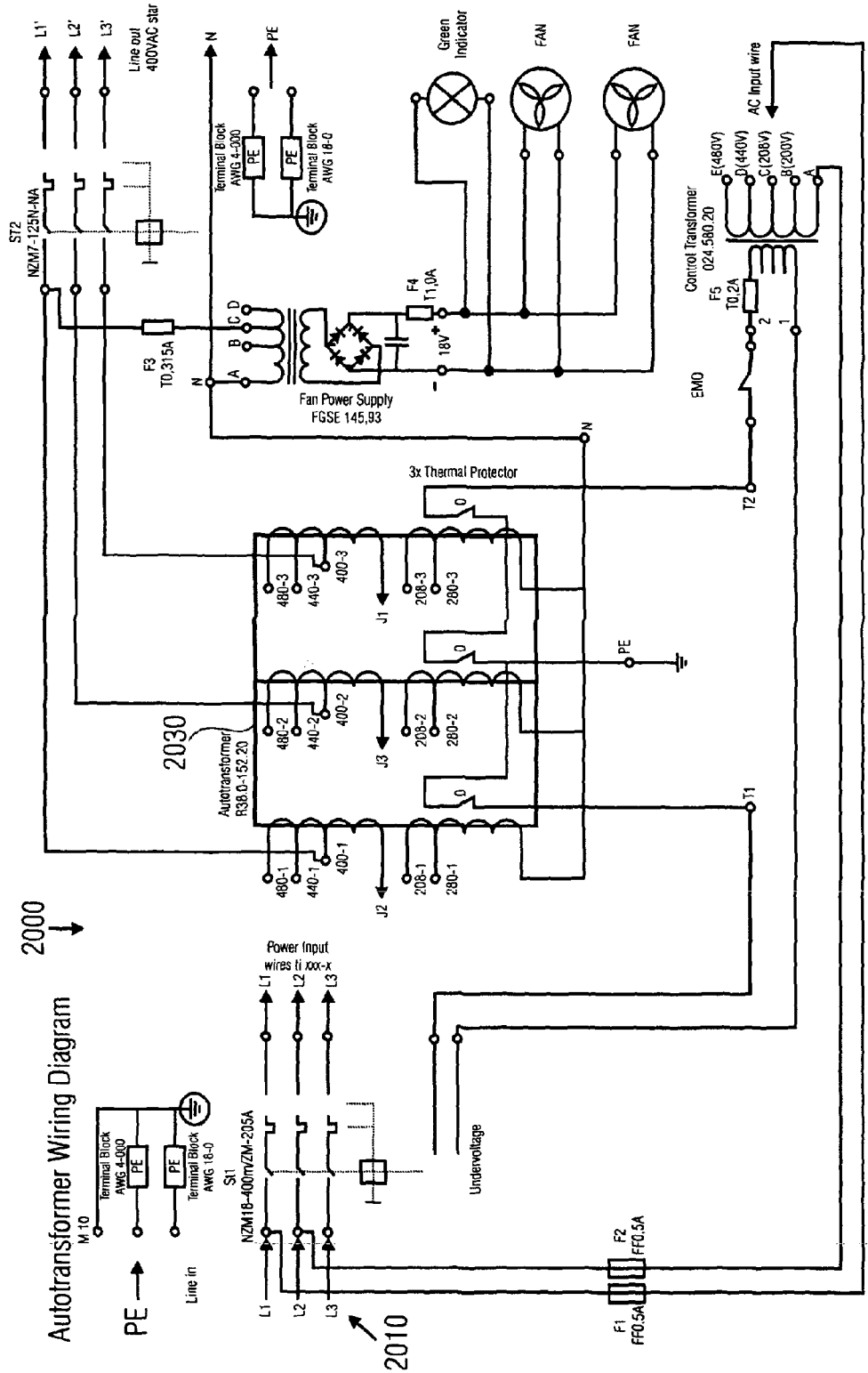
FIG. 20 shows a schematic diagram of an autotransformer which can be used in an embodiment according to the invention.

In the following, an autotransformer will be described as an example for a mains coupling device 1910. FIG. 20 shows a block schematic diagram of an autotransformer, according to an embodiment according to the invention. The autotransformer shown in FIG. 20 is designated in its entirety with 2000. The autotransformer 2000 comprises an autotransformer input 2010. The autotransformer input 2010 may for example be coupled to the mains network. For example, the autotransformer input 2010 may comprise a single phase or multiphase (i.e., three phase) connection. The three phases may for example be designated with L1, L2 and L3. The autotransformer input 2010 may further comprise a protective earth input, which is for example designated with PE. The autotransformer 2000 further comprises an autotransformer output 2020, which may for example comprise a single phase or multiphase (e.g., three phases) connection. For example, the phases can be designated with L1, L2 and L3. The autotransformer output 2020 may for example further comprise a neutral conductor output connection (for example designated with N) and a protective earth connection (for example designated with PE).

In an embodiment, a transformer or autotransformer, for example the autotransformer 2030, is circuited between the autotransformer input 2010 and the outer transformer output 2020, such that a voltage amplitude present at the one or more phase conductors of the autotransformer output 2020 is different from a voltage amplitude of the voltage present at the one or more conductors of the autotransformer input 2010.

For example, the transformer or autotransformer 2030 may be configured to transform the input voltage of 200 volt, 208 volt, 440 volt or 480 volt to an output voltage of 400 volt. However, other transformation ratios are naturally possible.

It should be noted that the autotransformer may in some embodiments comprise one or more transformer windings arranged on a transformer core. Thus, the one or more transformer windings may act, at least to some degree, as mains filters, such that distortions from the mains input 2010 are at least attenuated at the mains output 2020. In some other embodiments, the transformer 2030 may be configured to provide for a galvanic separation between the autotransformer input 2010 and the autotransformer output 2020. In this case, an even better attenuation of mains distortions may be obtained in some embodiments.

It should be noted here that the autotransformer input 2010 may for example be coupled to the mains network 1920 shown in FIG. 19. Also, the autotransformer output 2020 may for example be coupled to the mains connection 314 shown in FIG. 19.

Naturally, the autotransformer can also be implemented as a single phase autotransformer.

Moreover, it should be noted that the autotransformer may naturally also be used in combination with other embodiments. For example, the autotransformer can be combined with the arrangements shown in FIGS. 1a, 1b, 2a, 2b, 3a, 3b, 4a, 4b, 5, 8, 9 and 10.

A possible embodiment comprising an autotransformer (or a transformer or another type of mains filter or mains stabilizer) can be described as follows:

The test system is powered by an external transformer. With this configuration, there is a transformer between the mains connection (or the mains network) and the test system (for example between the mains network and the supply rack, or between the mains network and the test head). In some embodiments a probe (for example a current probe or a current clamp) is placed between the autotransformer (or a different transformer or mains filter or a main stabilizer) and the supply rack, or between the supply rack and the test head. The set up, in which an autotransformer is used, is for example known as "V93000 autotransformer".

In view of the above, different positions of the current probe or current measurement device are possible, each having their own advantages and disadvantages.

Regarding the position of the current measurement device or current probe relative to the supply rack, the following can be said: in some embodiments, the power converter 312 in the supply rack 310 may comprise a galvanic isolation from the mains connection 314. If the current probe or current measurement device is for example placed on the power supply connection (for example on the mains connection 314) before the power converter 312 (for example as shown in FIG. 2a to 2e), the probe may for example pick up noise from the power line or from the mains network. Thus, the probe may pick up signals originating from non-ESD events. Moreover, the probe (or current measurement device) may in this case pick up "switching operations" on the power line (or on the mains network). Thus, the probe may pick up signals which originate from non-ESD events. It should be noted here that "switching operations" can happen when large inductances (e.g. transformers, relays, motors, etc.) are connected or disconnected from mains (or from the mains network) (confer Stephan Frei: "Elektrostatische Entladungen (ESD) and ihre Störwirkung auf elektronische Systeme", Shaker Verlag, Aachen, 1999, Page 58). These operations may for example cause voltage peaks which may be detected with the current probe (or the current measurement device).

If the probe is placed on the power supply connection after the "power converter" 312 (for example between the supply rack 312 and the test head 320) (for example as shown in FIGS. 3a and 3b) the probe may not pick up noise from the power line (which may be produced by non-ESD events)(or may at least pick up less noise from the power line). Thus, the probe may pick up no or less signals originating from non-ESD events. Also, the probe may not pick up "switching operations" on the power line or mains network (which may be produced by non-ESD events)(or may at least less intensively pick up "switching operations" on the power line). Thus, the probe may for example pick up less signals originating from non-ESD events.

To summarize, placing the probe on the power supply connection 330 (e.g. on the test-head side of the power converter 312), distortions originating from the mains network may be reduced, such that the impact of non-ESD distortions on the mains network may be reduced.

Compact Test Head

In the following, a system configuration comprising a so-called "compact test head" will be explained with reference to FIGS. 21, 22a and 22b. It should be noted here that the so-called "compact test head" is a test-head of a test system, wherein a power converter is integrated into the test head. In other words, the test system comprising a compact test head is similar to the test system described with reference to FIGS. 3a, 3b, 8, 9 and 10. However, at least a part of the functionality of the supply rack (for example the power converter 312, or some or all of the components 1012, 1014, 1016) is integrated into the test head. Thus, in some test systems using a compact test head, there is no need to have a supply rack 310, 1010. However, the concept described herein can also be applied to test systems comprising a compact test head, as will be explained in the following.

Figure 21:
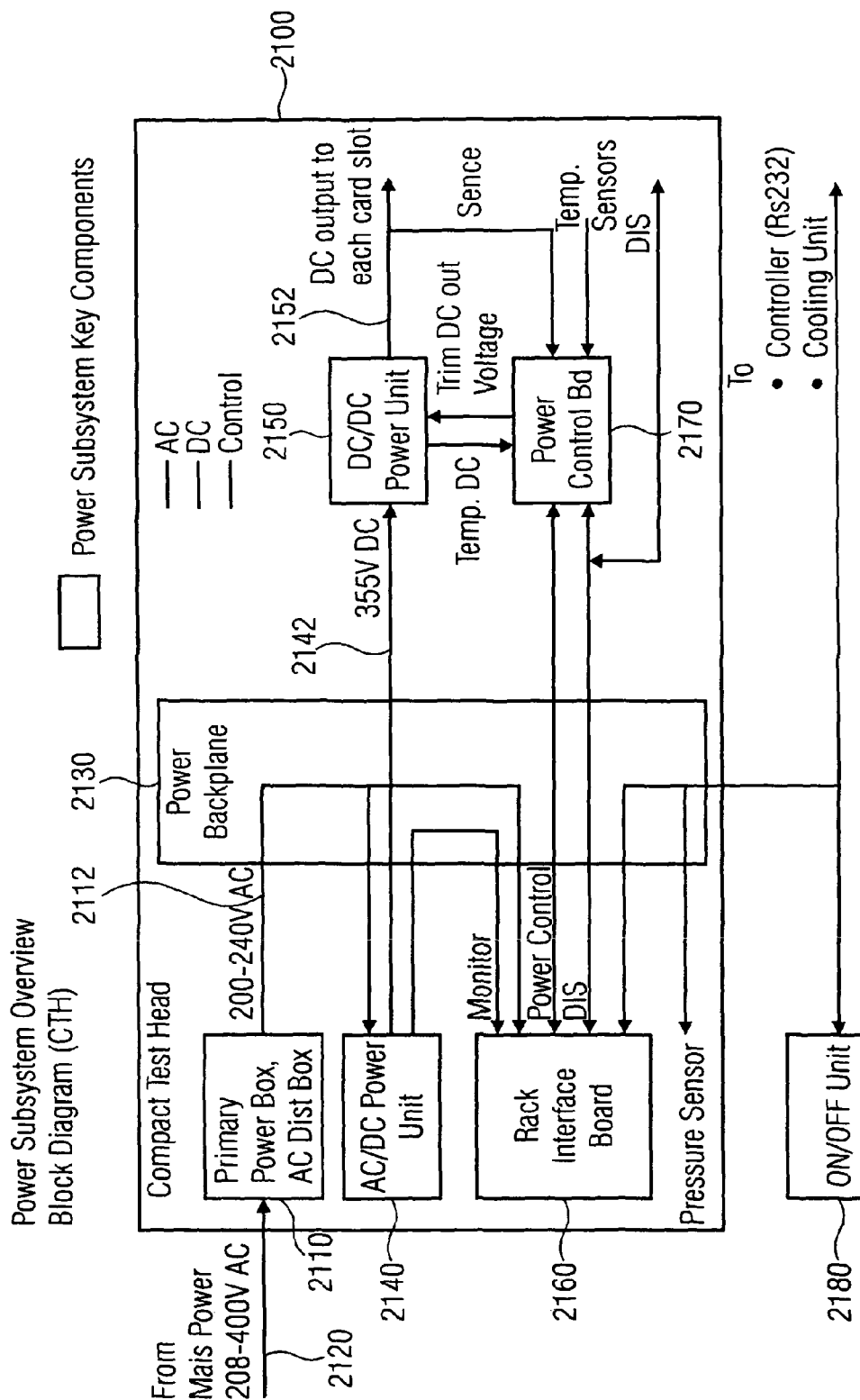
FIG. 21 shows a block schematic diagram of a test system comprising a compact test head, according to an embodiment according to the invention.

FIG. 21 shows a block schematic diagram of a power subsystem of a compact test head. The compact test head shown in FIG. 21 is designated in its entirety with 2100. The compact test head 2100 comprises a primary power box or AC distribution box 2110, which is coupled to a mains connection 2120 to receive the mains power. The mains power may for example comprise a single phase or a multiphase (e.g., three phase) alternating current voltage, for example within a range of 208 volt to 400 volt AC. Naturally, other voltages may be used. The primary power box or AC distribution box may for example be configured to provide an alternating current voltage in a range between 200 volt and 240 volt AC to a power back plane 2130, Naturally, in some other embodiments, different voltage level may be used.

The compact test head 2100 further comprises one or more AC/DC power units 2140. The AC/DC power units may for example be configured to receive the supply voltage or supply voltages 2112 provided by the primary power box or AC distribution box 2110 via the power back plane 2130. The one or more AC/DC power units 2140 may for example be configured to generate a DC voltage on the basis of the AC voltage or voltages 2112 obtained from the primary power box or AC distribution box 2110. In an embodiment according to the invention, the one or more AC/DC power units 2140 may for example be configured to provide one or more DC voltages of approximately 355 volt DC. The one or more AC voltages 2142 provided by the AC/DC power unit 2140 may for example be provided to one or more DC/DC power units 2150, which may be configured to generate one or more DC voltages 2152 on the basis of the DC voltage 2142. In other words, the DC/DC power unit 2150 may be configured to generate one or more DC voltages 2152, which are provided to one or more card slots, wherein the one or more DC voltages 2152 provided to the one or more card slots may have a different voltage level than the DC voltage provided by the AC/DC power unit.

In addition, the compact test head 2100 may comprise a so-called rack interface board 2160 and a so-called power control board 2170. A rack interface board 2160 may for example be configured to monitor the AC/DC power unit 2140 and to communicate with the power control board 2170. Moreover, the rack interface board 2160 may be connected to an on/off unit 2180, for example to switch on or switch off the AC/DC power unit 2140 and/or the DC/DC power unit 2150. The power control board 2170 may for example be coupled to the DC/DC power unit 2150 to obtain a temperature information and/or voltage information. Moreover, the power control board 2170 may for example be configured to trim a DC output voltage provided by the DC/DC power unit 2150, as shown in FIG. 21. In addition, additional voltage monitoring may be used. Also, the status of the compact test head 2100 may further be monitored, for example using one or more pressure sensors and/or one or more temperature sensors.

It should be noted that in addition to the power subsystem components or power subsystem key components 2110, 2130, 2140, 2150, 2160, 2170 described here, the compact test head may also comprise a test circuitry, as described herein. For example, the compact test head may comprise a test circuitry 410 as shown in FIGS. 4a and 4b. In addition, the compact test head may comprise one or more (or even all) of the component described with reference to FIG. 10. For example, the test head may comprise one or more pin modules configured to generate stimulus signal for one or more devices under test and/or to receive response signals from one or more devices under test.

Taking reference now to FIGS. 22a and 22b, details regarding the primary power distribution in the compact test head will be described.

Figure 22A:
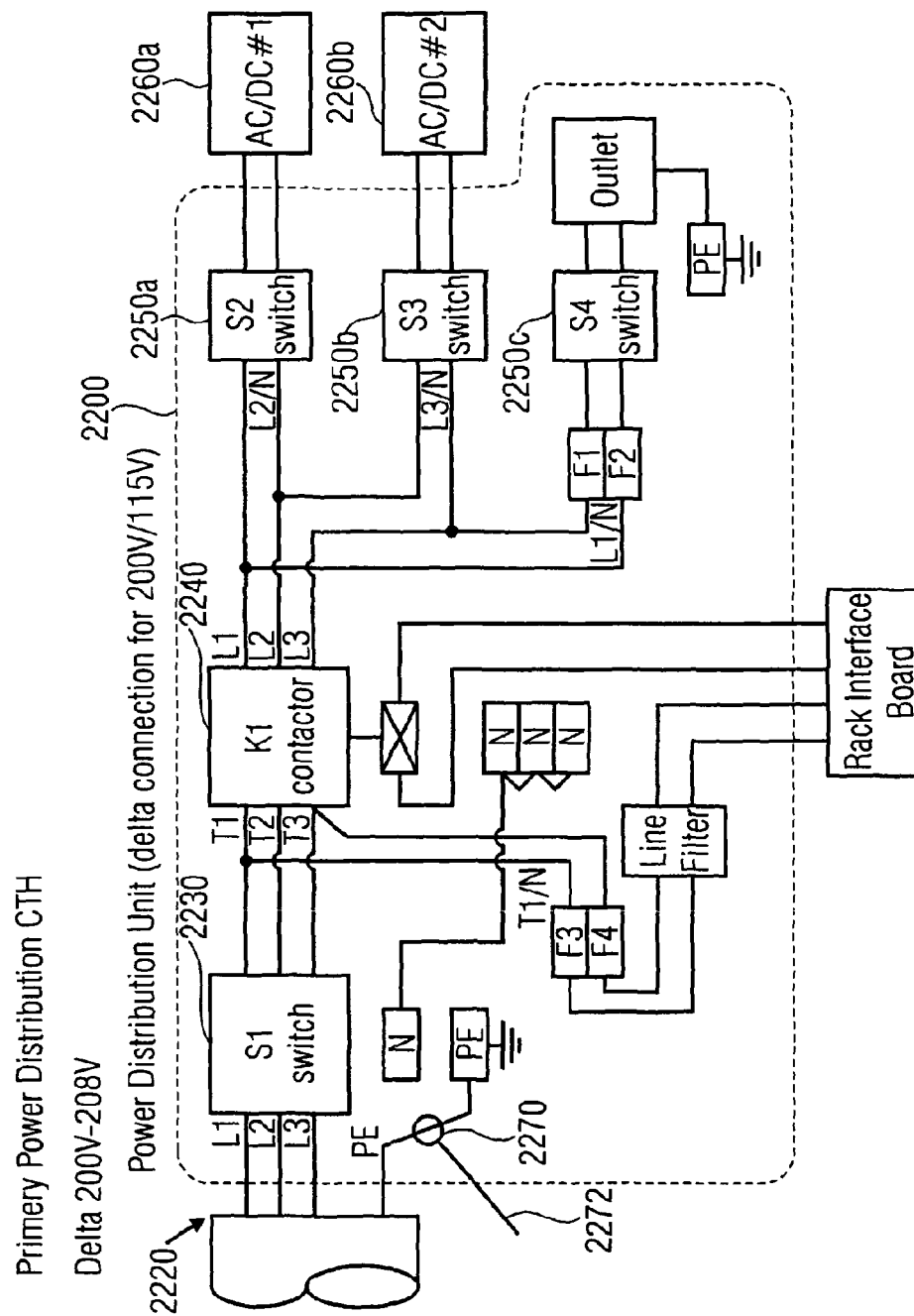
FIG. 22a shows a block schematic diagram of a primary power distribution in a compact test head, according to an embodiment according to the invention.

FIG. 22a shows a block schematic diagram of a power distribution unit configured in a delta connection for 200 volt/115 volt. The power distribution unit shown in FIG. 22a is designated in its entirety with 2200.

The power distribution unit 2200 may for example take over the functionality of the primary power box/AC distribution box 2110 shown in FIG. 21. The power distribution unit 2200 may for example be connected to a mains network via a mains connection 2220. The mains connection 2220 may for example comprise three phases, designated, for example, with L1, L2, L3, and a protective earth conductor, designated for example with PE. For example, the mains connection 2220 can be equivalent to the mains connection 2120. Also, the mains connection 2220 may for example be equivalent to the power supply connection 120 shown in FIGS. 2a to 2b, the power supply connection 330 shown in FIGS. 3a, 3b, 4a and 4b.

As shown in FIG. 22a, the power distribution unit 2200 may for example comprise a switch 2230, a contactor 2240 and further switches 2250a, 2250b and 2250c. One or more of the switches 2230, 2250a, 2250b, 2250c may comprise a fuse function as can be seen from FIG. 22a. One or more AC/DC converters 2260a, 2260b can be connected to the power distribution unit 2200. The AC/DC converters 2260a, 2260b may for example be equivalent AC/DC power units 2240 shown in FIG. 21.

In an embodiment, the power distribution unit may comprise a current measurement device 2270, which may for example be configured to measure current flowing via the protective earth connection PE of the mains connection 2220, to generate a current measurement signal 2270 describing the current. The current measurement device 2270 may for example be arranged within the power distribution unit or may for example be arranged within the compact test head, for example between the outer cover of the compact test head 2100 and the power distribution unit (or primary power box/ AC distribution box). In a further embodiment, the current measurement device 2270 may even be arranged outside of the outer cover of the compact test head 2100.

The current measurement signal 2272 may for example be used to recognise an electrostatic discharge event, as discussed herein.

It should be noted that other configurations may be used. In some embodiments, a current flowing via one or more of the phase conductors L1, L2, L3 of the mains connection 2220 can be taken into consideration when generating the current measurement signal, as discussed, for example, with reference to FIGS. 2a to 2e.

Figure 22B:
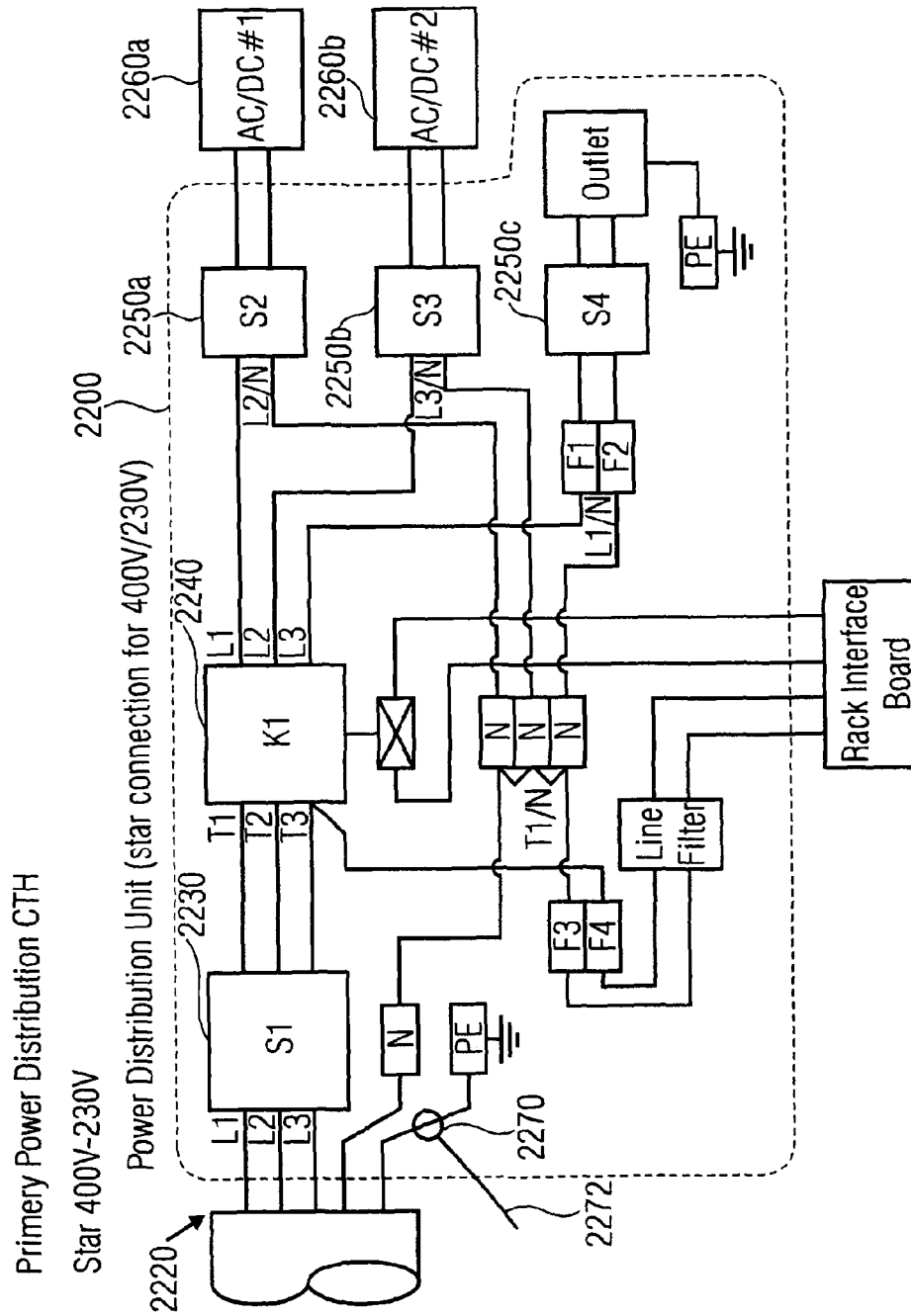
FIG. 22b shows a block schematic diagram of a primary power distribution in a compact test head, according to another embodiment according to the invention.

Taking reference to FIG. 22b, a different configuration of the power of distribution is shown. FIG. 22b shows a connection for 400 volt/230 volt. However, while the wiring is slightly modified, the statements provided above are still applicable. However it should be noted that a neutral conductor of the mains connection 2220 is used in the arrangement shown in FIG. 22b. Accordingly, the neutral conductor may or may not be taken into consideration for providing the current measurement signal 2272.

In the following, a short summary of the "compact test head" will begin, which can be considered as an additional possible configuration with no "supply rack". In some embodiments, a part or all of the hardware from the supply rack (e.g. a power converter, a power distribution, and so on) is integrated into the test head. In some embodiments, the test head is installed on a cart with wheels. In some embodiments, a probe (i.e., a current measurement device, like a current clamp) is placed on (or around) a main power cable or protective earth cable. The set up described here is designated for example as a "V93000 compact TH".

Separation between ESD events and non-ESD events

In the following, some options to filter out non-ESD events will be summarized:

Selection of probe bandwidth: in some embodiments, it is desirable to choose the lower cut-off frequency of the probe to be high enough to filter out noise "noise" from the power line. In other words, most of the noise on the mains network is in the low frequency range. Thus, selecting a probe having a lower cut off frequency in the range of 10 kHz (or, for example, between 1 kHz and 100 kHz) may help to filter out noise from the power line.

Analysis of discharge wave form: for captured discharge waveforms which may at least potentially represent an electrostatic discharge event, a length of a pulse, an amplitude of the pulse, a rise time of the pulse, a number of pulse (s) (confer Stephan Frei: "Elektrostatische Entladungen (ESD) und ihre Störwirkung auf elektronische Systeme", Shaker Verlag, Aachen, 1999, Page 45), a pulse shape in time domain and/or a pulse shape in frequency domain (confer Chang-Yu Wu et al.: "On the frequency domain specification of ESD waveforms", Journal of Electrostatics, 24 (1990), pages 197-206) may be evaluated to distinguish a ESD event from a non-ESD event and to filter out non-ESD events.

Placement of current probe: if the current probe (or current measurement device) is placed on a power supply connection having a galvanic separation from the mains connection (or mains network), noise and/or "switching operations" (which may for example be present on the mains network) may be filtered out (for example by the galvanic separation). Accordingly, an impact of "switching operations" on the measurement signal provided by the current probe can be reduced. Thus, the current measurement signal provided by the current probe allows for a more reliable identification of ESD events.

Optical surveillance of test cell (confer Stephan Frei: "Elektrostatische Entladungen (ESD) und ihre Störwirkung auf elektronische Systeme", Shaker Verlag, Aachen, 1999, Page 44): by optical surveillance of the test cell (e.g. with a camera), discharge wave forms or discharge current waveforms (for example discharge wave forms provided by the current probe or current measurement device) can be correlated to activities within the test cell. This may also help to identify the source of electrostatic discharge as well as non-electrostatic-discharge events. For example, an operator, a handler, a prober or a DUT board can be identified as sources of an electrostatic discharge event.

Pattern recognition (confer Stephan Frei: "Elektrostatische Entladungen (ESD) und ihre Störwirkung auf elektronische Systeme", Shaker Verlag, Aachen, 1999, Pages 61 ff) of discharge wave forms in time domain and/or frequency domain: a classification and analysis of data (for example data describing the discharge wave forms) can for example be performed with so-called "fuzzy logic" (confer Stephan Frei: "Elektrostatische Entladungen (ESD) und ihre Störwirkung auf elektronische Systeme", Shaker Verlag, Aachen, 1999, Pages 62 ff) and/or "neuronal networks" (confer Stephan Frei: "Elektrostatische Entladungen (ESD) und ihre Störwirkung auf elektronische Systeme", Shaker Verlag, Aachen, 1999, Pages 63 ff).

Use of "coupling network" (confer Stephan Frei: "Elektrostatische Entladungen (ESD) und ihre Störwirkung auf elektronische Systeme", Shaker Verlag, Aachen, 1999, Pages 57 ff) to detect "switching operations": use of a coupling network is based on the idea that electrostatic discharge causes mostly so-called "common-mode interference" (confer Stephan Frei: "Elektrostatische Entladungen (ESD) und ihre Störwirkung auf elektronische Systeme", Shaker Verlag, Aachen, 1999, Page 46). In contrast, switching operation mostly cause "anti-common mode interference" between phase and neutral lines (e.g. of a mains power supply connection) (confer Stephan Frei: "Elektrostatische Entladungen (ESD) und ihre Störwirkung auf elektronische Systeme", Shaker Verlag, Aachen, 1999, Page 46).

In some embodiments, a coupling network can be used for discrimination. In other words, in some embodiments a resistor-capacitor-circuitry can be used instead of a current clamp to provide one or more measurement signals. In some embodiments, the resistor-capacitor-circuitry can be designed to provide a signal (for example a current measurement signal) which is sensitive to "common-mode interference" and which is insensitive to "anti-common mode interferences". The said output signal is representative of ESD events.

In another embodiment, the resistor-capacitor circuitry can be designed to be sensitive to "anti-common mode interferences". The said output signal (e.g. in the form of a current measurement signal) may be used to identify non-ESD events.

To summarize, a coupling network can be used for discrimination.

To summarize the above, it should be noted that the concepts described herein can be used in a wide variety of configurations.

For example, the concepts described herein can also be used in connection with a so called "compact test head" architecture. In this case, the hardware from the "supply rack" (for example the power converter, the power distribution, etc) may be integrated into the test head (TH). The test head may for example be installed on a cart with wheels. This set up is known as "V93000 compact test head".

In this architecture, the current probe or current measurement device may for example be installed on a mains power cable.

Some embodiments according to the invention may be used in combination with an autotransformer. In such an embodiment, the test system may be powered by an external transformer. With this configuration, there is a transformer between the mains connection (or mains network) and the test system (e.g., the "supply rack"). Such a set up is known as "V93000 Autotransformer". In this architecture, the current probe (or current measurement device) may be placed between the autotransformer and the supply rack or between the supply rack and the test head.

In some embodiments, alternatives to an oscilloscope or scope may be used. For example, a transient recorder may be used to capture the discharge current wave forms. Alternatively (or in addition) an ADC converter may be used to capture discharge current wave forms.

In some embodiments, the analysis of the wave form may comprise a transfer of "time domain information" into "frequency domain information". In some embodiments, a Discrete Fourier transformation (DFT) may be used as an alternative to a Fast Fourier transformation (FFT).

In some embodiments the identification of an electrostatic discharge source may comprise one or more of the following:
  The Verigy production dashboard (VPD) allows the correlation of ESD events to process/manufacturing data.
  To identify a source of an ESD event (e.g. operator, external equipment like DUT board, handler, prober) an optical surveillance of the test system/test cell may be beneficial. For example, a digital camera may be placed on the "supply rack" and may take pictures of the test cell once a discharge current wave form is captured. If the discharge is classified as an electrostatic discharge, the picture taken may help to identify the source of electrostatic discharge with a high certainty.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A system for detecting an electrostatic discharge event with respect to a device to be monitored, the system comprising:
   a device to be monitored, wherein the device to be monitored is connected to a power supply via a power supply connection;
   a current measurement device configured to measure a current flowing via the power supply connection or a current component thereof, to acquire a current measurement signal representing the current or the current component; and
   an electrostatic discharge event detector configured to detect an electrostatic discharge event in response to a pulse of the current measurement signal,
   wherein the power supply connection comprises at least two directional-current conductors configured to provide the device to be monitored with electrical energy in the form of a directional current; and
   wherein the measurement device is configured to measure a signed sum of currents in the at least two directional-current conductors to acquire the measurement signal.

2. The system according to claim 1, wherein the current measurement device is configured to detect a magnetic field generated by the current or current component and to acquire the current measurement signal on the basis of the magnetic field.

3. The system according to claim 1, wherein the current measurement device comprises a current clamp arranged around one or more conductors of the power supply connection.

4. The system according to claim 1, wherein
   the device to be monitored is further connected to a protective earth via a protective earth connection; and
   the current measurement device is configured to measure a current flowing via the earth connection.

5. The system according to claim 1, wherein the current measurement device is coupled to a sampling device configured to sample the current measurement signal or a signal derived there from, representing the current or current component the sampling device being connected to a control computer via a network connection.

6. The system according to claim 5, wherein the sampling device is configured to
   generate a trigger event in response to the input signal reaching or exceeding a pre-determined trigger threshold;
   transmit a service request message to the control computer in response to the trigger event; and
   capture at least a portion of a waveform of the input signal in response to the trigger event.

7. The system according to claim 6, wherein the control computer is configured to acquire the captured portion of the waveform from the sampling device and to save the captured portion of the wave form in a data base.

8. The system according to claim 1, comprising:
   a computer configured to receive an information about the electrostatic discharge event from the electrostatic discharge event detector and to log an information about the ESD event and/or about a status of a test before, during or after the electrostatic discharge event.

9. The system according to claim 8, wherein the computer is configured to log
   a date of an electrostatic discharge event,
   a time of an electrostatic discharge event,
   an information indicating at which out of a plurality of devices to be monitored an electrostatic discharge event has occurred,
   an information describing a status of the test system at which an electrostatic discharge event has occurred before, during or after the electrostatic discharge event,
   an information about a device under test which has been coupled to the device to be monitored at the time of the electrostatic discharge event, an information about a test program executed by the test system at the time of the electrostatic discharge event, an information about a lot of devices-under-test arranged in the proximity of the device to be monitored at the time of the electrostatic discharge event, an information about a wafer arranged in the proximity of the device to be monitored at the time of the electrostatic discharge event, an information about a binning of devices under test tested during the electrostatic discharge event or within a predetermined time interval before the electrostatic discharge event or within a predetermined time interval after the electrostatic discharge event, or an information about a yield before the electrostatic discharge event or after the electrostatic discharge event.

10. The system according to claim 1, wherein the electrostatic discharge event detector is configured to determine a charge of an electrostatic discharge event by integrating a discharge current described by the current measurement signal over time, or determine an energy of the actual or potential electrostatic discharge event by integrating the power transferred by the electrostatic discharge event over time.

11. The system according to claim 1, wherein the electrostatic discharge event detector is configured to distinguish an electrostatic discharge event from a non-electrostatic-discharge-event by analyzing a wave form of the current measurement signal.

12. The system according to claim 11, wherein the electrostatic discharge event detector is configured to compare a time domain representation of the current measurement signal associated with a potential electrostatic discharge event with a time domain reference and to recognize the potential electrostatic discharge event as an actual electrostatic discharge event if a difference between the time domain representation of the current measurement signal associated with the potential electrostatic discharge event and the time domain reference is smaller than a predetermined threshold.

13. The system according to claim 1, comprising:
a supply rack;
wherein the device to be monitored comprises a test head arranged external to the test rack and connected to the supply rack via the power supply connection; and
wherein the supply rack is configured to provide energy supply signals to the head test via the power supply connection.

14. The system according to claim 13, wherein the power supply connection comprises a loom of cables extending from the supply rack to the test head.

15. The system according to claim 13, wherein the test head comprises an electrically conductive housing or an electrically conductive mechanical carrier structure connected to at least one conductor of the power supply connection.

16. The system according to claim 13, wherein the test head comprises a device-under-test port coupled, at least by a parasitic capacitance, to at least one conductor of the power supply connection.

17. The system according to claim 13, comprising:
a system controller configured to acquire an information about a yield on the basis of an information about test results of devices-under-test tested using the device to be monitored;
analyze a correlation between a detection of an electrostatic discharge event and a yield; and
provide a warning if a significant correlation between a detection of an electrostatic discharge event and a change of the yield is found.

18. The system according claim 17, wherein the system controller is further configured to acquire an information, about a self-test status of the device to be monitored by evaluating self-test results or calibration results of the device to be monitored;

analyze a correlation between a detection of an electrostatic discharge event and a change of the self-test status of the device to be monitored; and provide a warning if a significant correlation between a detection of an electrostatic discharge event and a change of the self-test status is found.

19. A system for detecting an electrostatic discharge event with respect to a device to be monitored, the system comprising:

a device to be monitored, wherein the device to be monitored is connected to a power supply via a power supply connection;

a current measurement device configured to measure a current flowing via the power supply connection or a current component thereof, to acquire a current measurement signal representing the current or the current component; and an electrostatic discharge event detector configured to detect an electrostatic discharge event in response to a pulse of the current measurement signal, wherein the power supply connection comprises a single-phase alternating-current mains connection comprising a phase conductor and a neutral conductor, wherein the single phase alternating-current mains connection is configured to provide the device to be monitored with electrical energy in the form of an alternating current; and wherein the current measurement device is configured to measure a signed sum of currents in the phase conductor and the neutral conductor to acquire the current measurement signal.

20. A system for detecting an electrostatic discharge event with respect to a device to be monitored, the system comprising:

a device to be monitored, wherein the device to be monitored is connected to a power supply via a power supply connection;

a current measurement device configured to measure a current flowing via the power supply connection or a current component thereof, to acquire a current measurement signal representing the current or the current component; and an electrostatic discharge event detector configured to detect an electrostatic discharge event in response to a pulse of the current measurement signal, wherein the power supply connection comprises a multiphase alternating-current mains connection comprising a plurality of phase conductors and at least one neutral conductor, wherein the multi phase alternating-current mains connection is configured to provide the device to be monitored with electrical energy in the form of an alternating current; and wherein the current measurement device is configured to measure a signed sum of currents in the plurality of phase conductors and the neutral conductor to acquire the current measurement signal.

21. A system for detecting an electrostatic discharge event with respect to a device to be monitored, the system comprising:
- a device to be monitored, wherein the device to be monitored is connected to a power supply via a power supply connection;
- a current measurement device configured to measure a current flowing via the power supply connection or a current component thereof, to acquire a current measurement signal representing the current or the current component; and
- an electrostatic discharge event detector configured to detect an electrostatic discharge event in response to a pulse of the current measurement signal,
- wherein the power supply connection comprises a plurality of power supply conductors configured to provide electrical energy to the device to be monitored, and at least one protective earth conductor configured to connect the device to be monitored to a protective earth,
- wherein the current measurement device is configured to measure a signed sum of currents in the plurality of power supply conductors and the protective earth conductor.

22. The system according to claim 21, wherein the power supply conductors comprise at least one phase conductor and least one neutral conductor.

23. A method for detecting an electrostatic discharge event with respect to a device to be monitored, wherein the device to be monitored is connected to a power supply via a power supply connection comprising at least two directional-current conductors configured to provide the device to be monitored with electrical energy in the form of a directional current; the method comprising:
- measuring a signed sum of currents in the at least two directional-current conductors to acquire a current measurement signal; and
- detecting an electrostatic discharge event in response to a pulse of the current measurement signal.

24. A method for detecting an electrostatic discharge event with respect to a device to be monitored, wherein the device is connected to a power supply via a power supply connection comprising a single-phase alternating current mains connection comprising a phase conductor and a neutral conductor, wherein the single phase alternating-current mains connection is configured to provide the device to be monitored with electrical energy in the form of an alternating current, the method comprising:
- measuring, a signed sum of currents in the phase conductor and the neutral conductor to acquire a current measurement signal; and
- detecting, an electrostatic discharge event in response to a pulse of the current measurement signal.

25. A method for detecting, an electrostatic discharge event with respect to a device to be monitored, wherein the device to be monitored is connected to a power supply via a power supply connection comprising a multiphase alternating-current mains connection comprising a plurality of phase conductors and at least one neutral conductor, wherein the multi phase alternating-current mains connection is configured to provide the device to be monitored with electrical energy in the form of an alternating current, the method comprising:
- measuring a signed sum of currents in the plurality of phase conductors and the neutral conductor to acquire the current measurement signal; and
- detecting an electrostatic discharge event in response to a pulse of the current measurement signal.

26. A method for detecting an electrostatic discharge event with respect to a device to be monitored, wherein the device to be monitored is connected to a power supply via a power supply connection comprising a plurality of power supply conductors configured to provide electrical energy to the device to be monitored, and at least one protective earth conductor configured to connect the device to be monitored to a protective earth, the method comprising:
- measuring a signed sum of currents in the plurality of power supply conductors and the protective earth conductor; and
- detecting an electrostatic discharge event in response to a pulse of the current measurement signal.

27. A non-transitory digital storage medium on which a computer program is stored, the computer program for performing, when run on a computer, a method for detecting an electrostatic discharge event with respect to a device to be monitored, wherein the device to be monitored is connected to a power supply via a power supply connection comprising at least two directional-current conductors configured to provide the device to be monitored with electrical energy in the form of a directional current, the method comprising:
- measuring a signed sum of currents in the at least two directional-current conductors to acquire a current measurement signal; and
- detecting an electrostatic discharge event in response to a pulse of the current measurement signal.

28. A non-transitory digital storage medium an which a computer program is stored, the computer program for performing, when run on a computer, a method for detecting an electrostatic discharge event with respect a device to be monitored, wherein the device is connected to a power supply via a power supply connection comprising a single-phase alternating-current mains connection comprising a phase conductor and a neutral conductor, wherein the single phase alternating-current mains connection is configured to provide the device to be monitored with electrical energy in the form of an alternating current, the method comprising:
- measuring a signed sum of currents in the phase conductor and the neutral conductor to acquire a current measurement signal; and
- detecting an electrostatic discharge event in response to a pulse of the current measurement signal.

29. A non-transitory digital storage medium on which a computer program is stored, the computer program for performing, when run on a computer, a method for detecting an electrostatic discharge event with respect to a device to be monitored, wherein the device to be monitored is connected to a power supply via a power supply connection comprising a multiphase alternating-current mains connection comprising a plurality of phase conductors and at least one neutral conductor, wherein the multi phase alternating current mains connection is configured to provide the device to be monitored with electrical energy in the form of an alternating current, the method comprising:
- measuring a signed sum of currents in the plurality of phase conductors and the neutral conductor to acquire the current measurement signal; and
- detecting an electrostatic discharge event in response to a pulse of the current measurement signal.

30. A non-transitory digital storage medium on which a computer program is stored, the computer program for performing, when run on a computer, a method for detecting an electrostatic discharge event with respect to a device to be monitored, wherein the device to be monitored is connected to a power supply via a power supply connection comprising a plurality of power supply conductors configured to provide electrical energy to the device to be monitored, and at least one protective earth conductor configured to connect the device, to be monitored to a protective earth, the method comprising:
  measuring a signed sum of currents in the plurality of power supply conductors and the protective earth conductor; and
  detecting an electrostatic discharge event in response to a pulse of the current measurement signal.

* * * * *